US008332715B2

(12) United States Patent
Maruyama

(10) Patent No.: US 8,332,715 B2
(45) Date of Patent: Dec. 11, 2012

(54) TEST PATTERN GENERATING METHOD, DEVICE, AND PROGRAM

(75) Inventor: Daisuke Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 155 days.

(21) Appl. No.: 12/805,067

(22) Filed: Jul. 9, 2010

(65) Prior Publication Data

US 2010/0287429 A1    Nov. 11, 2010

Related U.S. Application Data

(63) Continuation of application No. PCT/JP2008/050181, filed on Jan. 10, 2008.

(51) Int. Cl.
*H03M 13/00* (2006.01)

(52) U.S. Cl. ......... 714/753; 714/758; 714/781; 714/799

(58) Field of Classification Search .................. 714/726, 714/738
See application file for complete search history.

(56) References Cited

U.S. PATENT DOCUMENTS

| | | | |
|---|---|---|---|
| 6,067,651 A | 5/2000 | Rohrbaugh et al. | |
| 6,694,466 B1 * | 2/2004 | Tsai et al. ...................... | 714/729 |
| 6,865,706 B1 * | 3/2005 | Rohrbaugh et al. .......... | 714/738 |
| 7,216,280 B2 * | 5/2007 | Benware ....................... | 714/738 |
| 7,509,600 B2 * | 3/2009 | Rajski et al. .................. | 716/136 |
| 7,610,527 B2 * | 10/2009 | Wang et al. ................... | 714/724 |
| 7,788,561 B2 * | 8/2010 | Huang et al. .................. | 714/729 |
| 7,840,865 B2 * | 11/2010 | Lai et al. ....................... | 714/728 |

FOREIGN PATENT DOCUMENTS

| | | |
|---|---|---|
| DE | 198 55 488 | 9/1999 |
| JP | 63-075973 | 4/1988 |
| JP | 10-307169 | 11/1998 |
| JP | 11-281716 | 10/1999 |
| JP | 2000-137061 | 5/2000 |
| JP | 2004-317505 | 11/2004 |
| JP | 2005-174112 | 6/2005 |
| JP | 2007-114163 | 5/2007 |

OTHER PUBLICATIONS

International Search Report issued in corresponding PCT Application No. PCT/JP2008/050181.
Japanese Office Action dated Jul. 12, 2012 issued in corresponding Japanese Patent Application No. 2009-548838.
Japanese Office Action mailed Aug. 1, 2012 in corresponding Japanese Application No. 2009-578838.

* cited by examiner

Primary Examiner — Esaw Abraham
(74) Attorney, Agent, or Firm — Staas & Halsey LLP

(57) ABSTRACT

A test pattern generating device generates a test pattern with respect to a semiconductor circuit having first and second common circuits and a non-common circuit, wherein each of the common circuits has a scan chain for checking an operation of the circuit by applying a test pattern from the outside of the circuit. A set of scan chains and a set of assumed faults are created for each of the common circuits. Any of the common circuits is determined as the common circuit of a first test target. After the determined common circuit of the first test target is subjected to ATPG and detection of circuit fault, a test pattern generated in successful ATPG about the common circuit of the first test target is diverted to the common circuit determined as the second test target, and ATPG and detection of a circuit fault of the non-common circuit part.

12 Claims, 45 Drawing Sheets

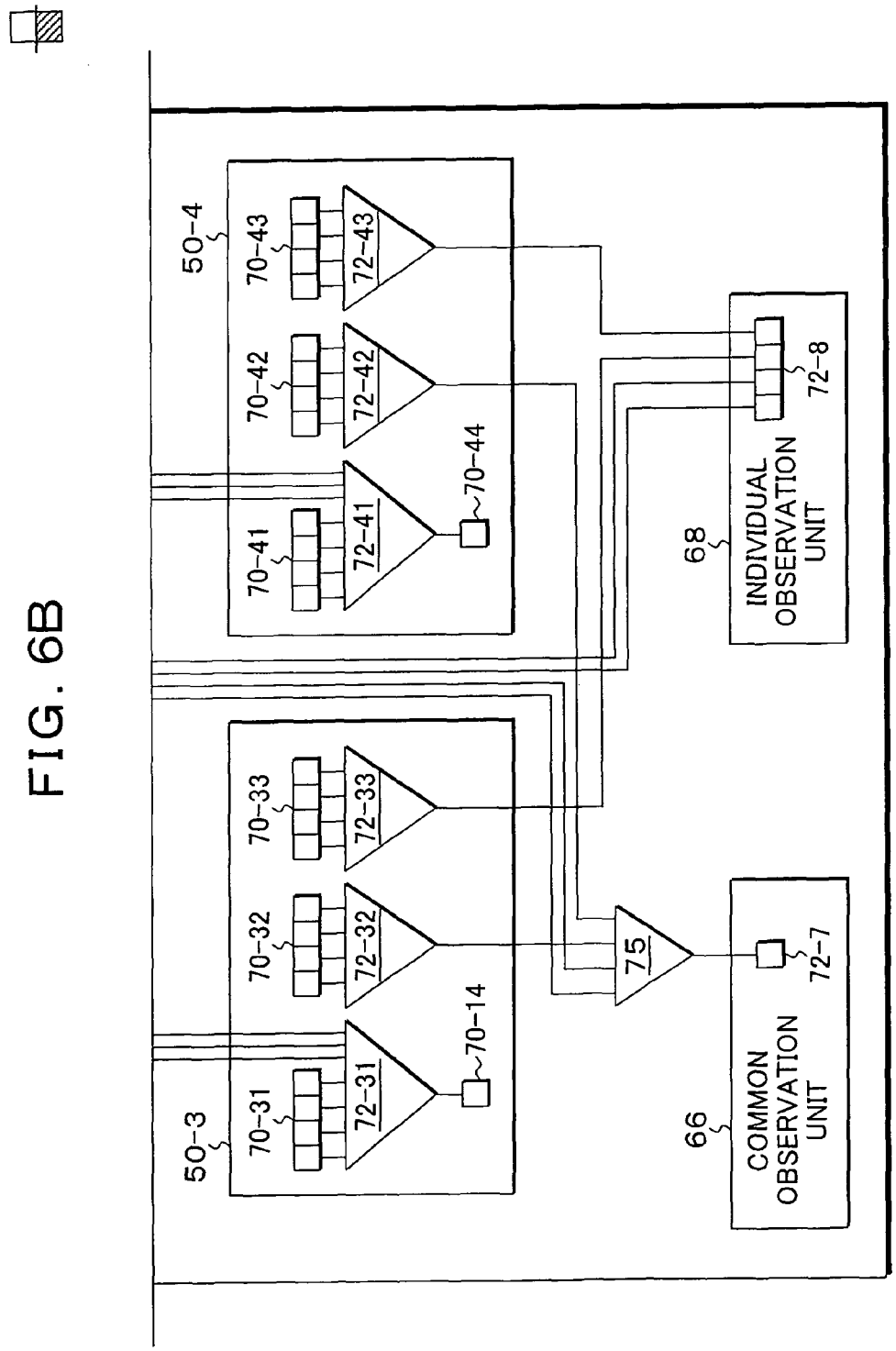

FIG. 7A
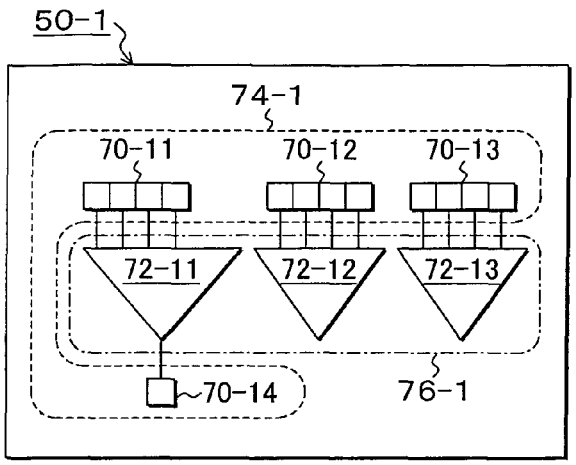
FIG. 7B
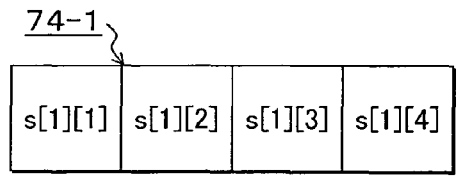
FIG. 7C
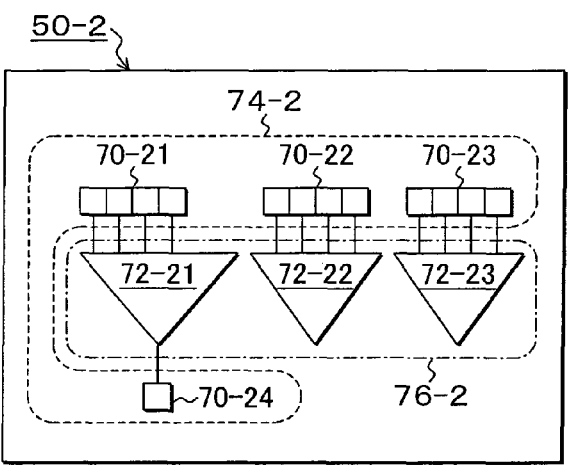
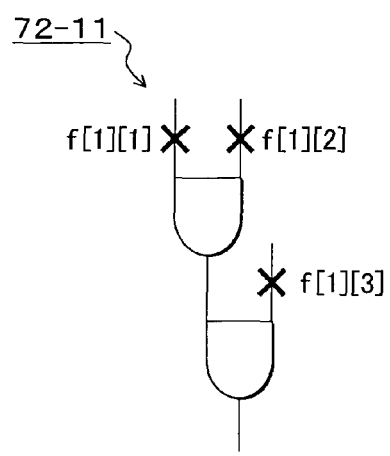
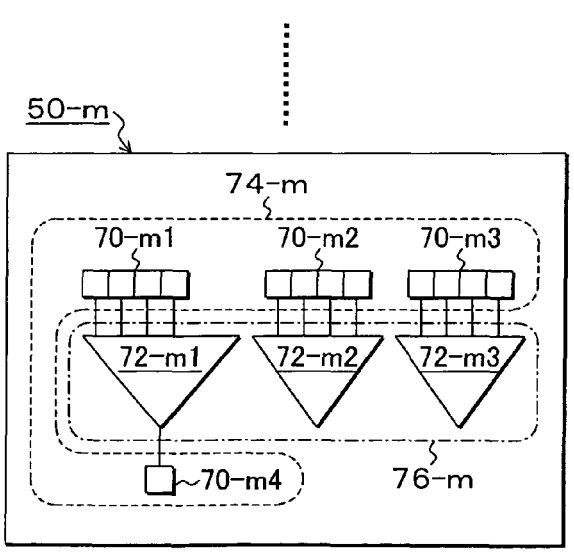

/* FAULT TABLE */
struct fault_tag
{
    int             id              ; /* IDENTIFIER          */
    int             net             ; /* ASSUMED NET         */
    unsigned char   value_1      :1 ; /* FAULT VALUE         */
    unsigned char   tried        :1 ; /* atpg TRY-DONE FLAG  */
    unsigned char   detected     :1 ; /* DETECTION-DONE FLAG */
    unsigned char   atpg_object  :1 ; /* atpg TARGET FLAG    */
    unsigned char   skip_        :1 ; /* SKIP FLAG           */
};

84

85

87

/* FAULT SET TABLE */
struct fault_set_tag
{
    int              no      ; /* NUMBER OF FAULTS */
    struct fault_tag *fault  ; /* FAULT            */
};

90-1
```
/* FAULT SET TABLE CORRESPONDING TO 1 CORE */
struct core_fault_tag
{
    int         *id ;
};
```

90-2
```
/* CORE FAULT SET TABLE OF ENTIRE CIRCUIT */
struct core_fault_set_tag
{
    struct core_fault_tag *core_fault ;
};
```

94-1
```
/* Scan FF SET TABLE CORRESPONDING TO 1 CORE */
struct core_scanFF_tag
{
    int         *id ;
};
```

94-2
```
/* Scan FF SET TABLE OF ENTIRE CIRCUIT */
struct core_scanFF_set_tag
{
    struct core_scanFF_tag *core_scanFF ;
};
```

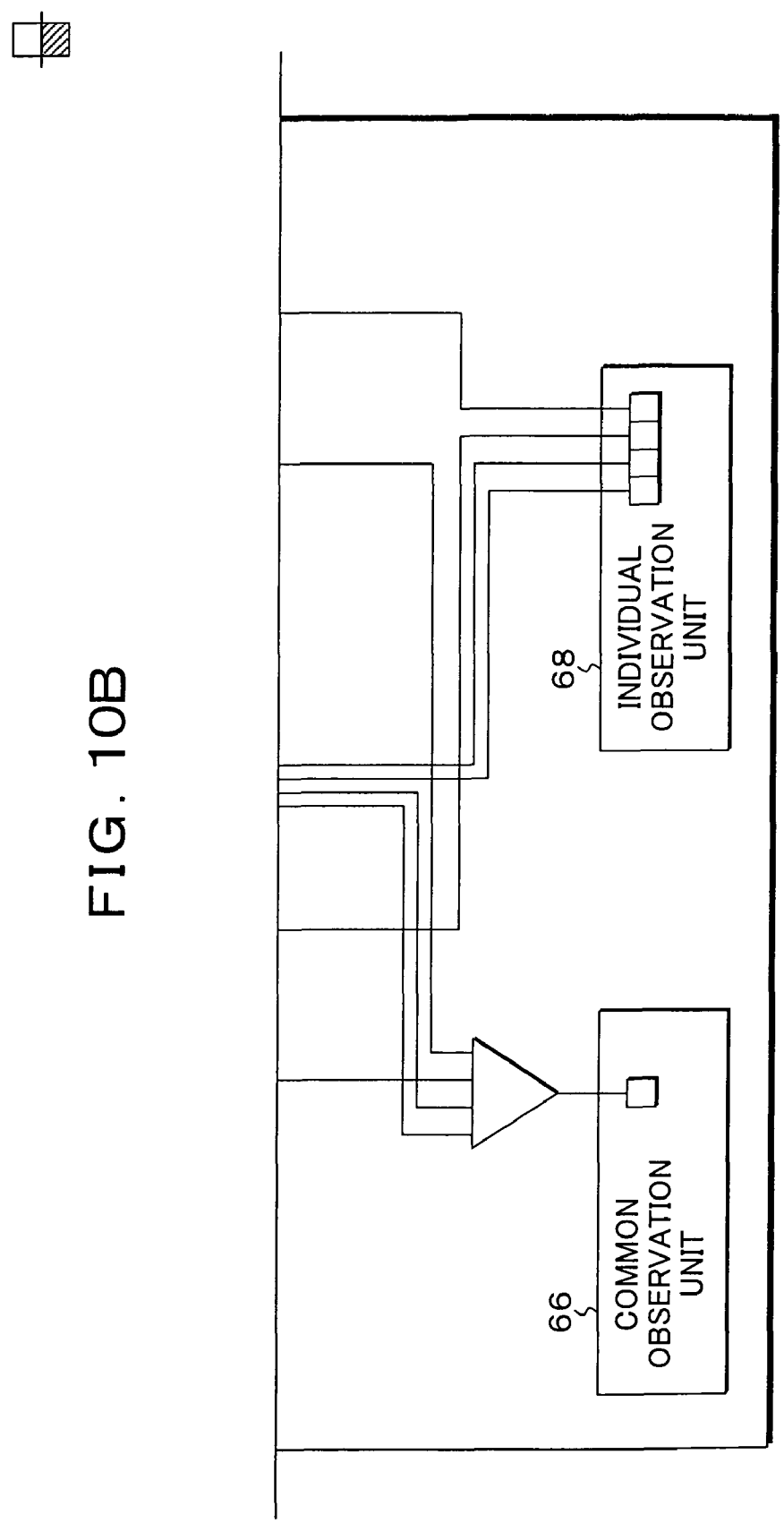

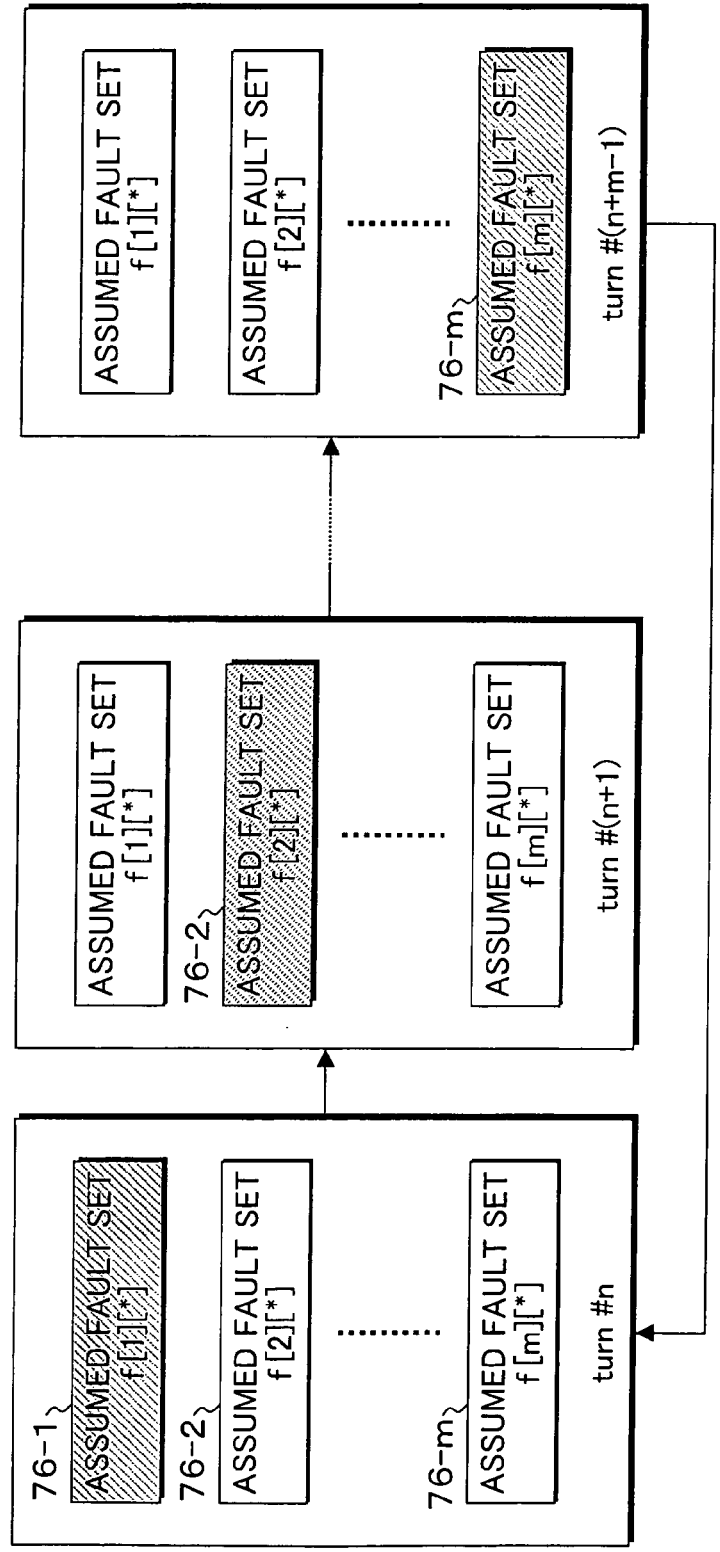

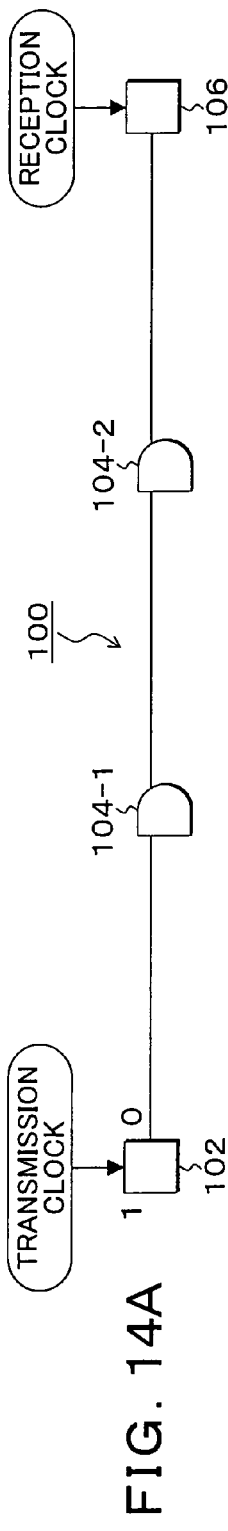
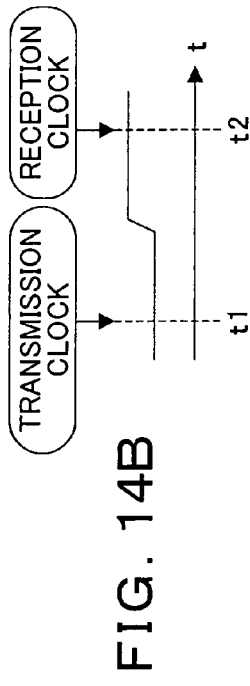
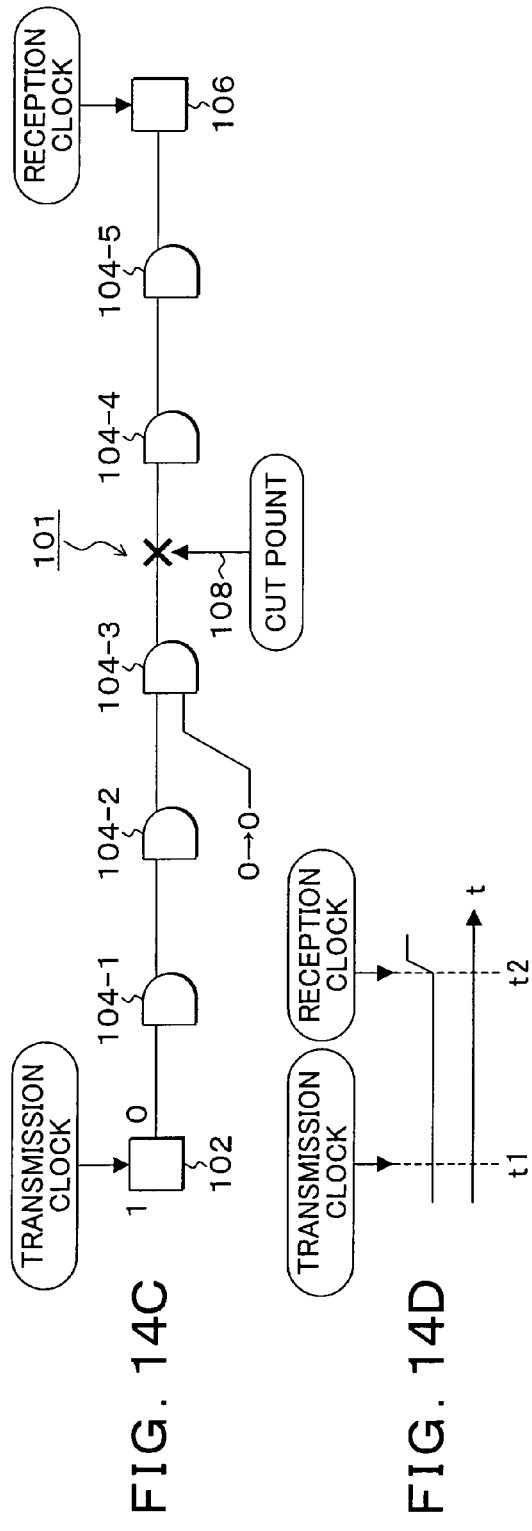
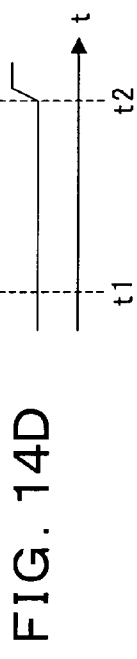
FIG. 14A
FIG. 14B
FIG. 14C
FIG. 14D

FIG. 20

| CORE | 50-1 | 50-2 | 50-3 | 50-4 |
|---|---|---|---|---|
| ATPG FLAG | ON | OFF | OFF | OFF |
| SKIP FLAG | OFF | ON | ON | ON |

CONVERTIONAL TECHNIQUE

PRESENT INVENTION

TEST PATTERN GENERATING METHOD, DEVICE, AND PROGRAM

CROSS REFERENCE TO RELATED APPLICATIONS

This application is a U.S. Continuation Application claiming priority benefit under 35 U.S.C. Section 111(a), of PCT International Application No. PCT/JP2008/050181, filed Jan. 10, 2008, of which the entire disclosures are incorporated by reference as a part of this application.

BACKGROUND OF THE INVENTION

1. Field of the Invention

The present invention relates to a test pattern generating method, device, and program for the tests carried out on a tester which judges non-defectiveness/defectiveness of a manufactured LSI (Large Scale Integrated circuit) and particularly relates to a test pattern generating method, device, and program for the tests used in non-defectiveness/defectiveness judgement of an LSI having a plurality of common circuits like a multi-core processor.

2. Description of the Related Arts

Conventionally, in the last process of the manufacturing processes of an LSI, a test operation is carried out by using test patterns on the tester for judging non-defectiveness/defectiveness of the manufactured LSI. Generally, an automatic test pattern generation system (Automatic Test Pattern Generation system: hereinafter, referred to as "ATPG") is used for the test patterns used in the non-defectiveness/defectiveness judgement of the LSI. In such an ATPG system, examples of main functions include:
(1) circuit-model reading and writing functions,
(2) an automatic test pattern generating function of generating a test pattern for one given fault,
(3) a static or dynamic compaction function of compacting the test patterns created by ATPG, and
(4) a fault simulator function of evaluating generated tests.
[Patent Document 1] Japanese Laid-open Patent Publication No. 63-75973
[Patent Document 2] Japanese Laid-open Patent Publication) No. 2005-174112
Incidentally, in recent processor designing, a multi-core processor technique which enhances performance by providing a plurality of core units in one LSI and causing the cores to carry out parallel operations attracts attention. When test patterns are to be generated for such a multi-core processor, in a conventional system, if some sorts of restriction conditions are not given, ATPG is executed for all the assumed faults which can be achieved at a certain point. Therefore, increase in the circuit size due to pluralization of cores causes a problem that the assumed faults for which ATPG is executed are increased, in other words, test generation time is increased simply in proportion to the number of the cores. The increase in the number of cores does not only affect the increase in the test generation time, but also causes a problem of increase in the amount of test vectors (the amount of data used for evaluating whether a circuit satisfies designed specifications or not) which are necessary in tests.

SUMMARY OF THE INVENTION

According to the present invention, a test pattern generating method, device, and program which suppress the increase in the test generation time and the amount of test vectors with respect to a semiconductor circuit having a plurality of common circuits having equivalencies or similarities like the cores of a multi-core processor are provided.

(Method)

The present invention provides a pattern generating method. The present invention is the test pattern generating method of generating a test pattern with respect to a semiconductor circuit having first and second common circuits and a non-common circuit other than the first and second common circuits, each of the first and second common circuits having a scan chain for checking an operation of the circuit by applying a test pattern from the outside of the circuit, the test pattern generating method characterized by comprising steps of:

reading circuit information of the semiconductor circuit;

creating a set of scan chains and a set of assumed faults for each of the first and second common circuits, wherein the assumed fault is a fault fixed to a terminal of a logic element constituting the common circuit;

determining any of the first and second common circuits as the common circuit of a first test target;

generating a test pattern for the determined common circuit of the first test target by using the created set of the scan chains and the set of the assumed faults;

compressing the generated test pattern;

detecting a circuit fault that the common circuit of the first test target has by using the compressed test pattern; and determining the common circuit, which is different from the common circuit of the first test target among the first and second common circuits, as the common circuit of a second test target.

The test pattern generating method of the present invention further includes a step of subjecting the common circuit of the second test target to detection of a circuit fault that the common circuit has by using the compressed test pattern (test diversion).

The test pattern generating method of the present invention is characterized in that, furthermore, in the step of creating the set of the scan chains for each of the first and second common circuits, initial states of memory circuits that the first and the second common circuits have are set to be the same.

Herein, the circuit fault is a fixed fault in which a circuit that the common circuit has fixedly outputs 0 or 1.

(Device)

The present invention provides a test pattern generating device. The present invention is the test pattern generating device of generating a test pattern with respect to a semiconductor circuit having first and second common circuits and a non-common circuit other than the first and second common circuits, each of the first and second common circuits having a scan chain for checking an operation of the circuit by applying a test pattern from the outside of the circuit, the test pattern generating device characterized by comprising:

a circuit information reading unit reading circuit information of the semiconductor circuit;

a scan chain set creating unit creating a set of scan chains and a set of assumed faults for each of the first and second common circuits, wherein the assumed fault is a fault fixed to a terminal of a logic element constituting the common circuit;

a test target circuit determining unit determining any of the first and second common circuits as the common circuit of a first test target and, after subjecting the determined common circuit of the first test target to detection of a circuit fault, determining the common circuit, which is different from the common circuit of the first test target, as the common circuit of a second test target;

a test pattern generating unit generating a test pattern for the determined common circuit of the first test target by using the created set of the scan chains and the set of the assumed faults;

a test pattern compressing unit compressing the generated test pattern; and a circuit fault detecting unit detecting a circuit fault that the common circuit of the first test target has by using the compressed test pattern.

Furthermore, the common circuit of the second test target is subjected to detection of a circuit fault that the common circuit has by using the compressed test pattern.

(Program)

The present invention provides a pattern generating program. The present invention is a test pattern generating program of generating a test pattern with respect to a semiconductor circuit having first and second common circuits and a non-common circuit other than the first and second common circuits, each of the first and second common circuits having a scan chain for checking an operation of the circuit by applying a test pattern from the outside of the circuit, the test pattern generating program characterized by causing a computer to execute steps of:

reading circuit information of the semiconductor circuit;

creating a set of scan chains and a set of assumed faults for each of the first and second common circuits, wherein the assumed fault is a fault fixed to a terminal of a logic element constituting the common circuit;

determining any of the first and second common circuits as the common circuit of a first test target;

generating a test pattern for the determined common circuit of the first test target by using the created set of the scan chains and the set of the assumed faults;

compressing the generated test pattern;

detecting a circuit fault that the common circuit of the first test target has by using the compressed test pattern; and determining the common circuit, which is different from the common circuit of the first test target among the first and second common circuits, as the common circuit of a second test target.

Furthermore, a step of subjecting the common circuit of the second test target to detection of a circuit fault that the common circuit has by using the compressed test pattern is provided.

According to the present invention, when generation of a test pattern with respect to an interior fault of a common circuit of a first test target succeeds in a semi-conductor device having a plurality of common circuits, the succeeded test pattern is diverted to the common circuit of a second test target, thereby reducing test pattern generating processes in the common circuit of a second test target and the circuits subsequent to that. As a result, the generation time of the test patterns used in the entire semiconductor device having the plurality of common circuits can be significantly reduced.

BRIEF DESCRIPTION OF THE DRAWINGS

FIGS. 6A and 6B are block diagrams depicting the multi-core processor of FIG. 3 by a schematic equivalent circuit;

FIGS. 7A to 7C are explanatory diagrams depicting association of scan FF sets and assumed fault sets among cores in the multi-core processor of FIGS. 6A and 6B;

FIG. 8 is an explanatory diagram depicting a table structure of fault data used in the present embodiment;

FIGS. 9A and 9B are explanatory diagrams depicting the table structures of the fault sets of cores and the entire circuit contained in the fault data of FIG. 8 and the scan FF sets of the cores and the entire circuit;

FIGS. 10A and 10B are explanatory diagrams depicting a process of the present embodiment in which a test pattern of the core for which ATPG succeeds is diverted to another core;

FIG. 13 is an explanatory diagram depicting a target core switching process of the present embodiment;

FIGS. 14A to 14D are explanatory diagrams depicting an nτ path, which requires commonization of the initial state of a circuit among the cores upon test pattern diversion according to the present embodiment, in comparison with a 1τ path;

FIG. 20 is an explanatory diagram depicting the setting of atpg flags and skip flags of the present embodiment;

DETAILED DESCRIPTION OF THE PREFERRED EMBODIMENT

Figure 1:
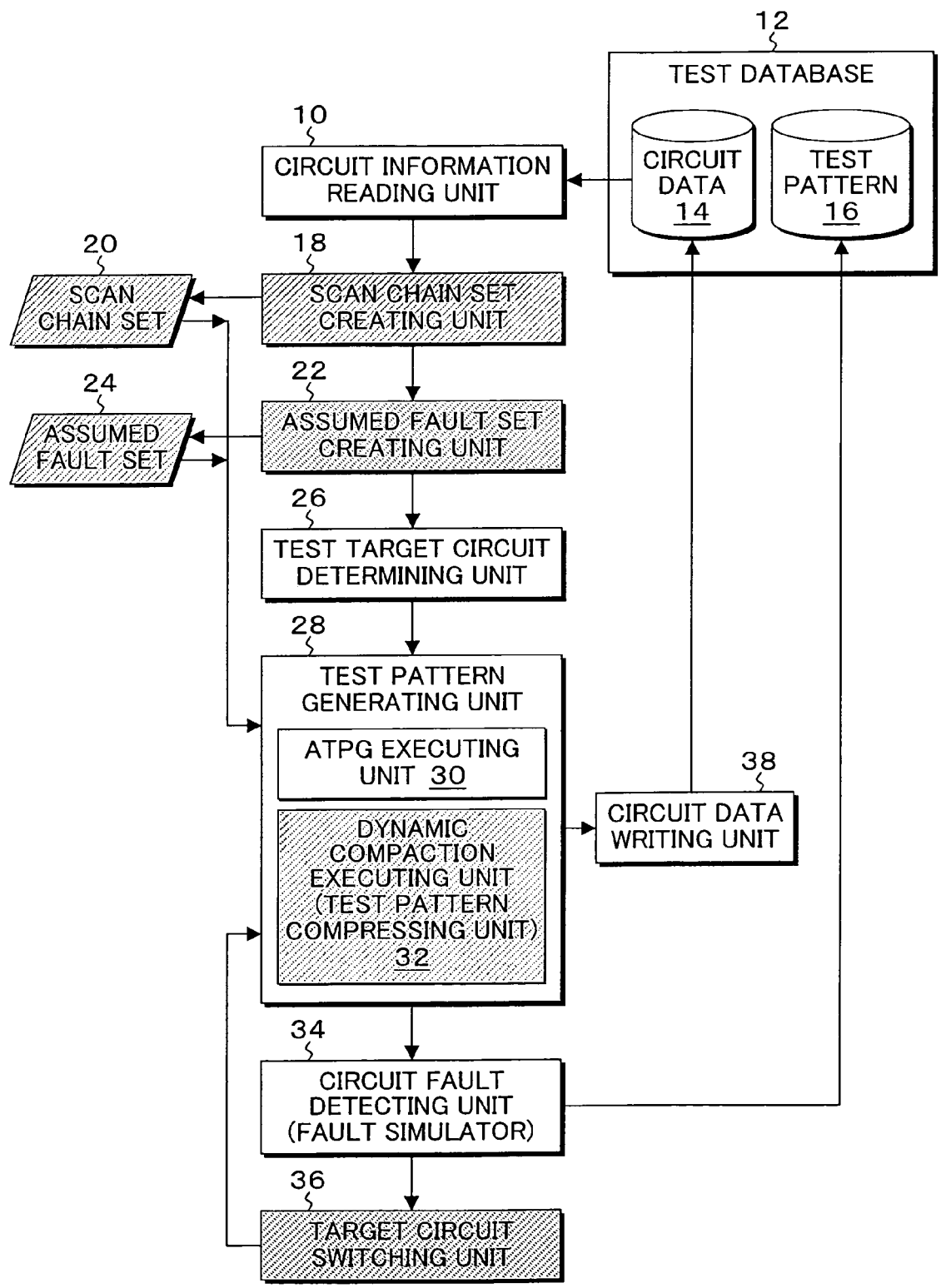
FIG. 1 is a block diagram depicting the functional configuration of a test pattern generating system according to a present embodiment.

<Contents>
1. System Configuration and Functions
2. Association of Input Points and Faults
3. Test Pattern Diversion
4. Test Pattern Interpolation
5. Switching of Target Core
6. Invalidation of ATPG Skip
7. Commonization of Circuit Initial State Among Cores
8. Cancellation of Exclusiveness Among Cores
9. Sharing of Scan Shift
10. Test Pattern Generating Process
11. ATPG Process
12. Dynamic Compaction
13. Test Pattern Diverting Process and Interpolation Process
14. Fault Simulation
15. Reduction Effect of Processing Time FIG. 1 is a block diagram depicting the functional configuration of a test pattern generating system according to a present embodiment for a semiconductor circuit having a common circuit unit such as a multi-core processor. In FIG. 1, the test pattern generating system of the present embodiment has: a circuit information reading unit 10; a test database 12, which stores circuit data 14 and test patterns 16; a scan chain set creating unit 18, which creates scan chain sets 20; an assumed fault set creating unit 22, which creates assumed fault sets 24; a test target circuit determining unit 26; a test pattern generating unit 28, which has an ATPG executing unit 30 and a dynamic compaction executing unit 32, which functions as a test pattern compressing unit; a circuit fault detecting unit 34, which functions as a fault simulator; a target circuit switching unit 36; and a circuit data writing unit 38. As the circuit data 14 stored in the test database 12, the circuit data of the semiconductor circuit having a plurality of common circuits, which have scan chains for confirming the operations of the circuits by giving test patterns from the outside of the circuits, and non-common circuits other than the plurality of common circuits is stored. As the specific circuit data 14, as is elucidated by later explanation, the circuit data of a multi-core processor is stored. A multi-core processor has a plurality of cores and, in many cases, has a characteristic that the cores mutually have equivalent or similar circuit configurations. Focusing on this characteristic, in the present embodiment, a test generating process, which aims to reduce the generation time of test patterns and the amount of test vectors, is executed. The circuit information reading unit 10 reads the circuit information of the semiconductor circuit serving as a processing target, for example, the circuit information of the multi-core processor from the circuit data 14 of the test database 12. The scan chain set creating unit 18 creates the scan chain sets 20 of the plurality of common circuits, for example, the cores in the case of the multi-core processor contained in the circuit information read by the circuit information reading unit 10. The assumed fault set creating unit 22 creates the assumed fault set 24 for each of the cores of the semiconductor circuit, for example, the multi-core processor read by the circuit information reading unit 10. Herein, an assumed fault refers to a fault in which a terminal of a logic element constituting the common circuit is fixed to 0 or 1. Since the test patterns are generated specifically by focusing on the equivalency of the common circuits, the scan chain sets (hereinafter, referred to as "scan FF sets"), which are input points of the common circuits, are associated with the assumed fault sets 24 among the cores in the creation of the scan chain sets 20 carried out by the scan chain set creating unit 18 and the creation of the assumed fault sets 24 carried out by the assumed fault set creating unit 22. The test target circuit determining unit 26 carries out the processes of determining any one of the cores, which are the plurality of common circuits in the semiconductor circuit, for example, the multi-core processor read by the circuit information reading unit 10, as a first test target core and, after detection of circuit faults with respect to the determined first test target core is carried out, determining another core, which is different from the first test target core, as a second test target core. The test pattern generating unit 28 generates the test patterns by using the scan chain set 20 and the assumed fault set created for the common circuit of the first test target determined by the test target circuit determining unit 26. The generation of the test patterns is carried out by the ATPG executing unit 30 and the dynamic compaction executing unit 32. The ATPG executing unit 30 selects one undetected assumed fault from the assumed fault set 24 as a primary fault and, with respect to the selected primary fault, generates a test pattern for detecting the primary fault. When the test pattern generation of the primary fault by the ATPG executing unit 30 succeeds, in the net state at this point, the dynamic compaction executing unit 32 arbitrarily selects one undetected assumed fault from the assumed fault set 24 as a secondary fault and, with respect to the selected secondary fault, generates a test pattern for detecting the secondary fault by the ATPG executing unit 30. Therefore, the dynamic compaction executing unit 32 functions as a test pattern compressing unit, which further compresses the test pattern generated by successful ATPG with respect to the primary fault. The circuit fault detecting unit 34, which functions as the fault simulator, carries out detection of circuit faults with respect to the logic circuits of the plurality of cores, which are the common circuits, by using the test patterns compressed by the test pattern generating unit 28. The target circuit switching unit 36 sequentially switches the core which is the first test target common circuit determined by the test target circuit determining unit 26, i.e., the target core so as to suppress the inequality of detected faults among the cores. When predetermined termination conditions are satisfied at the test pattern generating unit 28, the circuit data writing unit 38 writes detected fault information, etc. to the circuit data 14 of the test database 12 and terminates the process. Herein, in the test pattern generating system of FIG. 1, the scan chain set creating unit 18, the assumed fault set creating unit 22, and the target circuit switching unit 36 are the functions newly added by the present embodiment; the dynamic compaction executing unit 32 provided in the test pattern generating unit 28 is the function modified by the present embodiment; and the functions other than these are basically same as those of a conventional test pattern generating system. A basic operation of the test pattern generating system of FIG. 1 will be explained below. In the test pattern generation in the present embodiment, when, after the circuit data 14 is read from the test database 12 by the circuit information reading unit 10, for example, a multi-core processor is read as the circuit data by the scan chain set creating unit 18 and the assumed fault set creating unit 22 as an initialization procedure, the scan chain set 20 and the assumed fault set 24 are created for each of the plurality of cores, which are the common circuits of the multi-core processor, and, furthermore, setting of a test target core, which is an operation of setting an ATPG target flag, is carried out in the test target circuit determining unit 26. Subsequently, the process by the ATPG executing unit 30 is carried out with respect to the primary fault retrieved from the assumed fault set 24 until predetermined termination conditions are satisfied in the loop of the test pattern generating unit 28, the circuit fault detecting unit 34, and the target circuit switching unit 36. When the ATPG carried out with respect to the primary fault by the ATPG executing unit 30 succeeds, the process by the dynamic compaction executing unit 32, which functions as the test pattern compressing unit, is executed with respect to the secondary fault retrieved from the assumed fault set 24, thereby generating a compressed test pattern. Subsequently, the circuit fault detecting unit 34 carries out a detection process of the assumed faults by a fault simulation using the test pattern generated by the process of the dynamic compaction executing unit 32, and the test pattern 16 is saved with respect to the test database 12. In the loop process by the test pattern generating unit 28, the circuit fault detecting unit 34, and the target circuit switching unit 36, in order to suppress the variations in the fault detection rates among the cores after the fault simulation in the circuit fault detecting unit 34, a process of switching the target core by the target circuit switching unit 36 is carried out by changing the setting of the ATPG target flag. Then, when the predetermined termination conditions are satisfied in the test pattern generating unit 28, the circuit data writing unit 38 writes detected fault information, etc. to the circuit data 14 of the test database 12 and terminates the series of processes.

Figure 2:
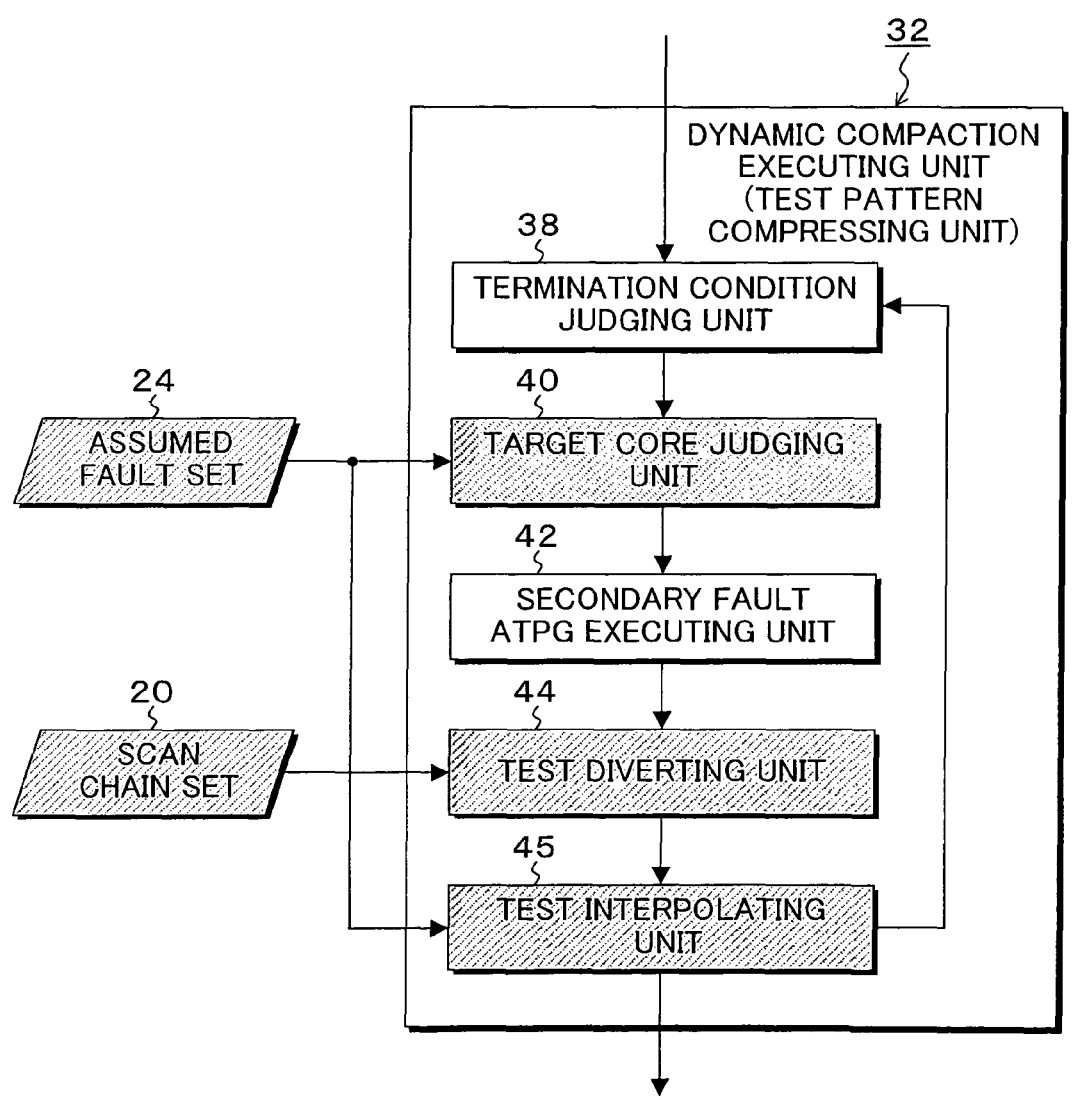
FIG. 2 is a block diagram depicting details of the functional configuration of a dynamic compaction executing unit of FIG. 1.

FIG. 2 is a block diagram depicting the functional configuration of the dynamic compaction executing unit 32 of FIG. 1, which functions as the test pattern compressing unit. The dynamic compaction executing unit 32 is composed of: a termination condition judging unit 38, a target core judging unit 40, a secondary fault ATPG executing unit 42, a test diverting unit 44, and a test interpolating unit 45. Among the functions of the dynamic compaction executing unit 32, the target core judging unit 40, the test diverting unit 44, and the test interpolating unit 45 are the functions newly added by the present embodiment, and the functions other than these are same as the functions of conventional dynamic compaction. The process of dynamic compaction in the dynamic compaction executing unit 32 is basically a process of executing a loop composed of the target core judging unit 40, the secondary fault ATPG executing unit 42, the test diverting unit 44, and the test interpolating unit 45, until there is no undetected fault in the termination condition judging unit 38. The target core judging unit 40 references the ATPG target flag and a skip flag set for the assumed fault set 24 of each core and, if the ATPG target flag is on, executes the secondary fault ATPG executing unit 42; however, when the ATPG target flag is off, the process of the secondary fault ATPG executing unit 42 is skipped. When generation of a test pattern succeeds in the process carried out by the secondary fault ATPG executing unit 42 with respect to an assumed fault in one core serving as a processing target, the test diverting unit 44 diverts the generated test pattern to another core, thereby enabling elimination of execution of ATPG with respect to the corresponding assumed fault and reduction in the total generation time of test patterns. The test interpolating unit 45 carries out interpolation of the test pattern by carrying out the process by the secondary fault ATPG executing unit 42 also with respect to the corresponding fault of the other core after diverting the test pattern to the other core by the test diverting unit 44. In the present embodiment, as depicted in the dynamic compaction executing unit 32 of FIG. 2, reduction of the test pattern generation time as a whole is achieved by the diverting of the test pattern of a successful case to ATPG, the interpolation of the test pattern, and the switching of the target core carried out by the target circuit switching unit 36 depicted in FIG. 1; and, in addition to that, by commonizing the circuit initial state among the cores, cancelling the exclusiveness among the cores, sharing a scan shift, and so on, which will be elucidated in later explanations.

Figure 3:
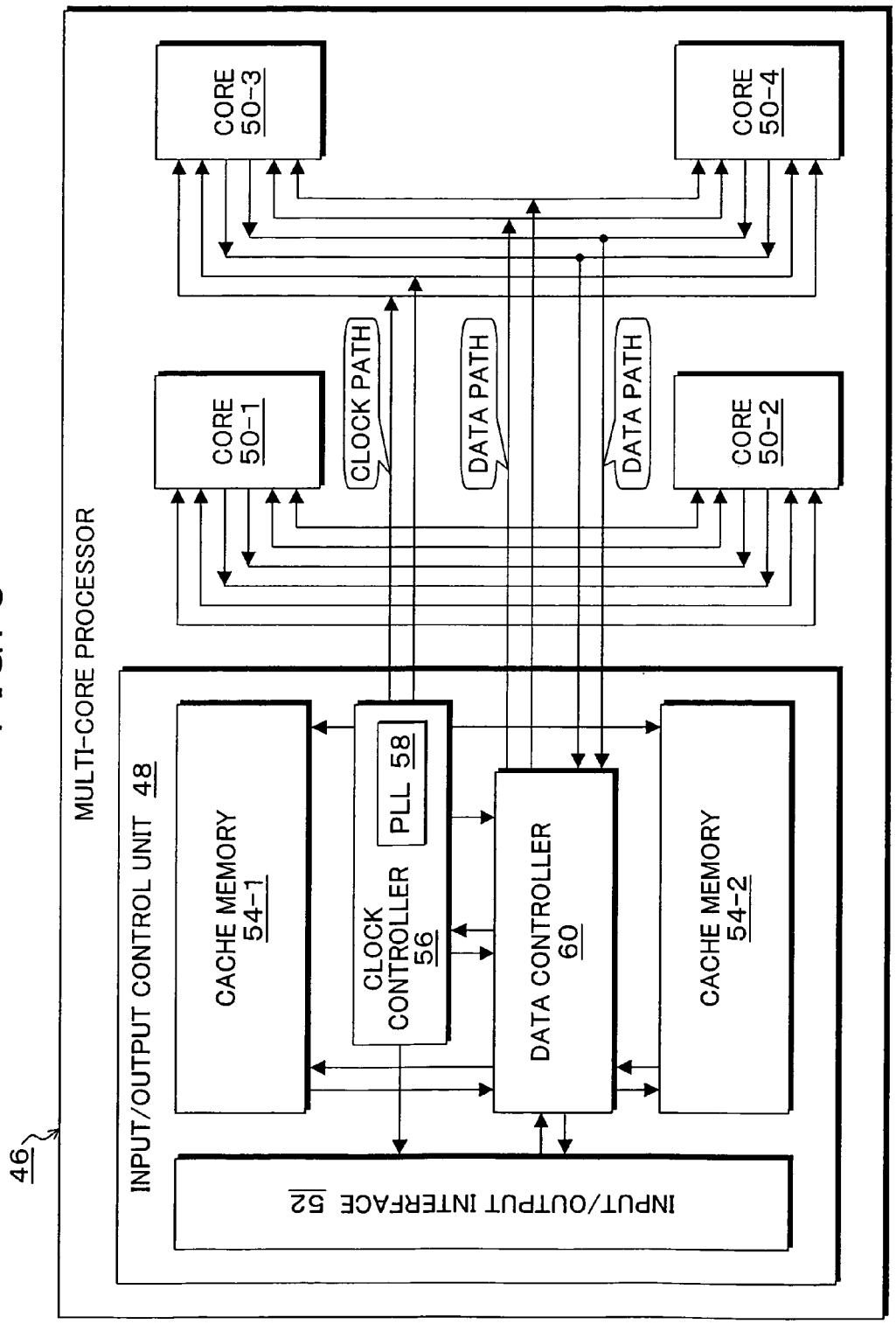
FIG. 3 is a block diagram depicting a multi-core processor to which test pattern generation of the present embodiment is applied.

FIG. 3 is a block diagram depicting a multi-core processor to which the test pattern generating system of the present embodiment is applied. In FIG. 3, the multi-core processor 46 provides four cores 50-1, 50-2, 50-3, and 50-4 with respect to an input/output' control unit 48. An input/output interface 52, cache memories 54-1 and 54-2, a clock controller 56 having a PLL 58, and a data controller 60 are provided in the input/output control unit 48. The cores 50-1 to 50-4 are connected to the clock controller 56 by clock paths and are connected to the data controller 60 by data paths. The cores 50-1 to 50-4 have equivalent circuit configurations, and, with respect to them, common control units, individual control units, a common observation unit, and an individual observation unit are present in the input/output control unit 48 as input/output units of the cores 50-1 to 50-4.

Figure 4:
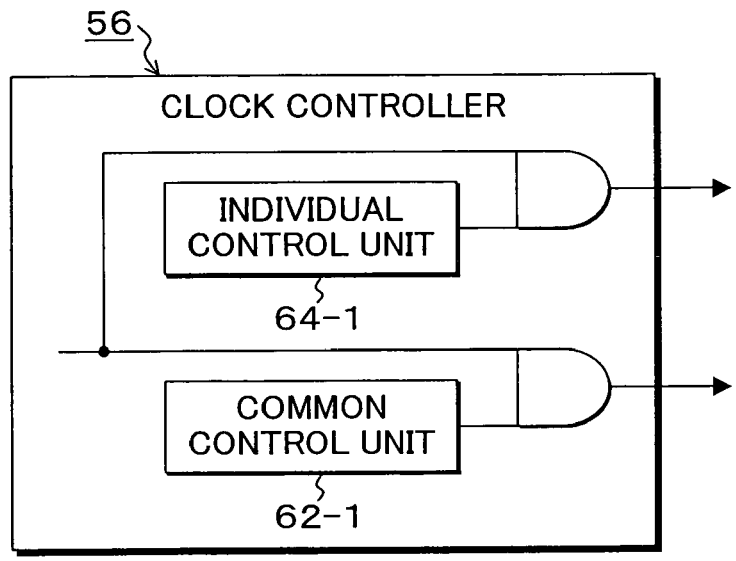
FIG. 4 is a block diagram depicting details of a clock controller of FIG. 3.

FIG. 4 is a block diagram depicting an overview of the clock controller 56 of FIG. 3, wherein the individual control unit 64-i and the common control unit 62-1 are provided.

Figure 5:
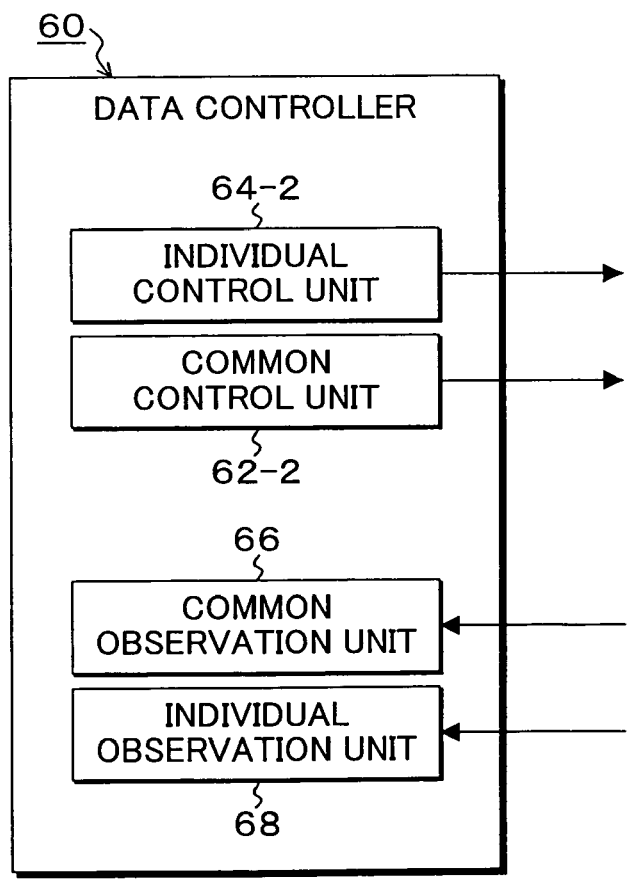
FIG. 5 is a block diagram depicting details of a data controller of FIG. 3.

FIG. 5 is a block diagram depicting an overview of the data controller 60 of FIG. 3, wherein the individual control unit 64-2 and the common control unit 62-2 are provided, and the common observation unit 66 and the individual observation unit 68 are provided.

Figure 6A:
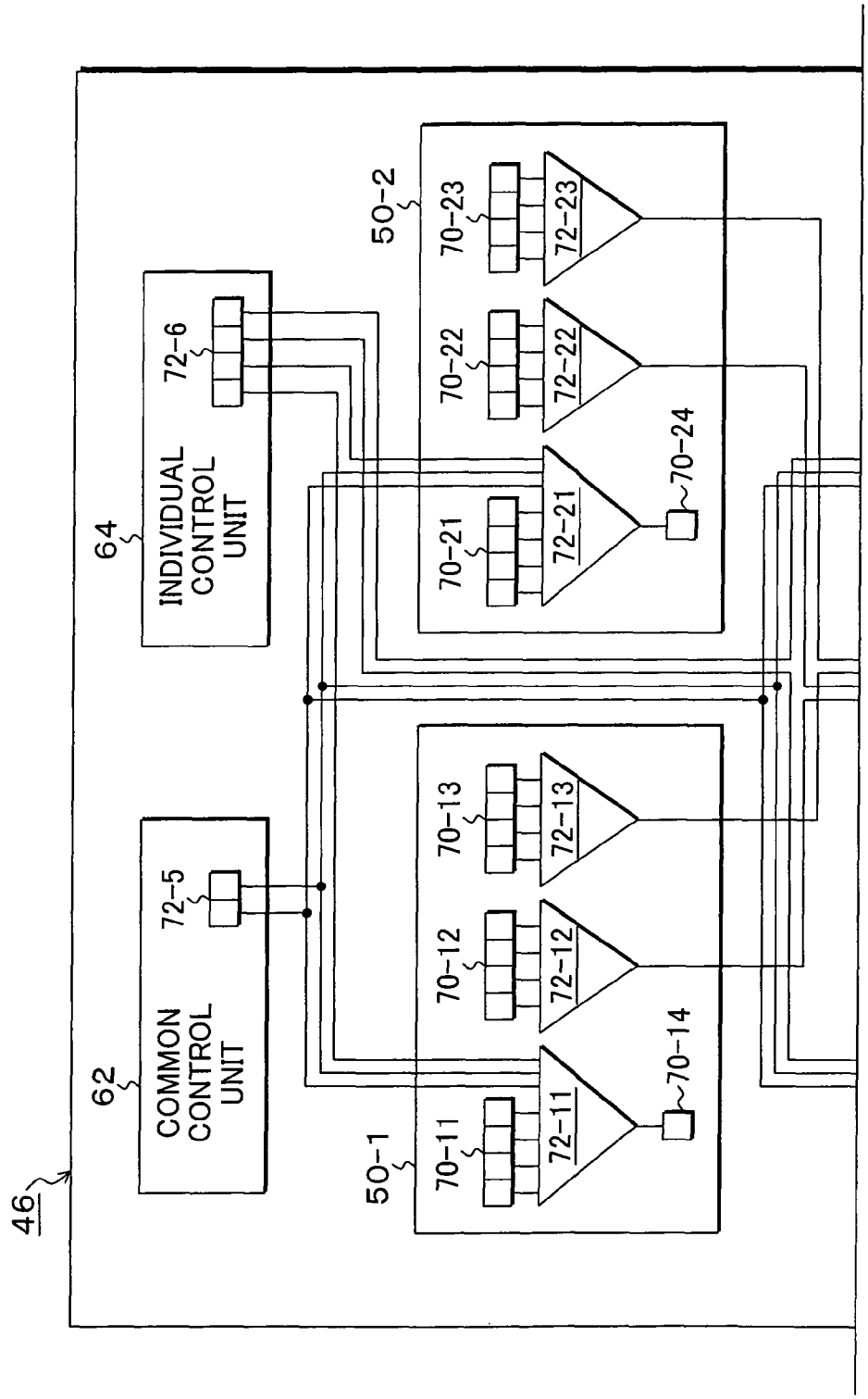

FIGS. 6A and 6B are block diagrams depicting the multi-core processor 46 of FIG. 3 by a schematic equivalent circuit. Specifically, when the circuit configuration is viewed by placing the cores 50-1 to 50-4, which have the equivalent circuit configurations, at the center in the multi-core processor 46 of FIG. 3, the common control unit, the individual control unit, the common observation unit, and the individual observation unit as depicted in FIGS. 5, 6A, and 6B are present as the inputs/outputs of the cores. When the multi-core processor 46 is considered to have such a circuit configuration, the multi-core processor can be represented by a schematic equivalent circuit as depicted in FIGS. 6A and 6B. In FIGS. 6A and 6B, the cores 50-1 to 50-4 have the same circuit configuration. For example, when the core 50-1 is taken as an example, three core circuits 72-11, 72-12, and 72-13, which are sets of logic gates, are provided; scan FFs 70-11, 70-12, and 70-13 are provided as inputs thereof, respectively; and a scan FF set 70-14 is provided at the output of the core circuit 72-11. The common control unit 62, the individual control unit 64, the common observation unit 66, and the individual observation unit 68 are provided for each of the cores 50-1 to 50-4. Scan FFs 72-5 are provided in the common control unit 62 and are connected to the core circuits 72-11 to 72-41, which are provided in the cores 50-1 to 50-4, so as to be input thereto. Scan FFs 72-6 are provided in the individual control unit 64 and are respectively and individually connected to the core circuit units 72-11 to 72-41, which are provided in the cores 50-1 to 50-4, independently. A scan FF 72-7 is provided in the common observation unit 66; and the outputs of the core circuits 72-12, 72-22, 72-32, and 72-42 of the cores 50-1 to 50-4 are connected to the scan FF 72-7 via a decoder 75. Scan FFs 72-8 are provided in the individual observation unit 68, and the outputs of the core circuits 72-13, 72-23, 72-33, and 72-43 provided in the cores 50-1 to 50-4 are individually connected to the scan FFs 72-8. Hereinafter, a test pattern generating process according to the present embodiment carried out for the schematically depicted multi-core processor 46 of FIGS. 6A and 6B will be explained in detail.

(2. Association of Input Points and Faults)

In the present embodiment, since the test pattern generation focusing on the equivalency of the cores 50-1 to 50-4 in the multi-core processor 46 is carried out, association of the scan FF sets, which are input points in the cores 50-1 to 50-4, and the assumed fault sets has to be carried out. In the association of the scan FF sets and the assumed fault sets, when the multi-core processor 46 is hierarchically designed, the cores 50-1 to 50-4 are supposed to be designed as the same modules; therefore, association of the scan FF sets and the assumed fault sets among the cores can be carried out simply by comparison of net names or signal names. Even when the multi-core processor 46 is not hierarchically designed, the association of the scan FF sets and the assumed fault sets among the cores can be realized by using an existing logic position verification tool or the like. Herein, when the number of the cores of the multi-core processor 46 is generalized to m (m is a positive integer), the scan FF set S and the assumed fault set F in the cores can be described as below.

$$S=\{s[1][i], s[2][i] \ldots, s[m][i]\}$$

i: The number of scan FFs in the core (i is a positive integer)

$$F=\{f[1][j], f[2][j] \ldots, f[m][j]\}$$

j: The number of assumed faults in the core (j is a positive integer)

FIGS. 7A to 7C are explanatory diagrams depicting association of the scan FF sets and the assumed fault sets among the cores, wherein the number of the cores in the multi-core processor 46 of FIGS. 6A and 6B is generalized to m.

FIG. 7A extracts and depicts m units of cores 50-1 to 50-*m*, and the cores have scan FFs 70-11 to 70-*m*3 and core circuits 72-11 to 72-*m*3, which are same as those depicted in the cores 50-1 to 50-4 of FIGS. 6A and 6B. Herein, when the core 50-1 is taken as an example, a scan FF set 74-1 thereof is a set that groups the scan FF sets 70-11, 70-12, 70-13, and 70-14, which are provided at the inputs/output of the core circuits 72-11, 72-12, and 72-13, as depicted by a dotted line and is the set which is extracted and depicted in FIG. 7B. On the other hand, an assumed fault set 76-1 is a set of assumed faults fixed to 0 or 1, which are set for the core circuits 72-11, 72-12, and 72-13 provided in the core 50-1. For example, the core circuit 72-11 provided in the core 50-1 is a gate circuit extracted and depicted in FIG. 7C; f[1][1], f[1][2], and f[1][3] are set as assumed faults for the inputs of the gate circuit, respectively; and the set that collects the assumed faults from all of the core circuits 72-11 to 72-13 serves as the assumed fault set 76-1.

FIG. 8 is an explanatory diagram depicting a table structure of fault data used in the present embodiment, wherein the case described by $C^{++}$ is taken as an example. In FIG. 8, the fault data 82 is composed of a fault table 84 and a fault set table 86. In the fault table 84, an identifier,
an assumed net,
a fault value,
an atpg try-done flag, and
a detection-done flag, are present. Furthermore, an atpg target flag 85 and
a skip flag 87 are provided in the present embodiment as newly added information. Whether the core part serves as a target of ATPG or not and whether it is to be skipped or not is controlled by referencing the atpg target flag 85 and the skip flag 87 in the fault data. Upon execution of ATPG, the fault table 84, which is the information about an individual fault in the test target circuit, and the fault set table 86, which is the set of the fault table 84 of the test target circuit, are instantiated and treated as the fault data 82.

FIGS. 9A and 9B are explanatory diagrams depicting the assumed fault set and the scan FF set of each core prepared for diverting the test patterns, which are generated upon successful ATPG by the scan chain set creating unit 18 and the assumed fault set creating unit 22 of FIG. 1, to another core, wherein the assumed fault set and the scan FF set are depicted in table structures by the C++ language.

FIG. 9A depicts assumed fault set data 88, which is composed of fault set tables 90-1, each of which corresponds to one core, and a core fault set table 90-2 of the entire circuit. Specifically, in an id array of the fault set table 90-1 corresponding to one core, any of the assumed fault sets 76-1 to 76-*m* of each core prepared for carrying out test pattern diversion of successful ATPG as depicted in FIG. 7A is saved, and the identifier of a fault class in the fault table 84 depicted in FIG. 8 is saved as each element of the array. The operations carried out across the entire circuit such as core diversion or target core switching are realized by the management using the core fault set table 90-2 of the entire circuit, which assembles the fault set tables 90-1 of respective cores.

FIG. 9B depicts scan FF set data 92, which is composed of scan FF set tables 94-1, each of which corresponds to one core, and a scan FF set table 94-2 of the entire circuit. Also in this case, in an id array of the scan FF set table 94-1, any of the scan FF sets 74-1 to 74-*m* depicted in the cores 50-1 to 50-*m* of FIG. 7A is saved, and the identifier depicted in the fault table 84 of FIG. 8 is saved as each element of the id array. The operations carried out across the entire circuit such as test pattern diversion or target core switching upon successful ATPG are realized by the management using the scan FF set table 94-2 of the entire circuit, which assembles the scan FF set tables 94-1 of respective cores.

(3. Test Pattern Diversion)

Figure 10A:
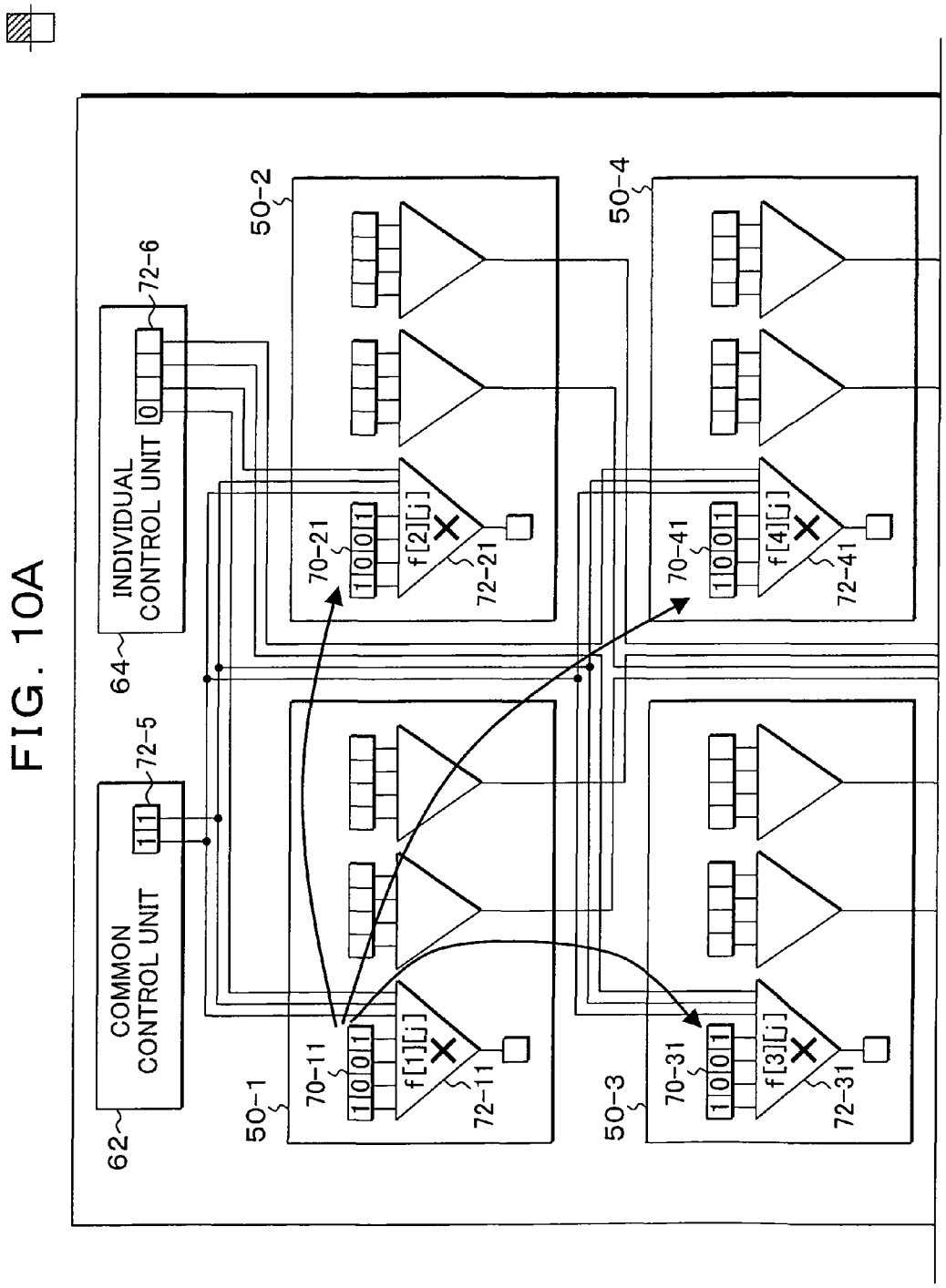

FIGS. 10A and 10B are explanatory diagrams depicting a process of the present embodiment in which a test pattern of the core for which ATPG succeeds is diverted to another core. In the present embodiment, after the scan chain set S and the assumed fault set F have been associated among the cores by the scan chain set creating unit 18 and the assumed fault set creating unit 22 of FIG. 1, for example when the core 50-1 is selected as a target core in FIGS. 10A and 10B, ATPG is executed only for the assumed faults f[1][j] of the interior of the core 50-1 among the faults assumed for the cores 50-1 to 50-4 so as to make an attempt to generate a test pattern. Only when the generation of the test pattern with respect to the faults of the core 50-1 succeeds in the execution of ATPG, the states which are set for the scan FF set s[1][*] of the interior of the core 50-1 of the ATPG successful case are diverted to the cores 50-2, 50-3, and 50-4 as depicted by the arrows of FIGS. 10A and 10B as the test patterns for the assumed faults f[2][j], f[3][j], and f[4][j] of the remaining cores 50-2, 50-3, and 50-4. More specifically, among the states which are set for the scan FF set s[1][*] of the interior of the core 50-1 of the ATPG successful case, the states of the scan FF set which are referenced by ATPG are diverted.

This diversion can be expressed as $$s[1][*] \rightarrow s[2][*], s[3][*], s[4][*].$$

When generation of the test pattern by ATPG succeeds with respect to the faults of the interior of the core 50-1 in this manner, the generated test pattern (states of the scan FF set) is diverted to the other cores 50-2, 50-3, and 50-4; thus, execution of ATPG with respect to the faults of the corresponding interiors of the cores 50-2, 50-3, and 50-4 can be eliminated, and the test generation time with respect to the entire circuit can be reduced as a result.

(4. Test Pattern Interpolation)

Figure 11A:
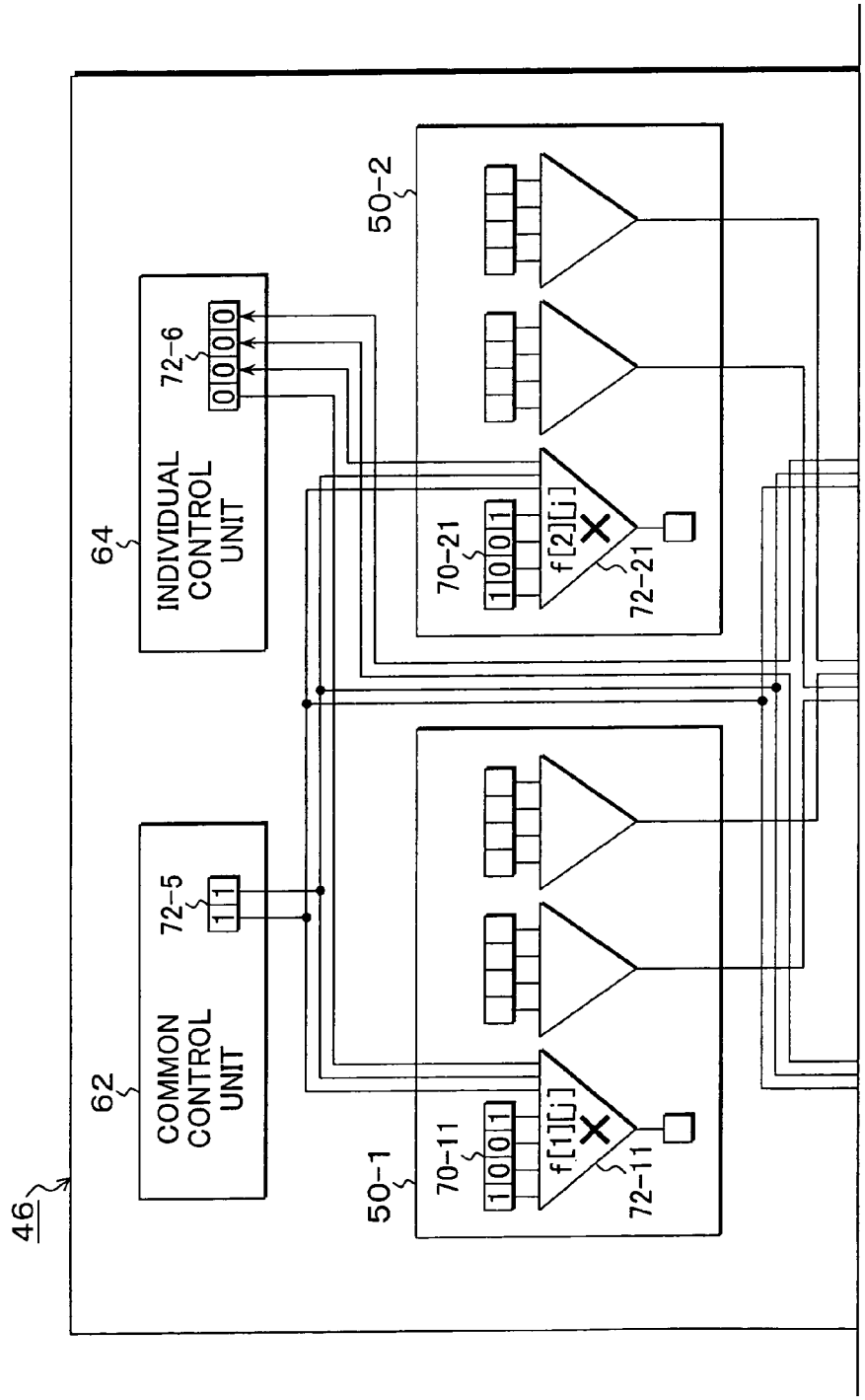
FIGS. 11A and 11B are explanatory diagrams depicting a test pattern interpolation process of the present embodiment, in which ATPG is executed with respect to the cores to which the test pattern is diverted.
Figure 11B:
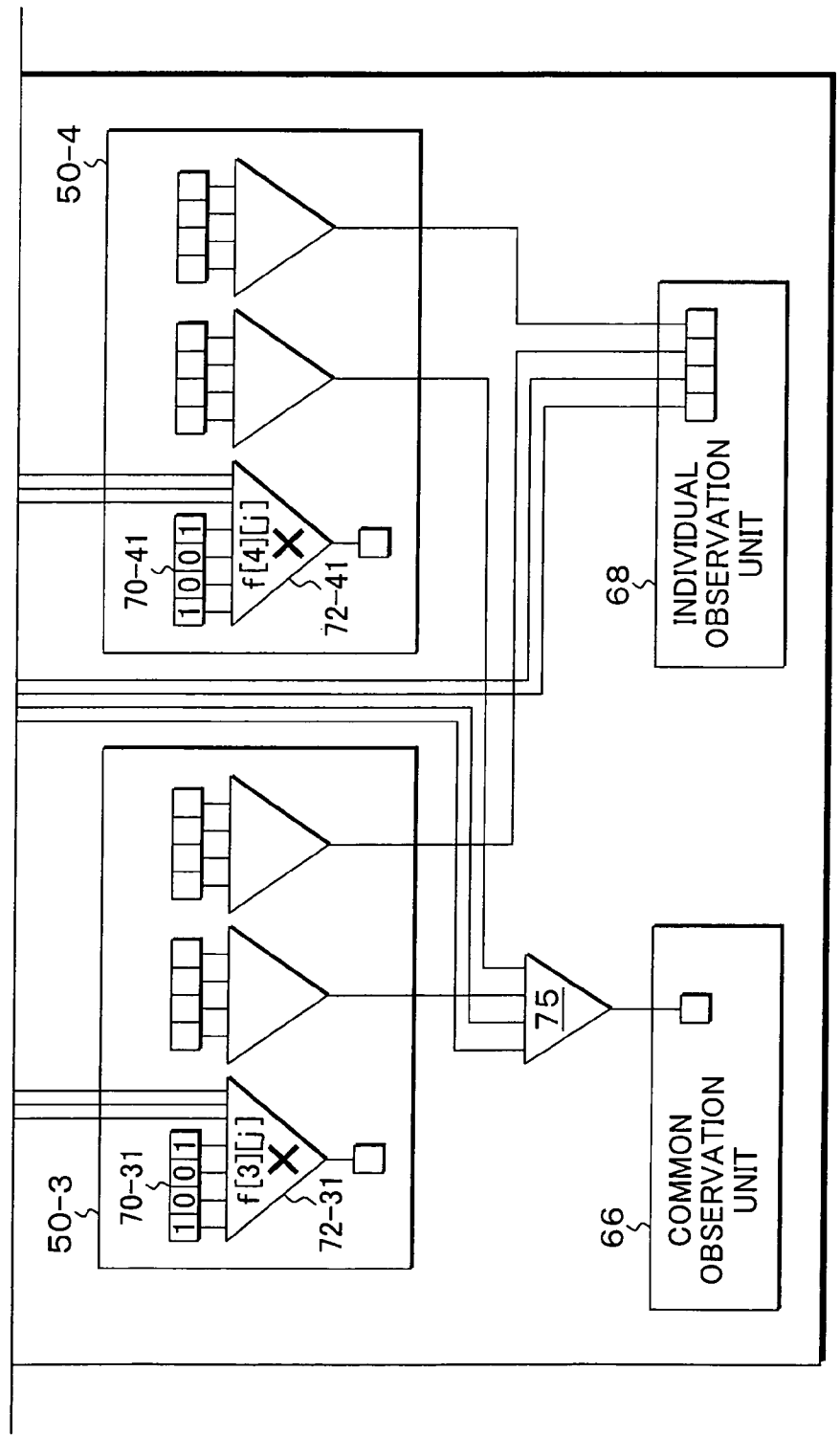

FIGS. 11A and 11B are explanatory diagrams depicting a test pattern interpolation process of the present embodiment, in which ATPG is executed with respect to the cores to which the test pattern is diverted. In FIGS. 11A and 11B, if the assumed faults j of the interiors of the cores 50-1 to 50-4 can be detected by the states given only by the scan FF set S, generation of test patterns is supposed to be completed by the diversion of the test pattern depicted in FIGS. 10A and 10B. However, when the individual control unit 64, which carries out control for each of the cores, is provided in the actual multi-core processor 46, the test pattern generation for the entire CPU (Central Processing Unit) becomes incomplete since test patterns for the individual control unit 64 are not generated only by carrying out the diversion of the test pattern depicted in FIGS. 10A and 10B. Therefore, in the present embodiment, for example, after the test pattern generated for the assumed faults of the core 50-1 are diverted to the other cores 50-2, 50-3, and 50-4 as depicted by the arrows of FIGS. 10A and 10B, ATPG is executed again also with respect to the cores 50-2, 50-3, and 50-4 of the diverting destinations as depicted in FIGS. 11A and 11B, so as to interpolate the test pattern generation with respect to the individual control unit 64, which is present for each of the cores 50-1 to 50-4. Herein, according to the interpolation process of the test patterns, other than ATPG for the assumed faults f[1][j] of the target core 50-1, ATPG is executed (m−1) times with respect to, for example, the assumed faults f[2][j] to f[m][j] of the remaining cores 50-2 to 50-m. Therefore, when the time taken for the assumed faults f[1][j] of the original core 50-1 is t1, the time required for generation of the test patterns is, including this, $$t1+(m-1)\times t1 = m \times t1,$$

and it seems that reduction in the test pattern generation time cannot be expected. However, in the present embodiment, as depicted in FIGS. 10A and 10B, the test pattern with respect to the assumed faults f[1][j] of the core 50-1, which has been processed first, is diverted as the initial states of ATPG to the assumed faults f[2][j] to f[m][j] of the cores 50-2 to 50-m (m=4); therefore, the space for which search has to be carried out is limited only to the space that is determined by the individual control. Therefore, the sum of the test pattern generation time t2 to tm required by the ATPG with respect to the faults of the cores 50-2 to 50-m is $$\Sigma tj \leq (m-1) \times t1.$$

wherein j=2, 3, . . . , m.

Therefore, the sum of the test generation time required by the ATPG with respect to the faults of the cores 50-2 to 50-m does not become longer than the generation time of the case in which execution of ATPG is simply repeated (m−1) times with respect to the assumed faults f[2][j] to f[m][j].

(5. Switching of Target Core)

In the present embodiment, when the test pattern generating process is to be carried out by selecting a particular core from the plurality of cores, inequality of detection faults among the cores is suppressed by sequentially switching the target core.

Figure 12A:
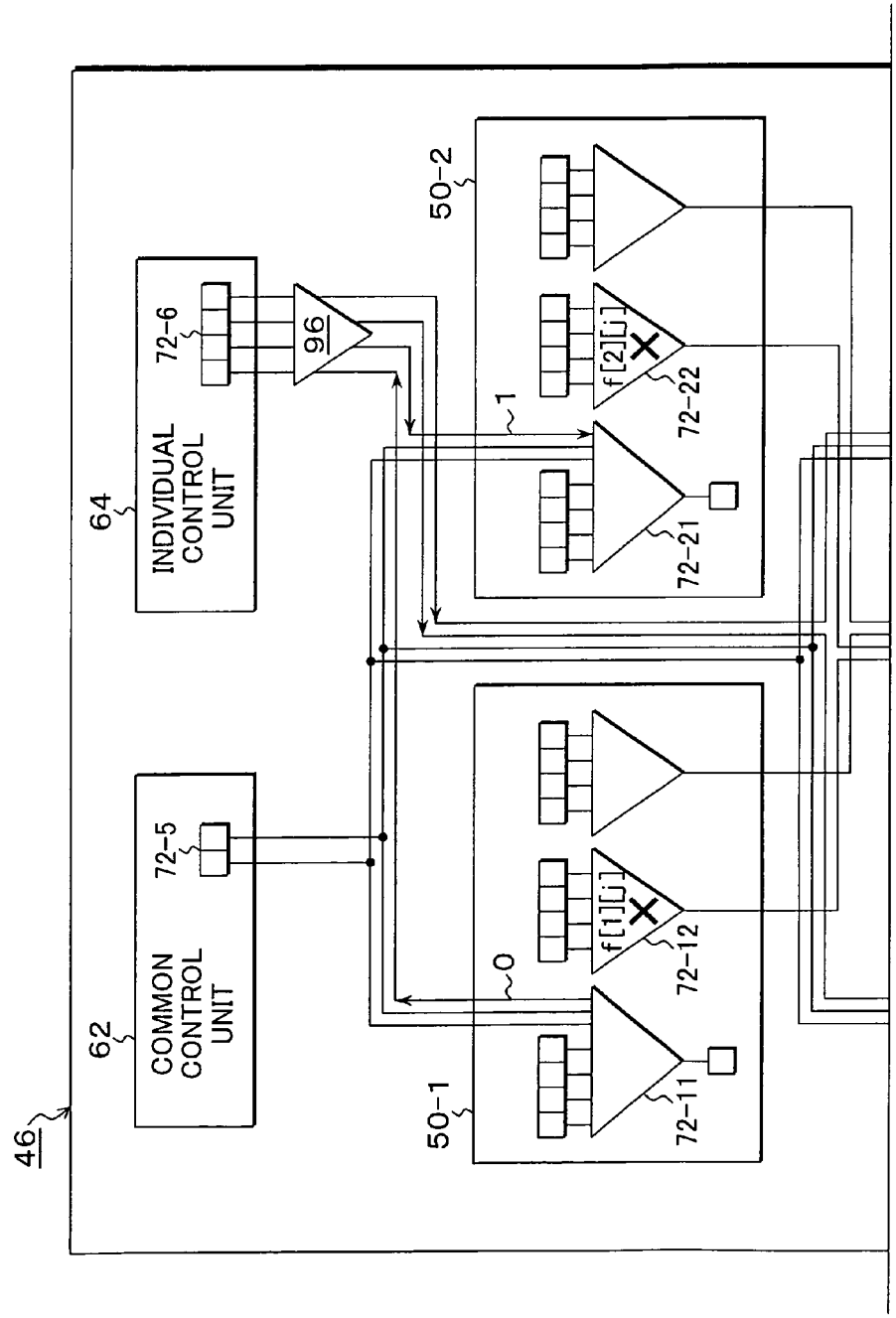
FIGS. 12A and 12B are explanatory diagrams depicting exclusiveness among the cores in the present embodiment.
Figure 12B:
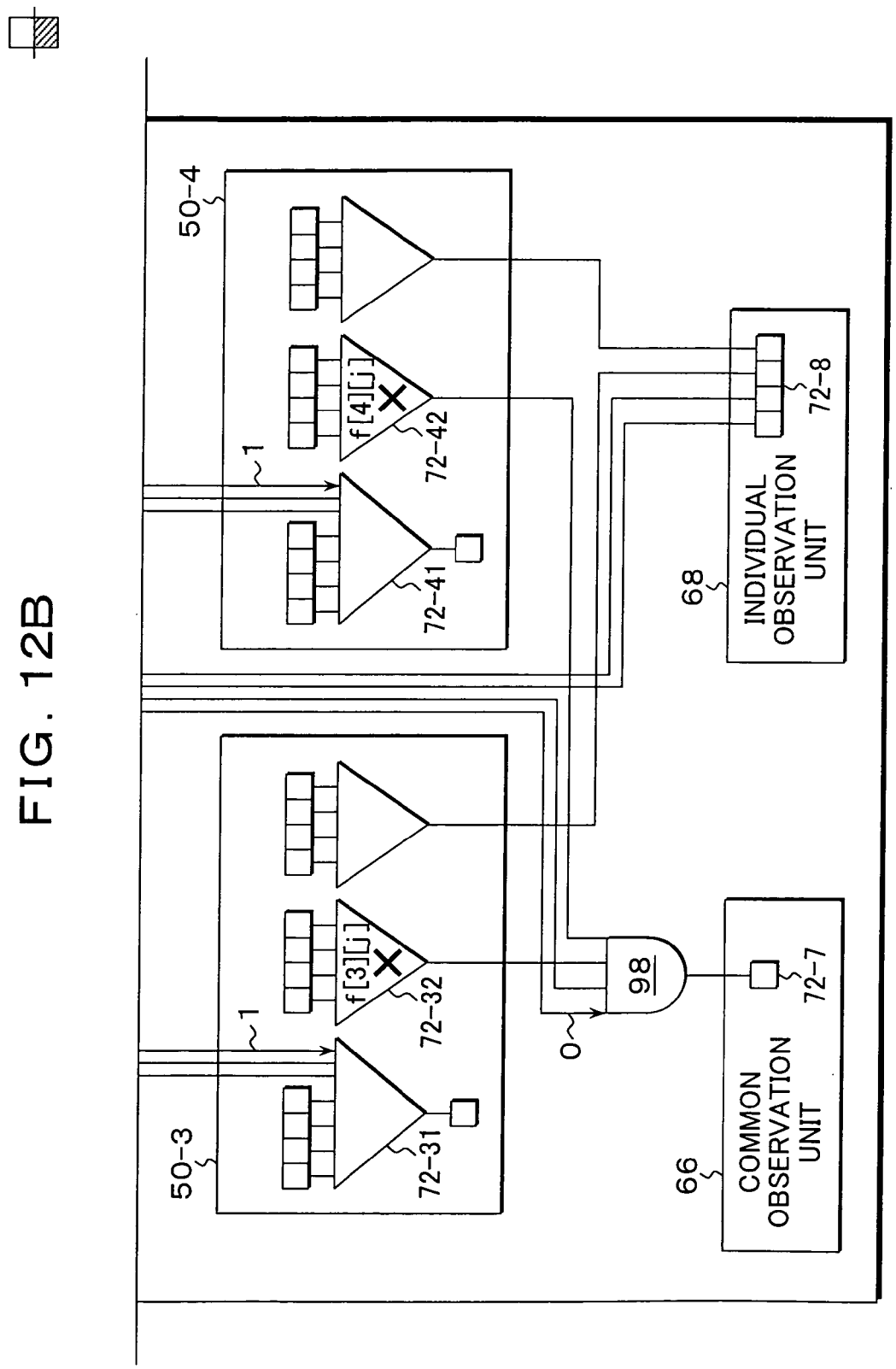

FIGS. 12A and 12B are explanatory diagrams depicting exclusiveness among the cores in the present embodiment. In the multi-core processor 46 of FIGS. 12A and 12B, in an actual circuit configuration, sometimes exclusive logics are present in the individual control unit 64 and the common observation unit 66, respectively. In the individual unit 64, a decoder 96 is provided at the output side of the scan FFs 75-6. The decoder 96 has a logic in which, when a request value "0" from the core circuit 72-11 of the core 50-1 is satisfied, the signals to the core circuits 72-21, 72-31, and 72-41 provided in the cores 50-2, 50-3, and 50-4 are determined to be "1". As a result, the individual control unit 64 has exclusive nature of controlling between the core 50-1 and the cores 50-2 to 50-4. The signals from the core circuits 72-12, 72-22, 72-32, and 72-42 provided in the cores 50-1 to 50-4 are coupled with the scan FF 72-7 of the common observation unit 66 by an AND gate 98, which carries out an AND operation. When the fault f[1][j] of the core circuit 72-12 of the core 50-1 is to be observed in this state, if the signal thereof is "0", the signals of the core circuits 72-22, 72-32, and 72-42 in the cores 50-2, 50-3, and 50-4 caused by faults f[2][j], f[3][j], and f[4][j] cannot be observed at the same time since the output of the AND gate 98 becomes 0. Therefore, in the common observation unit 66, observation exclusiveness is present among the cores 50-1 to 50-4. In the case in which the exclusive nature of controlling and the observation exclusiveness are present among the cores in this manner, when the process including the test pattern diversion and the test pattern interpolation is executed by the test pattern generating system of FIG. 1 while, for example, the core 50-1 is fixed as a target core, correct test patterns are not generated in the cores 50-2 to 50-4 other than the target core 50-1; therefore, imbalance that the fault detection rates thereof are lowered compared with that of the target core 50-1 is caused. Therefore, in the present embodiment, the core serving as the target of the test pattern generating process is sequentially switched at appropriate timing, thereby suppressing the imbalance of the detected faults among the cores. The switching of the target core in the present embodiment can be realized by a method such as (1) reconfiguration of the fault set tables or (2) switching of the order of access to the fault set tables.

FIG. 13 is an explanatory diagram depicting a target core switching process of above described (2), in which the order of access to the fault set tables is switched. In FIG. 13, the case in which the number of the cores of the multi-core processor 46 is generalized to m is taken as an example, and the assumed fault set F is created as $$F=\{f[1][*],f[2][*],\ldots,f[m][*]\}$$

corresponding to the cores 50-1 to 50-m. In the target core switching process of FIG. 13, in an n-th compaction turn of the dynamic compaction depicted in the test pattern generating unit 28 of FIG. 1, if the core 50-1 is to serve as the ATPG target, the ATPG flag (ATPG target flag which indicates the target core for which ATPG is to be carried out) of the assumed fault set 76-1 corresponding to the core 50-1 is turned on so as to set it as the ATPG target, and the ATPG flags are turned off about the assumed fault sets 76-2 to 76-m of the cores 50-2 to 50-m other than that so as to exclude them from the ATPG target. Next, in a n+1 compaction turn, the ATPG flag of the assumed fault set 76-1 of the core 50-1, which has been turned on in the n-th compaction turn, is turned off; and, at the same time, the ATPG flag of the assumed fault set 76-2 of the next core 50-2 is turned on so as to set it as the ATPG target, thereby switching the target core of ATPG from the core 50-1 to 50-2. Thereafter, similarly, in each compaction turn, the process of sequentially switching the ATPG target core is repeated by the operation of the ATPG flags. The inequality of the detected faults among the cores caused by the exclusive nature of controlling and the observation exclusiveness as depicted in FIG. 12 can be suppressed by sequentially switching the ATPG target core in this manner and repeating the dynamic compaction with respect to, for example, secondary faults. Herein, when the compaction of sequentially switching the ATPG target core from the core 50-1, 50-2, 50-3, to 50-4 is repeated, ATPG of only one assumed fault for which switching is carried out is executed among the corresponding assumed faults f[1][j], f[2][j], f[3][j], and f[4][j] of each of the ATPG target cores 50-1 to 50-4, and the others are skipped. The reason thereof will be explained. It is assumed that ATPG is repeated for example for below assumed faults as the compaction of sequentially switching the ATPG target core from the core 50-1, 50-2, 50-3, to 50-4 is repeated.

n-th time: Assumed fault of the core 50-1 f[1][n]
n+1-th time: Assumed fault of the core 50-2 f[2][n+1]
n+2-th time: Assumed fault of the core 50-3 f[3][n+2]
n+3-th time: Assumed fault of the core 50-4 f[4][n+3]

In this case, when the process returns to the core 50-1 in a next n+4-th time, f[1][n+4] is selected as a next assumed fault of the core 50-1, and the assumed faults f[1][n+1] to f[1][n+3] are skipped. They can be skipped because of the below mechanism.

When ATPG succeeds with respect to the ATPG target core by the compaction of sequentially switching the cores 50-1, 50-2, 50-3, and 50-4, a fault simulation is executed for the entire common circuits of the cores 50-1 to 50-4 by the circuit fault detecting unit 34 of FIG. 1 by using the generated test pattern, faults are detected, and "detection-done flags" depicted in the fault table of FIG. 8 are set for the detected faults of the cores 50-1 to 50-4 by the fault simulation. Therefore, when the process returns to the core 50-1 in the n+4-th time, since the "detection-done flags" are set for the assumed faults f[1][n+1] to f[1][n+3] by the fault simulation, they are skipped, and the assumed fault f[1][n+4] can be selected.

(6. Invalidation of ATPG Skip)

The exclusiveness among the cores including the exclusive nature of controlling of the individual control unit 64 and the observation exclusiveness of the common observation unit 66 in the multi-core processor 46 depicted in FIGS. 12A and 12B is dependent on the circuit configuration serving as a test target; and, due to the exclusiveness, the possibility and the impossibility of simultaneous detection cannot be uniquely determined for the assumed faults f[2][j] to f[4][j] of the cores 50-2 to 50-4 corresponding to the ATPG target core 50-1. In the present embodiment, the success of ATPG execution with respect to, for example, the assumed fault f[1][j] of the core 50-1 selected as a target serves as a trigger, and, then, the series of processes of test pattern diversion and test pattern interpolation with respect to the other cores 50-2 to 50-4 are carried out. In the processes of test pattern diversion and test pattern interpolation, the efficiency of the fault detection with respect to the faults for which the possibility and the impossibility of simultaneous detection cannot be uniquely determined among the cores is lowered. For example, it is assumed that, when the assumed fault set $$\{f[1][j],f[2][j],f[3][j],f[4][j]\}$$

corresponding to the cores 50-1 to 50-4 is present, under certain conditions, for example in a net state during dynamic compaction, a test pattern with respect to the assumed fault set $$\{f[1][j],f[2][j]\}$$

of the cores 50-1 and 50-2 is present, but a test pattern with respect to the assumed fault set $$\{f[3][j],f[4][j]\}$$

with respect to the cores 50-3 and 50-4 is not present. In this case, if the core 50-1 or 50-2 is selected as a target core, there is not problem. However, if the core 50-3 or 50-4 is selected, the test pattern generation with respect to the assumed fault set $$\{f[1][j],f[2][j]\}$$

for which a test pattern is originally supposed to be generatable if the core 50-1 or 50-2 is selected is missed. This leads to reduction in the efficiency of fault detection per a test pattern. In the present embodiment, for example, if the process of test pattern diversion or test pattern interpolation with respect to the other core 50-2, 50-3, or 50-4 fails although the ATPG with respect to the target core 50-1 has succeeded, exclusiveness among the cores related to test pattern generation is supposed to be present among the faults thereof. Therefore, after the process of test pattern diversion and test pattern interpolation fails, the skip flags provided for the assumed fault sets, which are generated to correspond to the cores of the diversion and interpolation destinations, are changed from previous on and set to off, thereby carrying out learning so that ATPG is not skipped. For example, in the case in which J is equal to 1, 2, 3, . . . i, and j, if, based on success of ATPG by an i-th assumed fault f[1][i] with respect to the core 50-1, a process of diverting the test pattern thereof to the other cores 50-2 to 50-4 is carried out and fails, the skip flags of the i-th assumed faults f[2][i], f[3][i], and f[4][i] of the cores 50-2 to 50-4 serving as the diverting destinations are turned off. Then, when the test pattern generation of the target core 50-1 is finished and a transition to the test pattern generation of the cores 50-2 to 50-4 is made, the assumed faults for which the skip flags are off are selected, and ATPG is executed therefor.

(7. Commonization of Circuit Initial State Among Cores)

The factors of failure of test pattern diversion and test pattern interpolation upon successful ATPG with respect to a fault of a target core according to the present embodiment conceivably include, other than the exclusiveness among the cores due to the circuit configuration per se as depicted in FIGS. 12A and 12B, mismatch of the net states of the peripheries of the assumed fault set, which is a target of ATPG, between the diverting origin core and the diverting destination core upon diversion of a test pattern. Such mismatch of the net states occurs also due to the exclusiveness of the circuit depicted in FIGS. 12A and 12B along with progress (compaction turn) of generation of the test pattern in dynamic compaction; however, sometimes circuit states are different from an initial stage of test pattern generation before that. Specifically, the operations of determining the initial state of a circuit include (1) a clip process, in which the state which maintains an input value such as 0, 1, X (indefinite value), or Z (high-impedance value) is instructed by a user with respect to a particular input point such as primary input or scan input, and, (2) unlike the direct instruction of the input point like the clip process, a process in which only an instruction that causes a particular state (hereinafter, referred to as "net state") such as 0, 1, X (indefinite value), or Z (high-impedance value) with respect to a net (connection signal) in the circuit to be fixed is given, and ATPG is used for realizing the net state according to the instruction. Since the clip process is an arbitrary instruction made by the user, the mismatch of the net states among the cores caused along with the clip process cannot be adjusted by ATPG. However, the mismatch of the net states among the cores caused by the instruction which fixes the net state in the circuit can be adjusted by ATPG. A specific example of the fixed net state in the circuit is, for example when a processor is taken as an example, the case in which $n\tau$ path (also called multi-cycle path) for outputting configuration information that is used only upon activation or reback of a calculator system is present.

FIG. 14A depicts a $1\tau$ path 100, which is equal to a cycle time of an operating frequency in a normal CPU and includes a transmitting FF 102, gate circuits 104-1 and 104-2, and a receiving FF 106. In a delay function test, generally, the state which is changed by a transmission clock for the transmitting FF 102, for example, a change from 0 to 1 is set at the transmitting FF 102, and the test is carried out by checking whether the generated change can be observed or not by a reception clock applied to the receiving FF 106.

FIG. 14B depicts the result of the test of the $1\tau$ path 100. When the state is changed from 0 to 1 by the transmission clock at time t1, the change can be observed by the reception clock at time t2.

FIG. 14C depicts an $n\tau$ path 101. In the $n\tau$ path 101, for example, five gate circuits 104-1 to 104-5 are present between the transmitting FF 102 and the receiving FF 106. When a delay function test of operating the circuit by a $1\tau$ cycle is executed for the $n\tau$ path 101 as well as $1\tau$ path 100 of FIG. 14A, the observation result depicted in FIG. 14D is obtained, wherein propagation of the change of the transmitting FF 102 from the state 0 to 1 is not ensured by the receiving FF 106 according to the reception clock at the time t2 due to delay in the path, and an expected-value defect may occur depending on a given test cycle of the $1\tau$ cycle. Therefore, upon a delay function test, as a cut process of fixing the state with respect to a gate 104-3, which is in front of a cut point 108, by providing the cut point 108 in the net of the $n\tau$ path 101, the cut point 108 of the output of the gate 104-3 is fixed by giving a change from the state 0 to the state 0 in synchronization with the transmission clock and the reception clock. In this manner, if some sorts of restriction conditions are not provided when the cut process of fixing the state with respect to the $n\tau$ path 101 is to be carried out, ATPG tries to carry out the cut process for independently fixing the state with respect to the given cut point 108. Therefore, achievement of the same circuit state among the cores is not ensured. Therefore, failure may occur in the processes of test pattern diversion and interpolation. Therefore, in the present embodiment, in order to commonize the initial state of the circuit among the cores, for example when the core 50-1 in FIGS. 12A and 12B is selected as a target core when the cut process is to be carried out, and, if the state fixation of the cut point instructed to be carried out in the selected target core 50-1 succeeds in generation of the test pattern by ATPG, the state for realizing the cut is diverted to the other cores 50-2, 50-3, and 50-4 as well as the case of the diversion of the states of the scan FF sets depicted in FIGS. 10A and 10B. Furthermore, after the state for realizing the cut is diverted, ATPG is executed with respect to the cut point of the diverting destinations so as to carry out interpolation, thereby commonizing the initial state of the circuit among the cores.

(8. Cancellation of Exclusiveness Among Cores)

Figure 15A:
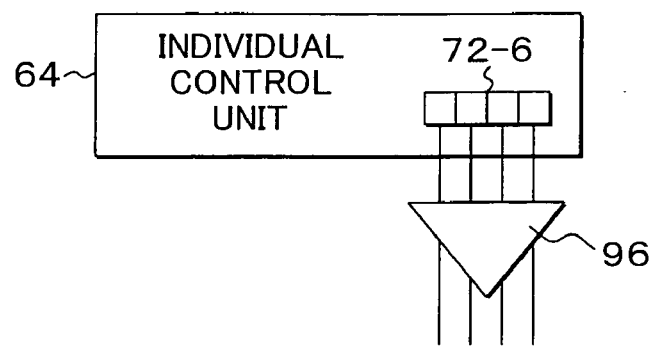
FIGS. 15A and 15B are block diagrams depicting a canceller circuit provided at an individual control unit, which eliminates the exclusive nature of controlling among the cores in the present embodiment.
Figure 15B:
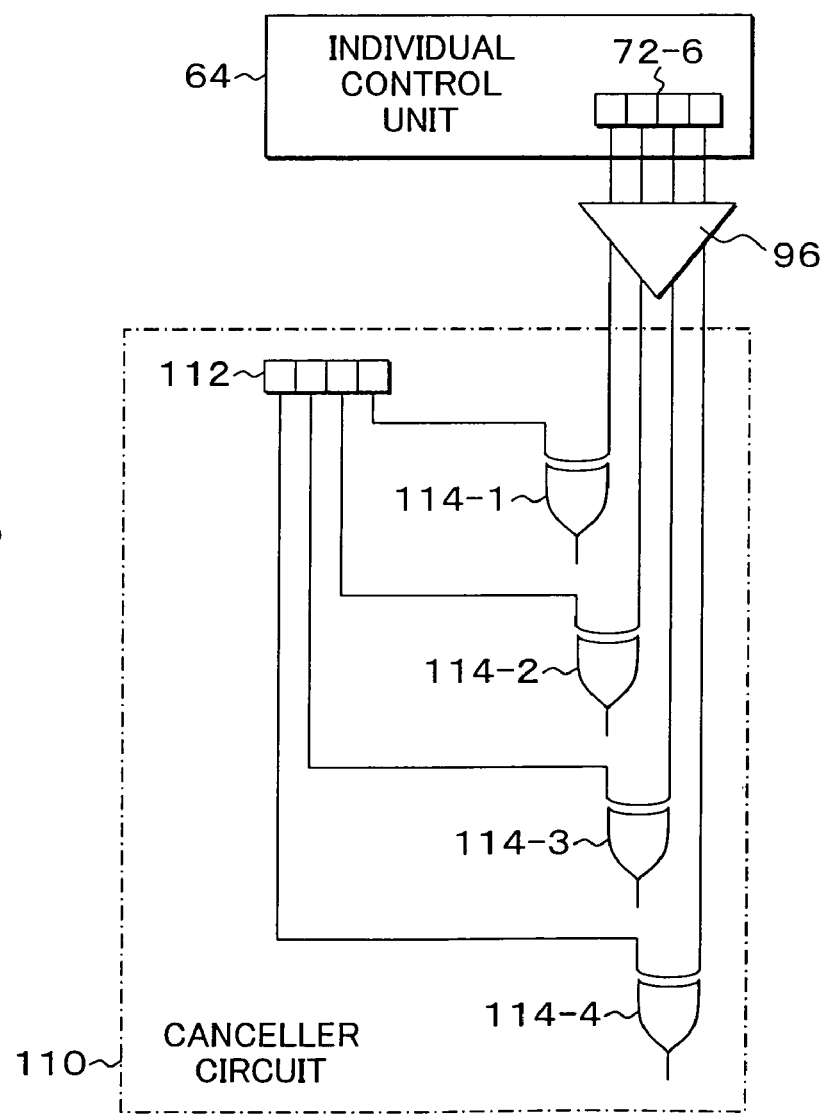

FIG. 15A extracts the circuit part which is a cause of the exclusive nature of controlling in the individual control unit 64 depicted in FIGS. 12A and 12B. In FIG. 15A, control signals from the individual control units 64 to the respective cores have exclusive nature of controlling as a result of, for example, passage through the logics of the decoder 96. In such a case, a canceller circuit 110 depicted in FIG. 15B is provided. The canceller circuit 110 is composed of scan FFs 112 and EOR gates (exclusive OR gates) 114-1 to 114-4. More specifically, the control signals for the respective cores transmitted from the decoder 96 are input to the inputs of one-side inputs of the EOR gates 114-1 to 114-4, and signals from the scan FFs 112 are input to the other inputs thereof. When such canceller circuit 110 is used, each of the control signals for the respective cores output from the decoder 96 via the EOR gates 114-1 to 114-4 can be independently set by the state 0 or 1 with respect to the scan FF 112, and the exclusive nature of controlling among the cores can be eliminated.

Figure 16A:
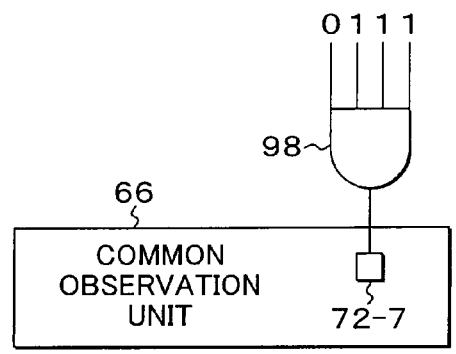
FIGS. 16A and 16B are block diagrams depicting a canceller circuit provided at a common observation unit, which eliminates exclusive nature of controlling among the cores in the present embodiment.
Figure 16B:
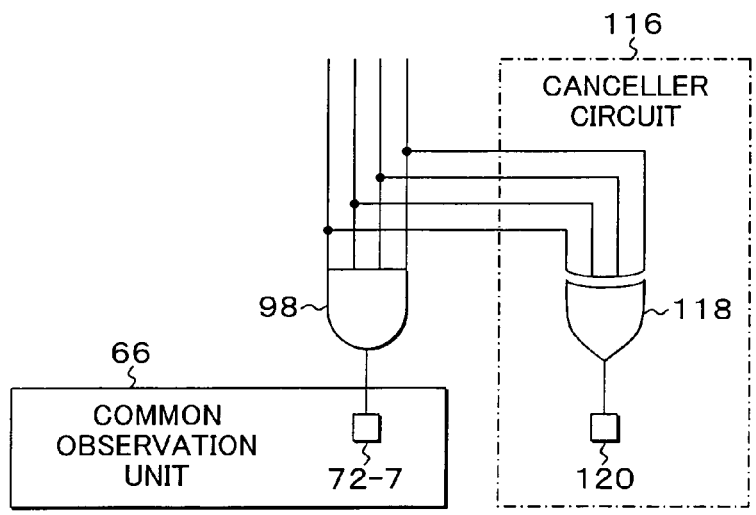

FIG. 16A depicts the circuit part which has the observation exclusiveness in the common observation unit 66-side of FIGS. 12A and 12B. In the case in which the signals from the cores depicted in FIG. 16A are joined at an AND gate 98, which carries out AND operation, when a fault from a certain core is to be observed, the value of the signals from the other cores has to be 1 if the signal value of the core has to be 0, and observation exclusiveness is generated about the observation among the cores. Such observation exclusiveness can be cancelled by providing a canceller circuit 116 depicted in FIG. 16B. In FIG. 16B, an EOR gate 118, which carries out exclusive OR operation as the canceller circuit 116, is provided, the control signals from the cores for the AND gate 98 are input to the EOR gate, and a scan FF 120 is provided at the output of the EOR 118. As a result of providing such canceller circuit 116, the observation signals from the cores, for example, "0111" are assembled by the EOR gate 118, the output thereof is caused to be "1", so that a signal value which indicates a fault(s) from the other core(s) can be observed at the same time by the scan FF 120 regardless of the signal values provided with respect to the AND gate 98. Thus, when the EOR gate 118 is used in the canceller circuit 116, the exclusiveness related to the fault observation among the cores can be eliminated since the EOR 118 can always carry out fault propagation without having a control value.

(9. Sharing of Scan Shift)

When the test pattern diversion with respect to the other cores upon successful ATPG of a certain core is not taken into consideration in the present embodiment, in a scan shift in the multi-core processor, a test pattern has to be shifted independently with respect to the scan FF chains of all the cores;

therefore, the amount of test vectors, which are loaded to a tester and related to the core part, is [test vector of one core]× the number of cores in each of the cases of scan-in and scan-shift. On the other hand, in the present embodiment, since similar vectors are shifted to the cores, compression of test vectors can be realized by the configuration of a scan circuit depicted in FIG. 17. In the scan circuit of FIG. 17, scan chains 120-1, 120-2, 120-3, and 120-4 in the cores are present for the four cores, respectively; selectors 124-1, 124-2, 124-3, and 124-4 are provided in the input side of the scan chains 120-1 to 120-4; a common scan-in terminal 122 is connected to one of the inputs of each of the selectors 124-1 to 124-4; and individual scan-in terminals 126-1 to 126-4 are connected to the other input terminals thereof, respectively. The selectors 124-1 to 124-4 are configured to select the inputs of the common scan-in terminal 122 in the present embodiment by a select signal with respect to a common operation switching terminal 128. On the other hand, individual scan-out terminals 134-1 to 134-4 are provided at the outputs of the scan chains 120-1 to 12-4; and, in addition to them, the scan outputs are joined to an EOR 130 so as to carry out observation by using a common scan-out terminal 132. Furthermore, in addition to the circuit configuration of the scan chain 120-1 to 120-4-side, a canceller scan chain 134 is independently provided, and a scan-in terminal 136 and a scan-out terminal 138 are provided. In the original scan circuit of the scan chains 120-1 to 120-4-side, upon scan-in, the selectors 124-1 to 124-4 are switched to the inputs of the common scan-in terminal 122 by the select signal of the common operation switching terminal 128, and a test vector is loaded parallel to the scan chains 120-1 to 120-4 by using the common scan-in terminal 122. Also, upon scan-out, the scan chains 120-1 to 120-4 are joined by the EOR gate 130, output to the common scan-out terminal 132, and subjected to observation. As a result, the amount of the test vectors related to the core part can be changed to

[test vector of one core]

of each of the cases of scan-in and scan-out, and the previous test vector amount of the case which is not according to the present embodiment can be compressed to (1/number of cores).

Figure 17:
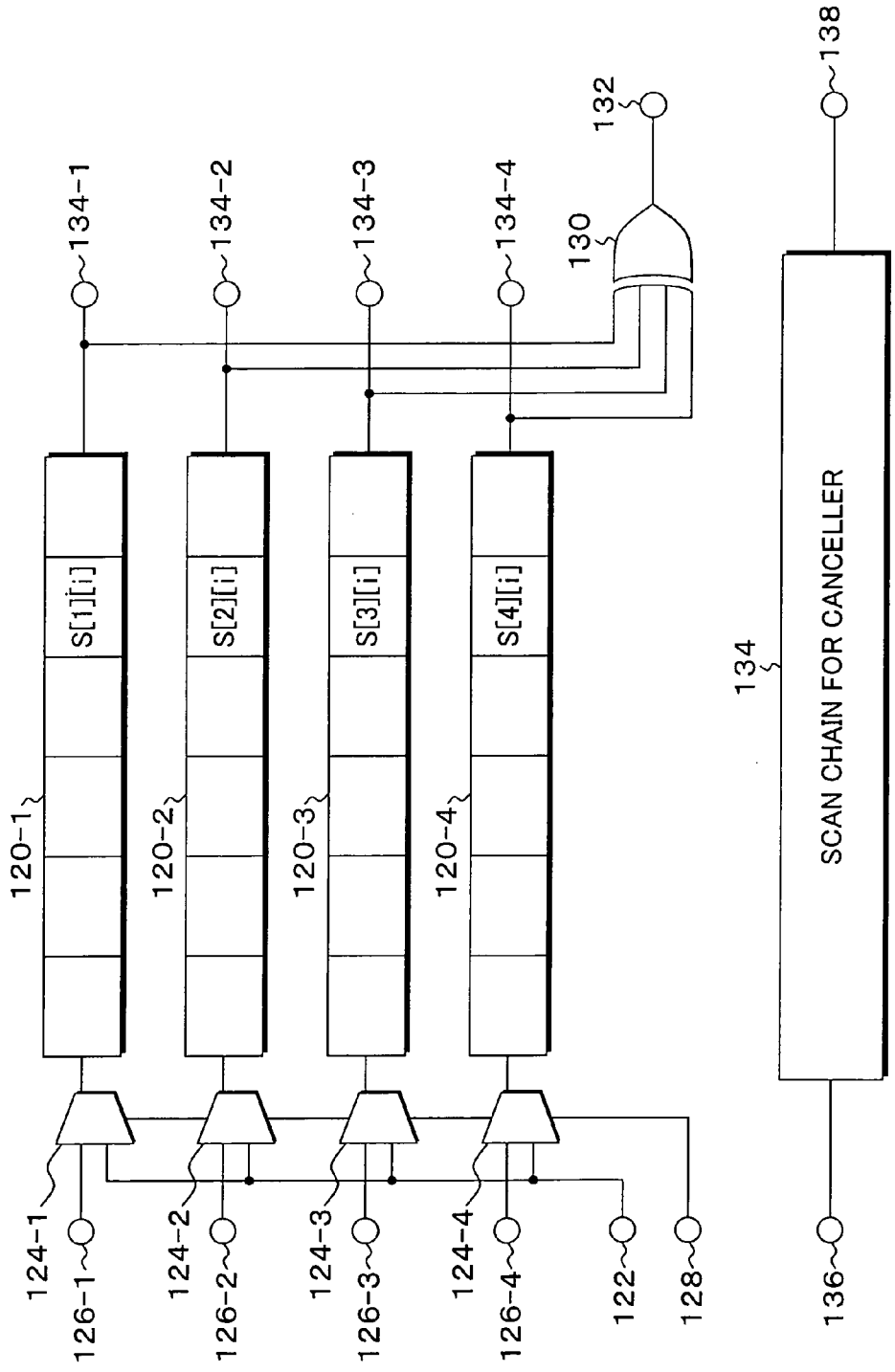
FIG. 17 is block diagrams depicting a circuit in which a scan shift of scan FF chains of the cores in the present embodiment is shared.
Figure 18A:
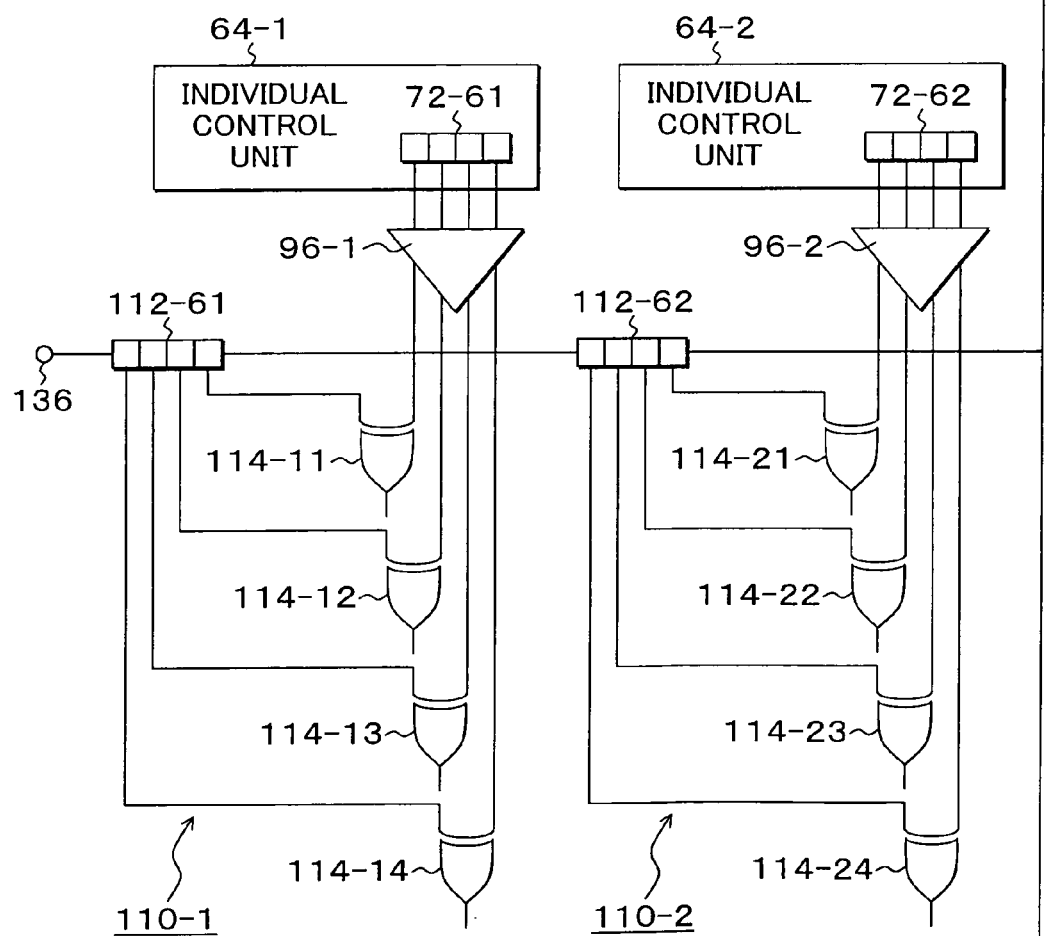
FIGS. 18A and 18B are explanatory diagrams depicting details of a canceller scan FF chain provided in FIG. 17.
Figure 18B:
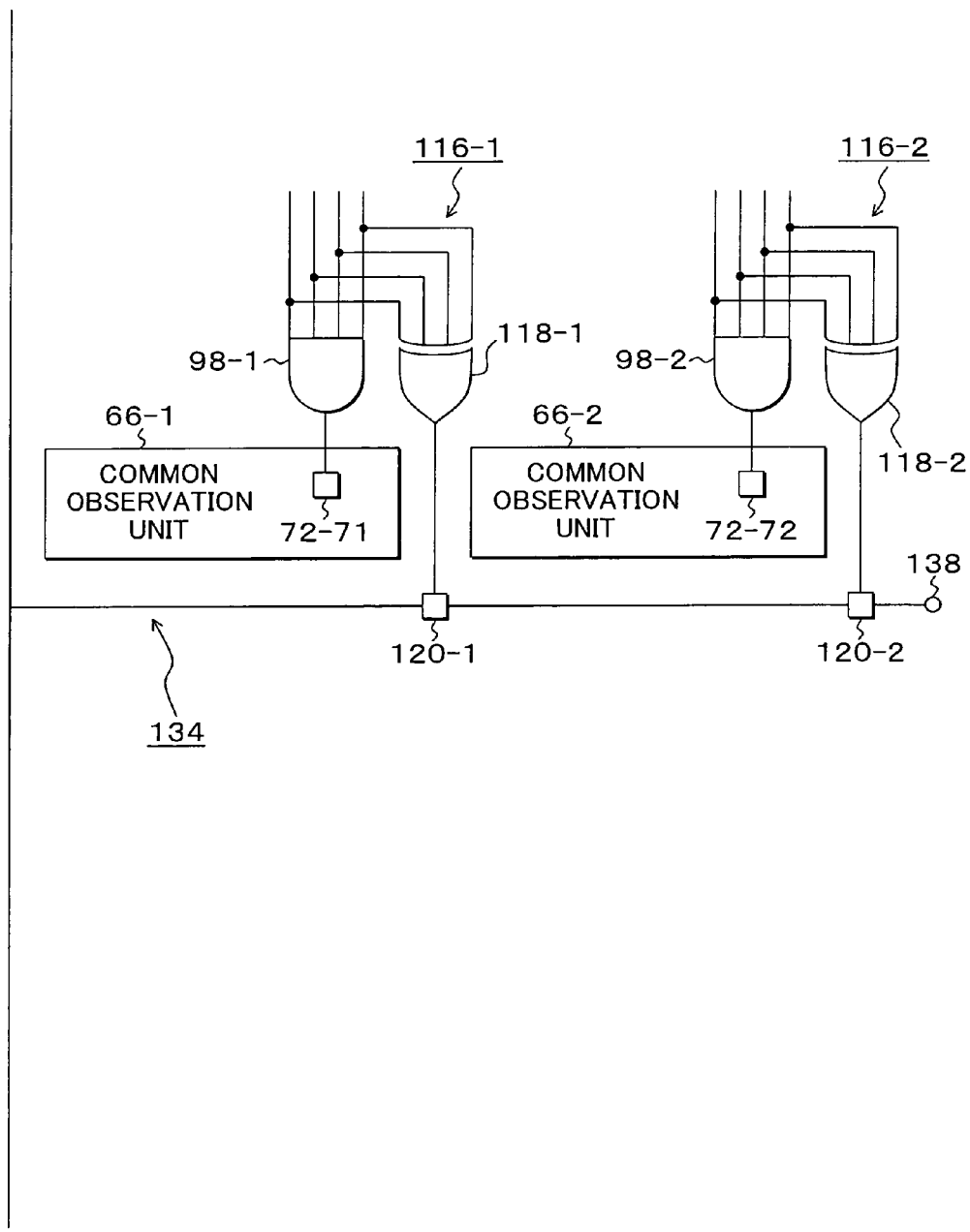

FIGS. 18A and 18B are explanatory diagrams depicting details of the canceller scan chain 134 provided in FIG. 17. In FIGS. 18A and 18B, a circuit configuration in which two individual control units 64-1 and 64-2 and common observation units 66-1 and 66-2 are provided in a multi-core processor is taken as an example. Canceller circuits 110-1 and 110-2 same as that depicted in FIG. 15B are provided for the common control units 64-1 and 64-2, respectively. Also, canceller circuits 116-1 and 116-2 same as that depicted in FIG. 16B are provided for the common observation units 66-1 and 66-2, respectively. When scan FFs 112-61 and 112-62 in the respective canceller circuits 110-1 and 110-2 and scan FFs 120-1 and 120-2 in the scan circuits 116-1 and 116-2 serve as one independent scan chain, individual control and fault observation cancelling the exclusiveness among the cores can be realized.

(10. Test Pattern Generating Process)

Figure 19:
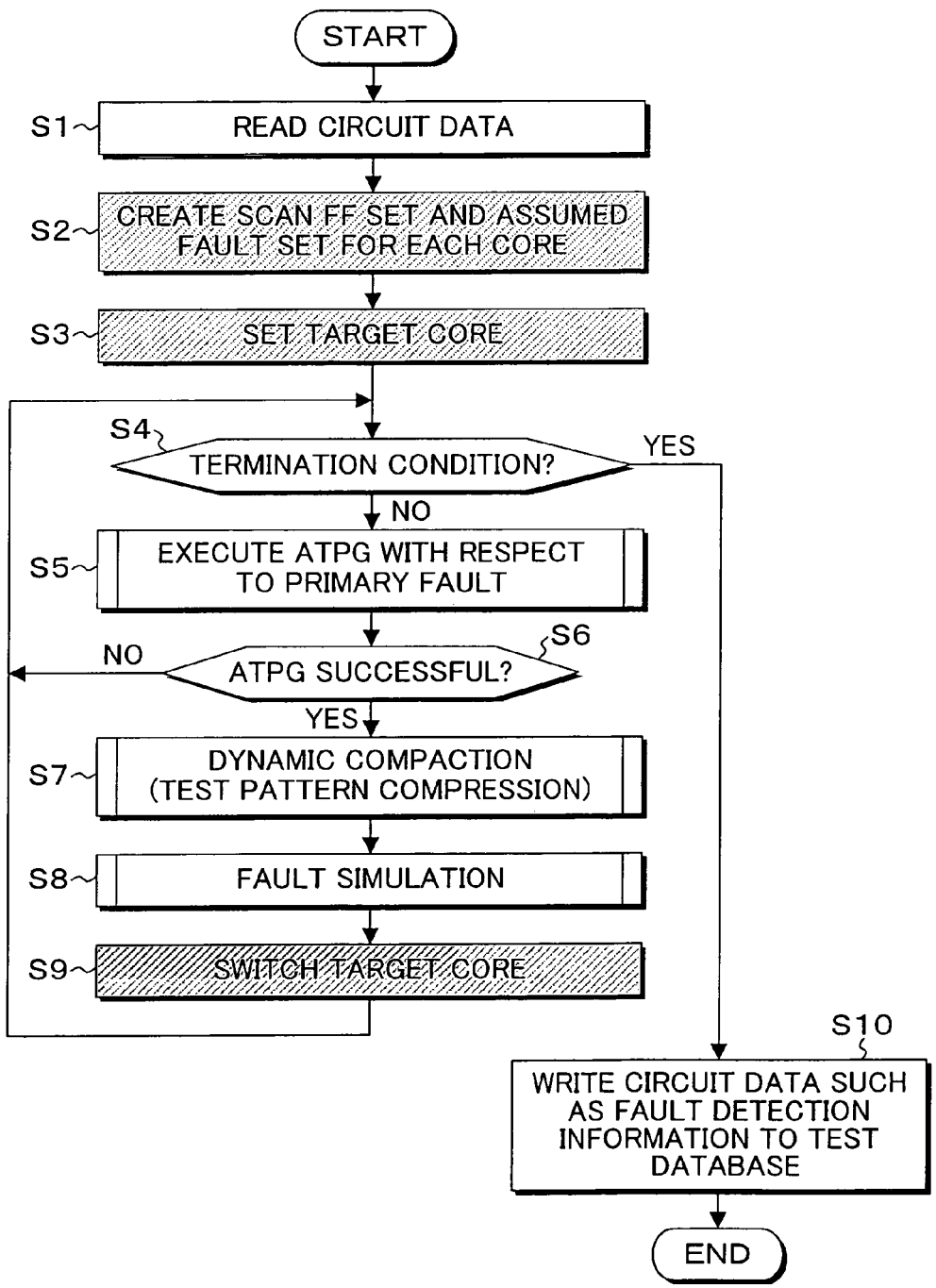
FIG. 19 is a flow chart depicting a procedure of a test pattern generating process of the present embodiment.

FIG. 19 is a flow chart depicting the procedure of the test pattern generating process of the present embodiment and will be explained as below with reference to FIG. 1.

In FIG. 19, first, in step S1, the circuit information reading unit 10 reads the circuit data 14 from the test database 12. Next, in step S2, the scan chain set creating unit 18 and the assumed fault set creating unit 22 create the scan chain set 20 and the assumed fault set 24 of each core as an initialization procedure. Next, in step S3, setting of a target core is carried out. For example, when the circuit data read in step S1 is the circuit data of the multi processor 46 of FIGS. 6A and 6B, for example, the core 50-1 is selected as the target core, and the remaining cores 50-2 to 50-4 are configured to be non-target cores. The selection of the target core is specifically carried out by setting of the atpg target flags 85 and the skip flags 87 provided in the fault tables 84 of the respective cores provided in the fault data 82 depicted in FIG. 8.

FIG. 20 is depicting the set state of the atpg flags and the skip flags of the assumed fault sets of the cores of the case in which the core 50-1 is set as the target core. When the core 50-1 is selected as the target core, the atpg flag thereof is turned on, and the skip flag thereof is turned off. On the other hand, regarding the cores 50-2, 50-3, and 50-4 which are non-target cores, the atpg flags are set to be off, and the skip flags are set to be on. Referring again to FIG. 19, the loop process of steps S5 to S9 is repeated until predetermined termination conditions are determined in step S4. The termination conditions to be determined in step S4 include the following.

(1) Whether execution exceeding an upper limit of specified execution time is carried out or not.

(2) Whether the test pattern generation exceeding a specified upper limit of the number of test patterns is carried out or not.

(3) A fault detection rate exceeding a specified upper limit of fault detection rate is obtained or not.

(4) Whether an unsubmitted fault is present or not.

Subsequently, in step S5, ATPG with respect to a primary fault is executed. Specifically, one unsubmitted fault is arbitrarily selected as the primary fault from the assumed fault set of the core 50-1, which is selected as the target core, and a test pattern is generated by ATPG. Subsequently, in step S6, whether the ATPG with respect to the primary fault has been succeeded or not is checked; and, if succeeded, the process proceeds to step S7, wherein dynamic compaction is executed by the dynamic compaction executing unit 32. Details of the dynamic compaction will be elucidated in later explanations. When a test pattern is generated by the dynamic compaction, subsequently in step S8, fault detection and saving of the test pattern 16 with respect to the test database 12 is carried out by the circuit fault detecting unit 34 by a fault simulation using the generated test pattern. Subsequently, in step S9, a process of switching the target core is carried out for suppressing variations in the fault detection rates among the cores. In the process of switching the target core, regarding the atpg target flag 85 and the skip flag 87 depicted in FIG. 8, for example when the target core is to be switched from the core 50-1 to the core 50-2, the atpg flag of the previously selected core 50-1 is switched from on to off, and the skip flag thereof is switched from off to on; at the same time, the atpg flag of the core 50-2 which is to serve as a next target is switched from previous off to on, and the skip flag thereof is switched from previous on to off. When any of the termination conditions depicted in above described (1) to (4) is determined in step S4, the process proceeds to step S10, wherein the circuit data 14 such as fault detection information is written to the test database 12, and the series of processes is terminated.

(11. ATPG Process)

Figure 21A:
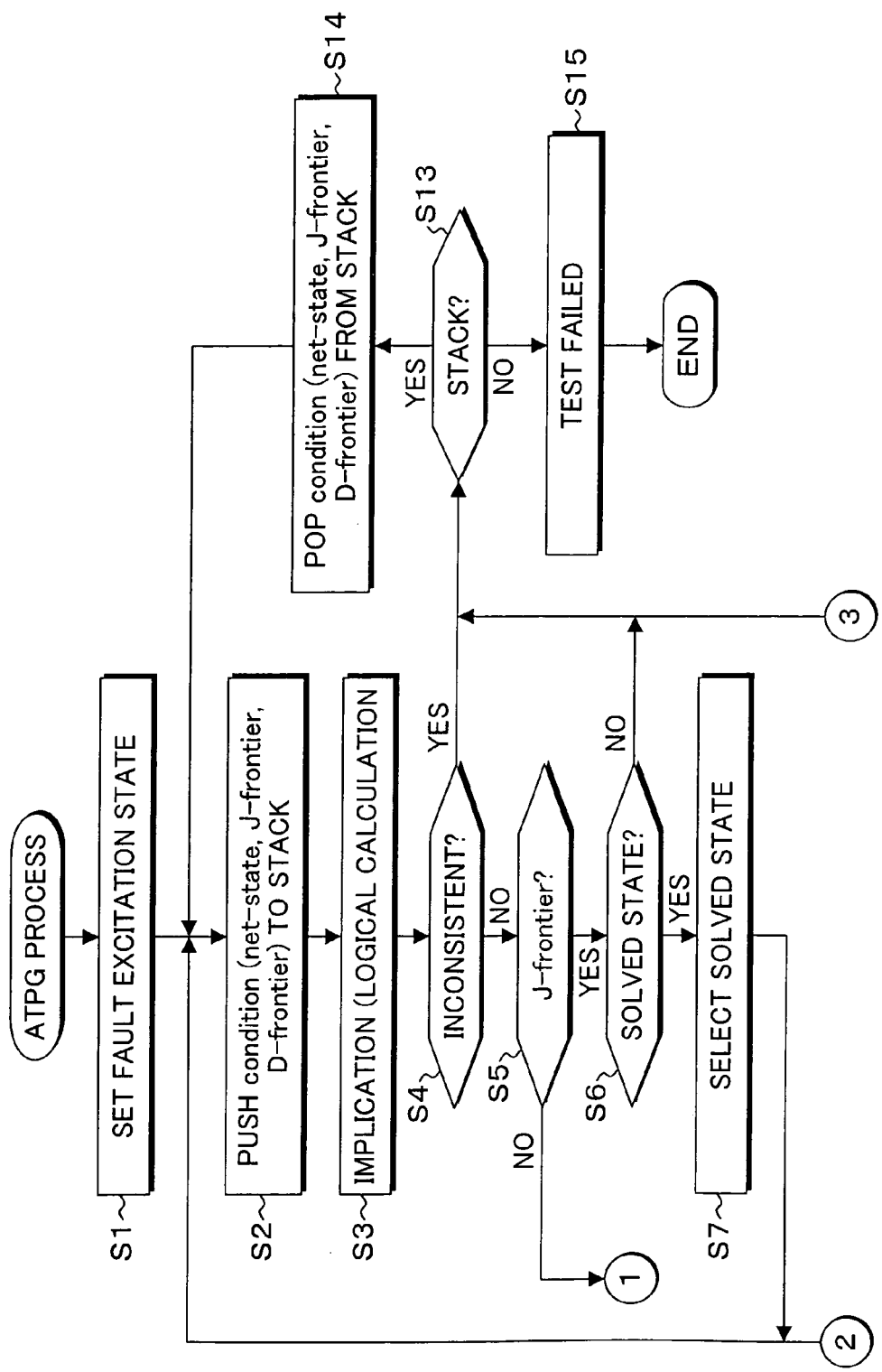
FIGS. 21A and 21B are flow charts depicting details of an ATPG process in step S5 of FIG. 19.
Figure 21B:
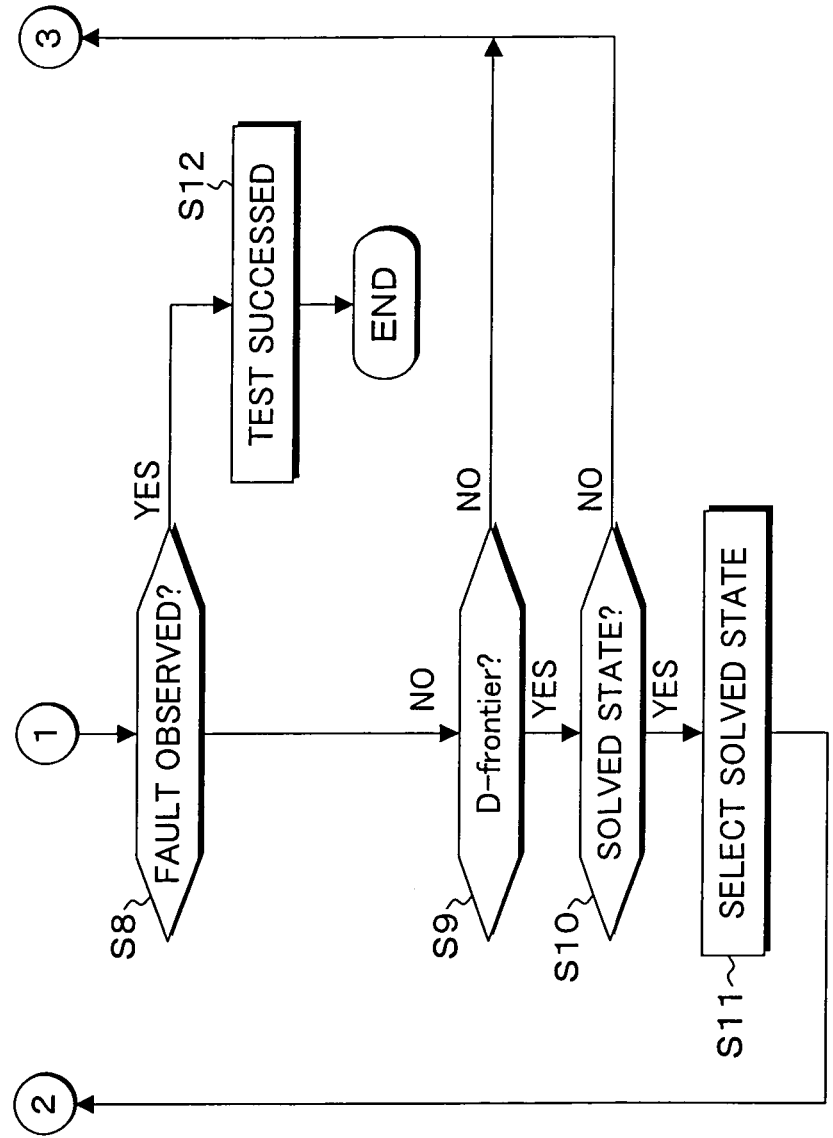

FIGS. 21A and 21B are flow charts depicting details of the ATPG process in step S5 of FIG. 19.

In FIGS. 21A and 21B, a fault activation state is set in step S1 in the ATPG process. The setting of the fault activation state is a process in which a specified fault sets activation states of a normal value and a fault value with respect to an assumed net. Next, an implication process is executed by the processes of steps S2, S3, and S4. The implication process is logical verification of [if . . . , then . . . ]. For example, an and gate which has A and B as inputs and outputs C is taken as an example, the implication thereof is as described below. [if C=and(A,B), then A=0 or B=0→C=0 or C=1→A=1, B=1] In such and gate, if A=0 or B=0 and C=1, it is inconsistent. This implication process is specifically provided in backtracking in step S2, wherein
condition(net-state, J/D-frontier)
is pushed to a stack. Next, in step S3, logical verification is carried out to check whether there is a gate which can be subjected to implication until inconsistency occurs. When inconsistency is determined in step S4, the process proceeds to step S13, wherein, if there is a stack, the stack content thereof is topped in step S14, and the process from step S2 is repeated again. As a result, a process of updating J-frontier and D-frontier, which are generated or vanish in the logical verification, is executed. Subsequently, when there is no inconsistency as a result of the implication of step S4, the process proceeds to processing of J-frontier of steps S5, S6, and S7. Specifically, when an unsolved gate is determined to be J-frontier in step S5, and the presence/absence of a solved state is checked in step S6. If there is the solved state, the solved state is selected in step S7. Herein, J-frontier is a gate which has a state only for the output generated in implication and has unset inputs since implication cannot be carried out. For example, it is the gate which enables C=0 and A=B=X (indefinite value) if C=and(A,B). In ATPG, all possible selections are tried with respect to J-frontier. For example, in the case of an and gate, A=0 is selected, and, if inconsistency occurs in the selection of A=0, B=0 is selected. Meanwhile, if there is no unsolved J-frontier in step S5, the process proceeds to step S8, wherein fault observation is checked. If there is no fault observation, a process of D-frontier is executed by the processes of steps S9, S10, and 11. More specifically, D-frontier, which is an unsolved gate, is determined in step S9. If there is a solved state thereof in step S10, the solved state is selected in step S11. Herein, D-frontier is a gate which has a D value (normal value/fault value) at either one that is generated by implication, wherein the D value is not propagated to an output. For example, when an AND gate is taken as an example, in the case of C=and (A, B) which is a result of carrying out an AND operation with respect to A and B, this is a gate in which D(1/0) is propagated only to B, and A is an indefinite value (x/x), thus x/0=and(x/x,1/0). In ATPG, with respect to D-frontier, a selection for propagating the D value, which is propagated to the input, to the output is carried out; and, for example with respect to the AND gate, A=1/x is selected. When fault observation is obtained in step S8 through repetition of these processes, the process proceeds to step S12, wherein test success is determined, and the series of ATPG processes is terminated. Meanwhile, if inconsistency is determined in step S4 and there is no stack in step S13, the ATPG process is terminated as test failure in step S15.

(12. Dynamic Compaction)

Figure 22:
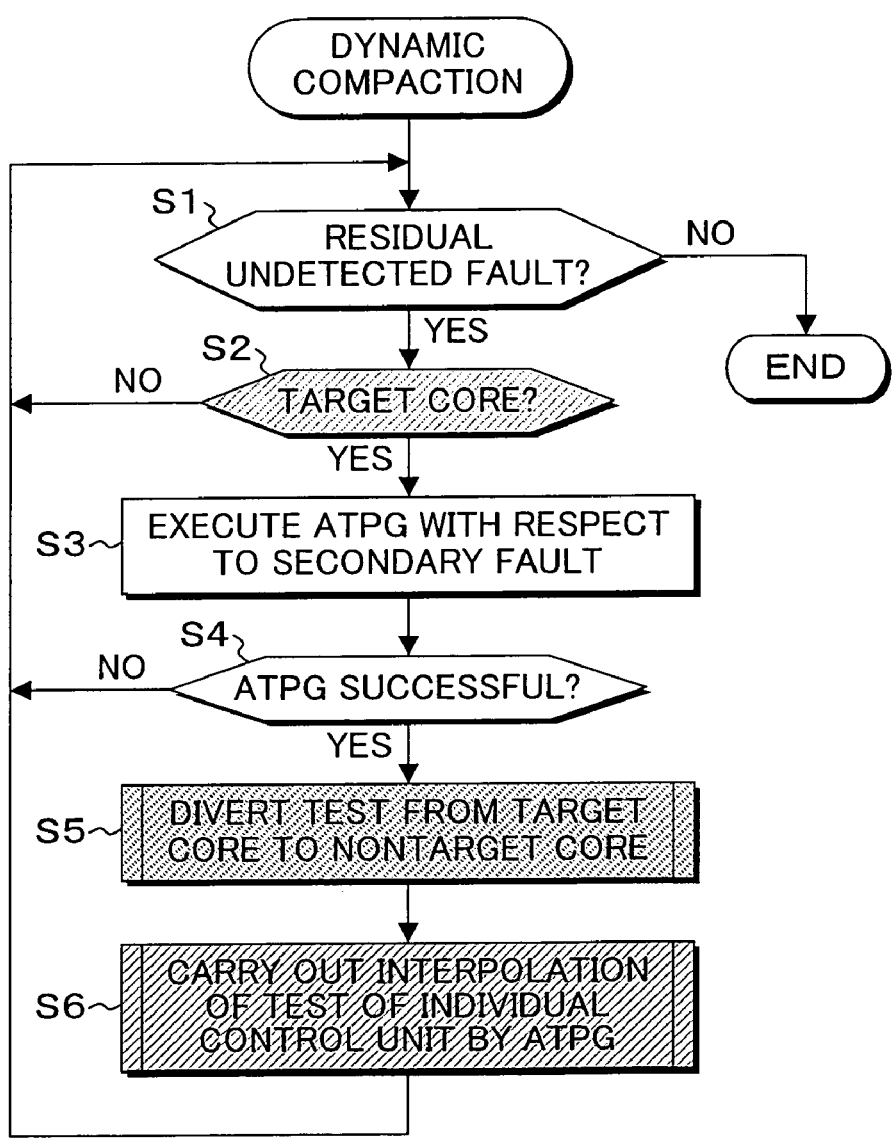
FIG. 22 is a flow chart depicting details of dynamic compaction in step S7 of FIG. 19.

FIG. 22 is a flow chart depicting details of the dynamic compaction in step S7 of FIG. 19. In FIG. 22, the dynamic compaction checks whether there is a residual undetected fault or not in step S1 as a termination condition. If there is the residual undetected fault, the process proceeds to step S2, wherein whether it is the target core or not is determined. In the determination of the target core, the atpg flag and the skip flag depicted in FIG. 20 are referenced. In this case, the core 50-1 for which the atpg flag is on and the skip flag is off is selected as the target core, and ATPG execution with respect to the assumed fault sets of the other cores 50-2 to 50-4, for which the atpg flags are off and the skip flags are on, is skipped. Next, in step S3, one undetected fault is arbitrarily selected as a secondary fault from the assumed fault set of the selected target core 50-1, and ATPG is executed for the selected secondary fault. The details of the ATPG are the same as those depicted in the flow chart of FIGS. 21A and 21B. Subsequently, success/failure of the ATPG is checked in step S4, and, in the case of success, the process proceeds to step S5, wherein a test pattern diverting process from the target core to the non-target cores is executed. Subsequently, in step S6, an interpolation process of interpolating the test patterns of the individual control units is executed by ATPG.

(13. Test Pattern Diverting Process and Interpolation Process)

Figure 23:
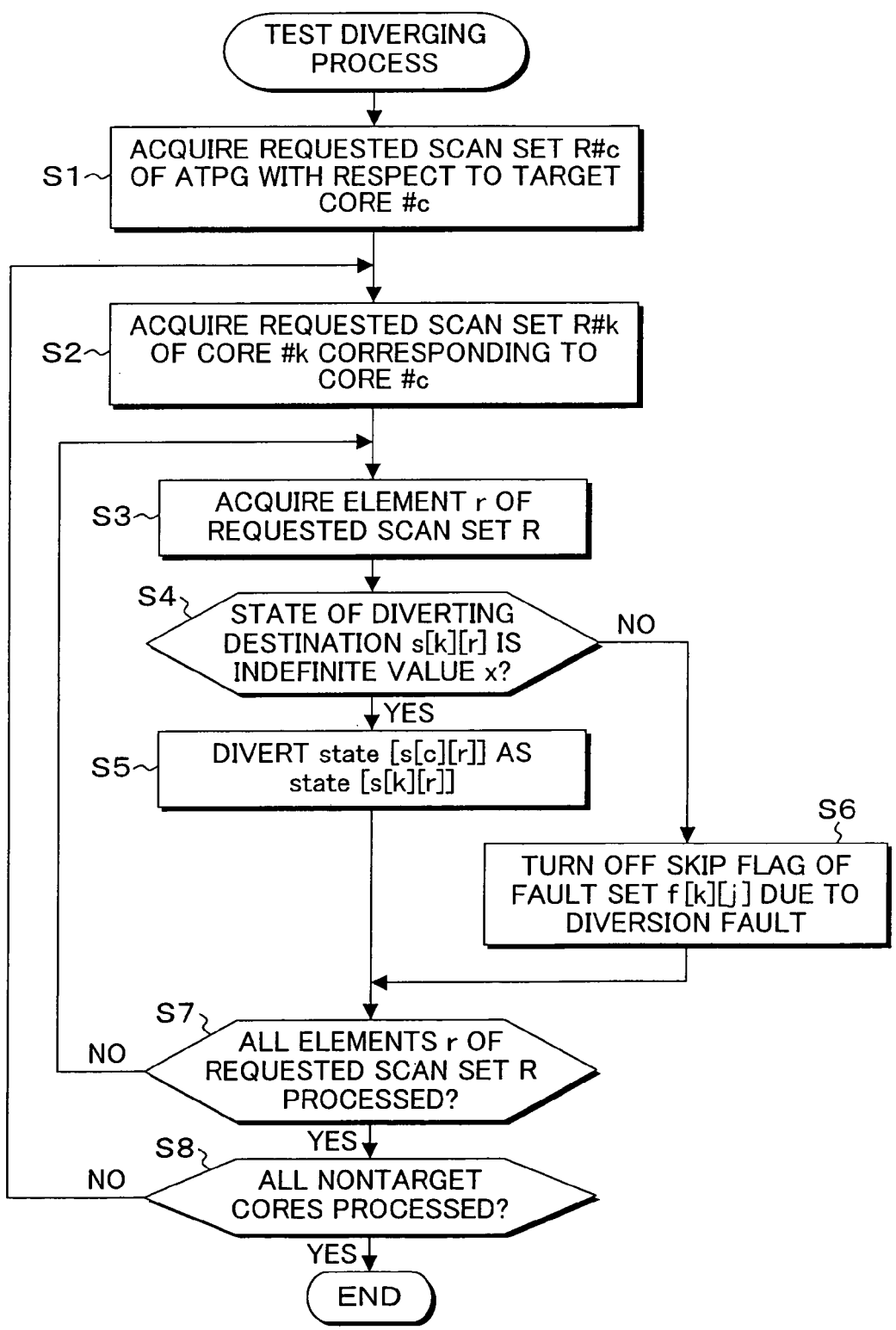
FIG. 23 is a flow chart depicting details of a test diverting process in step S5 of FIG. 22.

FIG. 23 is a flow chart depicting details of the test pattern diverting process in step S5 of FIG. 22. In FIG. 23, in the test pattern diverting process, a request scan set R#c of ATPG with respect to the target core #c is acquired in step S1.

Figure 24A:
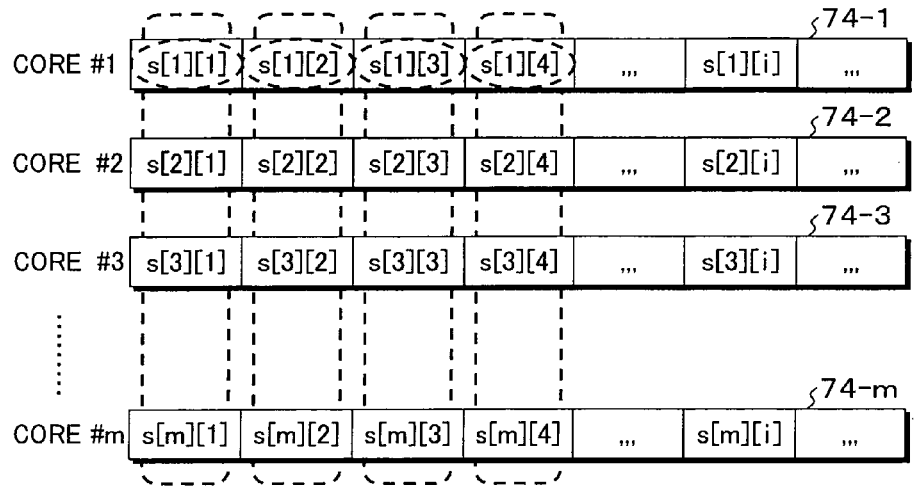
FIGS. 24A to 24D are explanatory diagrams specifically depicting the test diverting process in terms of scan ff sets of FIG. 23.
Figure 24B:
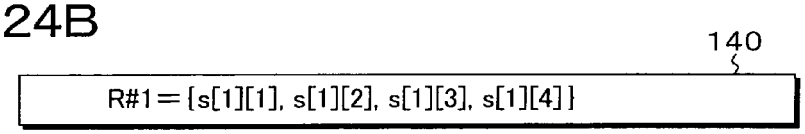
Figure 24C:
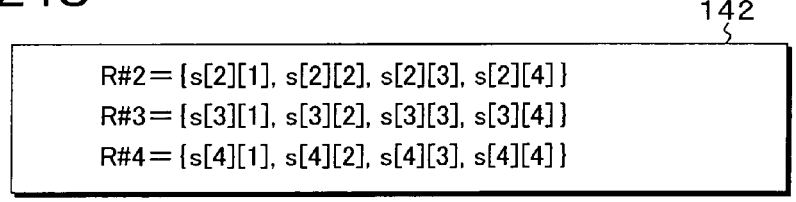
Figure 24D:
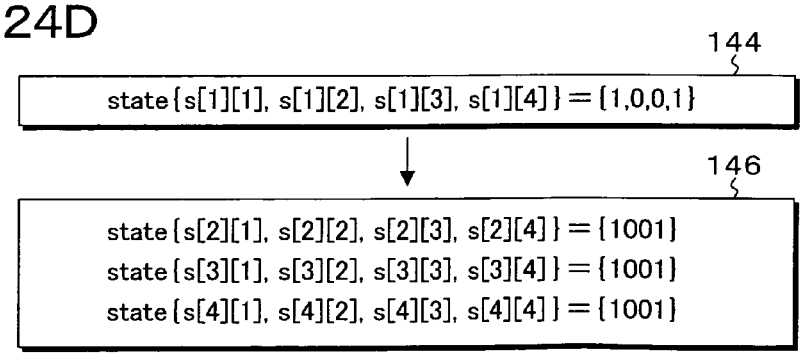

FIG. 24A depicts the scan chain sets 74-1 to 74-m with respect to the cores 50-1 to 50-m. In step S1, a request chain set 140 is acquired as the request scan set R#c of ATPG with respect to, for example, the target core 50-1, for example when m depicted in FIG. 24B is equal to 4. Subsequently, in step S2, request scan chain sets R#k of the non-target cores #k corresponding to the target core #c are acquired. Herein, the non-target cores #k are, for example, the cores 50-2 to 50-3 and 50-4; therefore, a request chain set 142 of the non-target cores as depicted in FIG. 24C is acquired from the scan chain sets 74-2, 74-3, and 74-4 (not depicted) of FIG. 24A. Next, in step S3, an element r (r=1 to 4) of the request scan chain set R is acquired. In step S4, whether the state of state[s[k][r]] of a scan FF of a diverting destination is an indefinite value x or not is determined. If it is an indefinite value x, in step S5, state[s[c][r]] of the diverting origin is diverted as state[s[k][r]] of the diverting destination. Specifically, as depicted in FIG. 24D, the state 144 of the diverting origin obtained by successful ATPG of the target core 50-1 is diverted to the state 146 of the diverting destinations in the other cores 50-3 to 50-4 serving as diverting destinations. Meanwhile, if state[s][k][r] of the diverting destination is not an indefinite value x in step S4, the skip flag of the fault set f[k][j] of the diverting destination, which has been on, is turned off due to the diversion fault in step S6, thereby enabling execution of ATPG therefor. Subsequently, the process from step 3 is repeated until all the elements r of the request scan set R are processed in step S7. When processing of all the elements r is finished, the process from step S2 is repeated until processing of all the non-target cores is finished in step S8. When processing of all the non-target cores is finished, the series of processes is finished.

Figure 25:
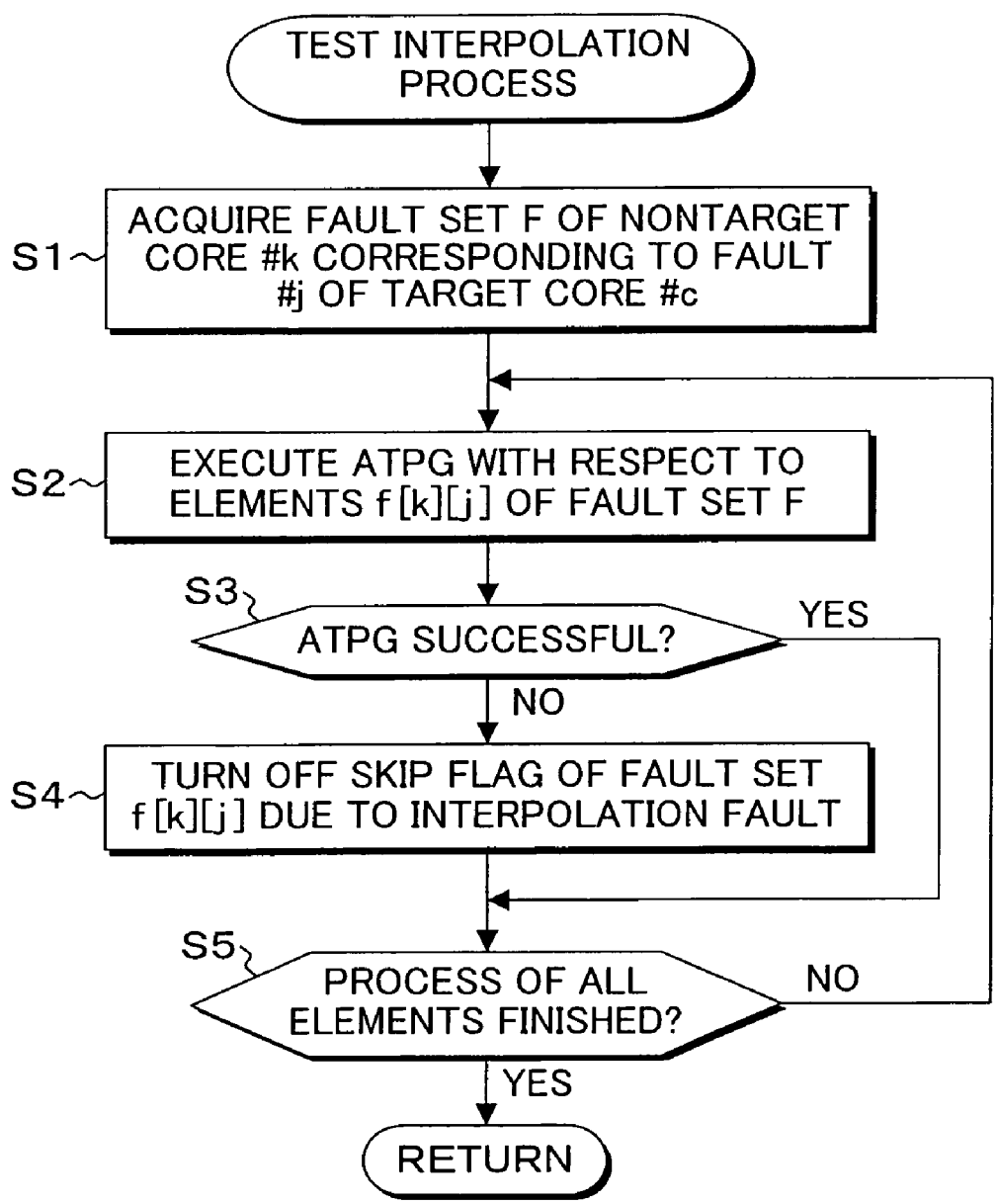
FIG. 25 is a flow chart depicting details of a test interpolation process in step S6 of FIG. 22.

FIG. 25 is a flow chart depicting details of the test pattern interpolation process in step S6 of FIG. 22. In FIG. 25, the test pattern interpolation process is a process for suppressing incompletion of the test pattern generating process of the individual control unit 64 depicted in FIGS. 6A and 6B. In FIG. 25, in the test pattern interpolation process, in step S1, a fault set F of the non-target core #k corresponding to a fault #j of a target core #c is acquired. For example, in the case of FIGS. 10A and 10B, the core 50-1 serves as the target core #c, and the fault set F={f[2][j], f[3][j], . . . , f[m][j]}, wherein j is number of assumed faults in the core, corresponding to the fault f[1][j] of the target core, is acquired. Subsequently, in step S2, ATPG is executed for an element f[k][j] of the fault set F. Subsequently, in step S3, when success of the ATPG is determined, the process from step S2 is repeated until it is determined in step S5 that processing of all the elements is finished. When ATPG fails in step S3, exclusiveness, i.e., simultaneous detection impossibility exists between the secondary fault of the target core 50-1 and the fault set of the other cores 50-2, 50-3, and 50-4. Therefore, the skip flag of the fault set f[k][j] is turned off in step S4, and, in the processes thereafter, ATPG about this fault will be executed without being skipped.

(14. Fault Simulation)

Figure 26:
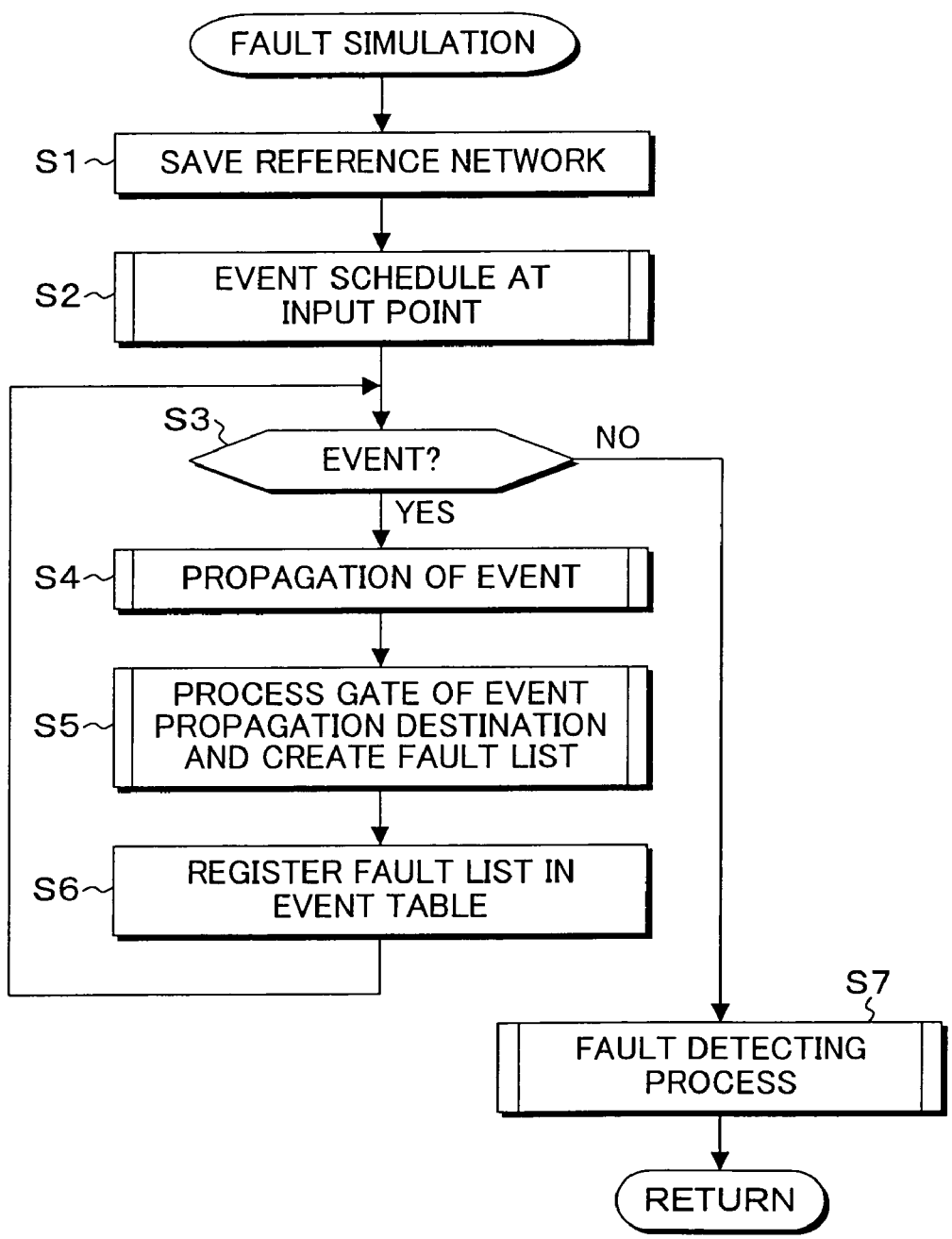
FIG. 26 is a flow chart depicting details of a fault simulation in step S8 of FIG. 19.

FIG. 26 is a flow chart depicting details of the fault simulation in step S8 of FIG. 19, wherein an event-driven type simulation is taken as an example. In the fault simulation of FIG. 26, first, in step S1, a reference network is saved on the condition of delay functions. Subsequently, in step S2, event scheduling at an input point(s) is carried out. Next, when it is determined in step S3 that there is an event(s), propagation of the events is carried out in step S4. Then, the gates of event propagation destinations are processed so as to create a fault list in step S5, and the fault list is registered in an event table in step S6. Such processes of steps S4 to S6 are repeated until there is no event in step S3. When there is no event, a fault detecting process is executed in step S7.

Figure 27:
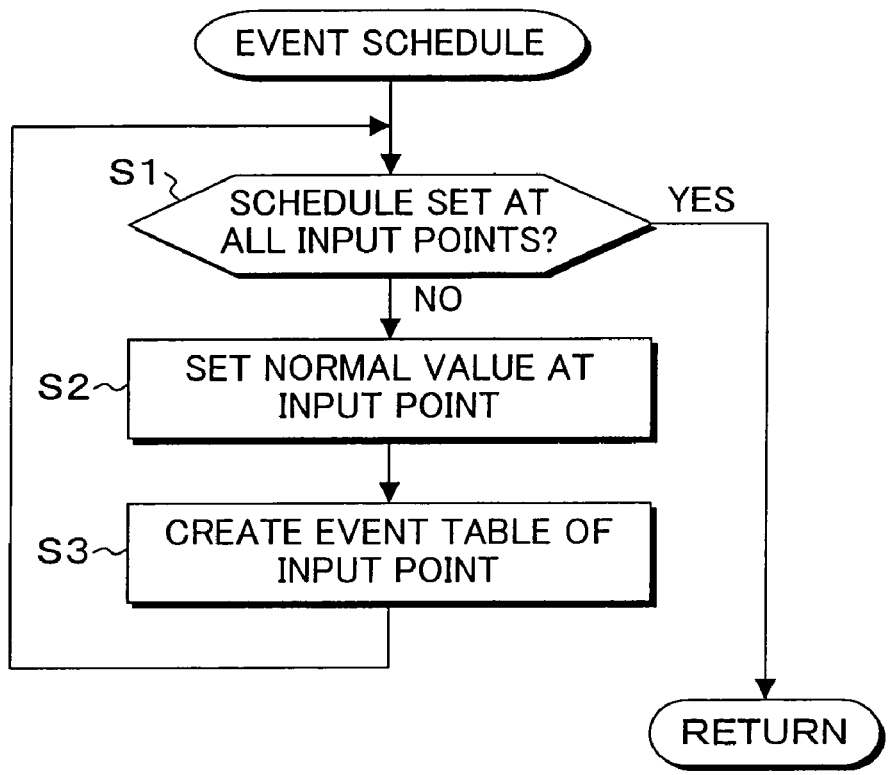
FIG. 27 is a flow chart depicting details of the event scheduling in step S2 of FIG. 26.

FIG. 27 is a flow chart depicting details of the event scheduling in step S2 of FIG. 26. In the event scheduling of FIG. 27, whether scheduling at all the input points has been finished or not is checked in step S1; if the scheduling has not finished, normal values with respect to the input points are set in step S2; an event table of the input points is created in step S3; and, these processes are repeated until scheduling with respect to all the input points is completed.

Figure 28:
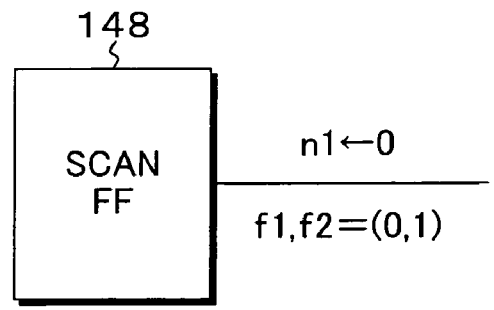
FIG. 28 is an explanatory diagram depicting a specific example of the event scheduling of FIG. 27.

FIG. 28 is an explanatory diagram depicting the operation of creating the event table in step S3 of FIG. 27. In the operation of creating the event table, a fault(s) of which normal value and fault value are mutually different is registered in an event table by using

[schedule net, [fault id, fault value]]

as a fault list. For example, when a scan FF 148 of FIG. 28 is taken as an example,

[n1, (f2, 1)]

is registered in the event table as the fault list when 0 is scheduled as a normal value in the case in which faults (f1, f2) having values (0, 1), respectively, are assumed at a Q output n1 thereof.

Figure 29:
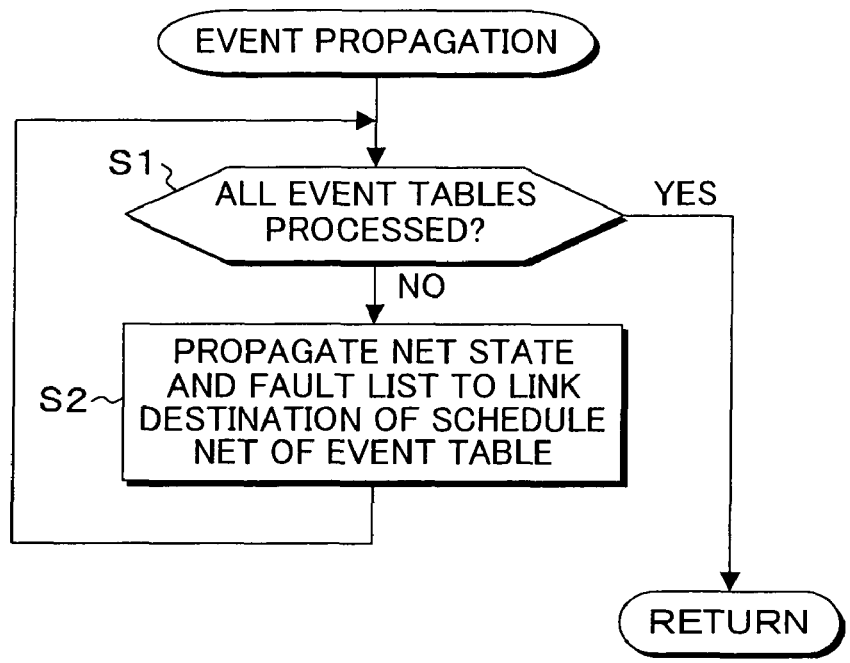
FIG. 29 is a flow chart depicting details of event propagation in step S4 of FIG. 26.

FIG. 29 is a flow chart depicting details of the event propagation in step S4 of FIG. 26. In the event propagation, the process of step S2 is repeated until processing of all the event tables is finished in step S1. In step S2, a net state and the fault list are propagated to the link destinations of the schedule net of the event table.

Figure 30:
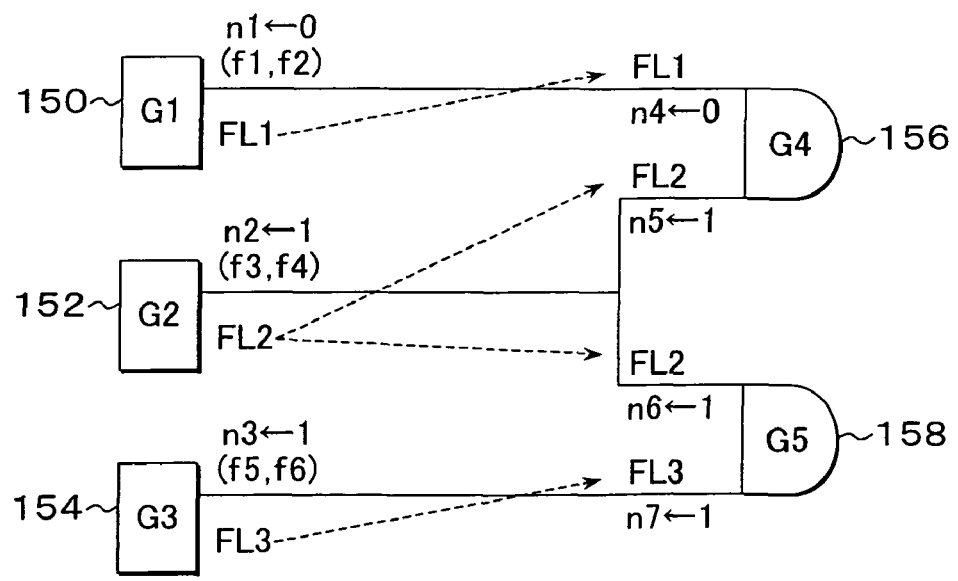
FIG. 30 is an explanatory diagram depicting a specific example of the event propagation of FIG. 29.

FIG. 30 is an explanatory diagram depicting a specific example of the event propagation of FIG. 29. In FIG. 30, fault lists FL1: (n1,(f2, 1))
FL2: (n2,(f3, 0))
FL3: (n3,(f5,0))

are registered in the event table by scheduling of normal values (0, 1) with respect to input points n1, n2, and n3 of gates 150, 152, and 154 represented by G1 to G3. The fault lists registered in the event table is propagated as the net states (0, 1, 1) and the fault lists (FL1, FL2, and FL3) to and gates 156 and 158, which are serving as the link destinations of the schedule net.

Figure 31A:
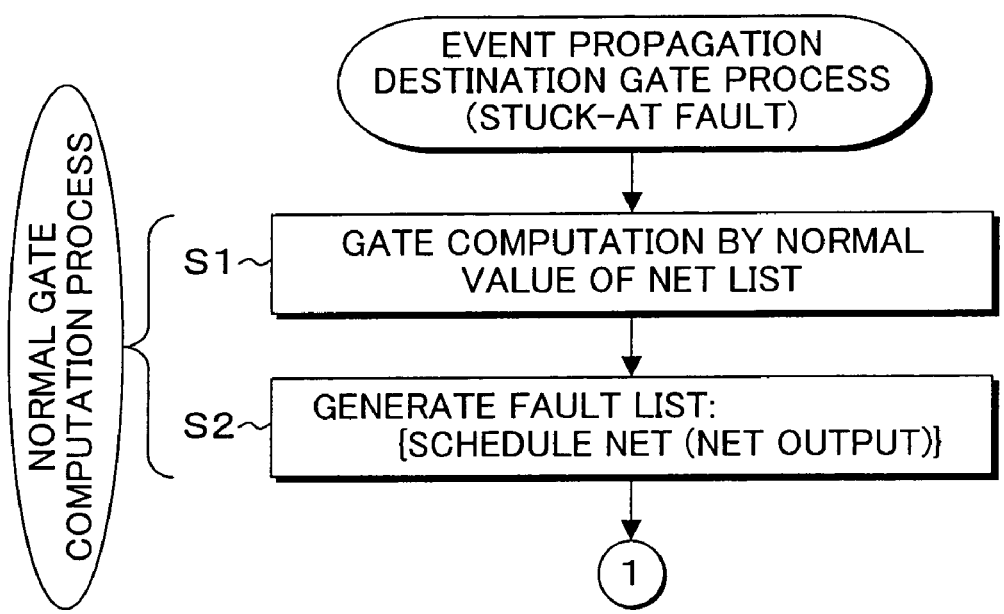
FIGS. 31A and 31B are flow charts depicting details of an event propagation destination gate process in step S5 of FIG. 26, wherein stuck-at faults serve as targets.
Figure 31B:
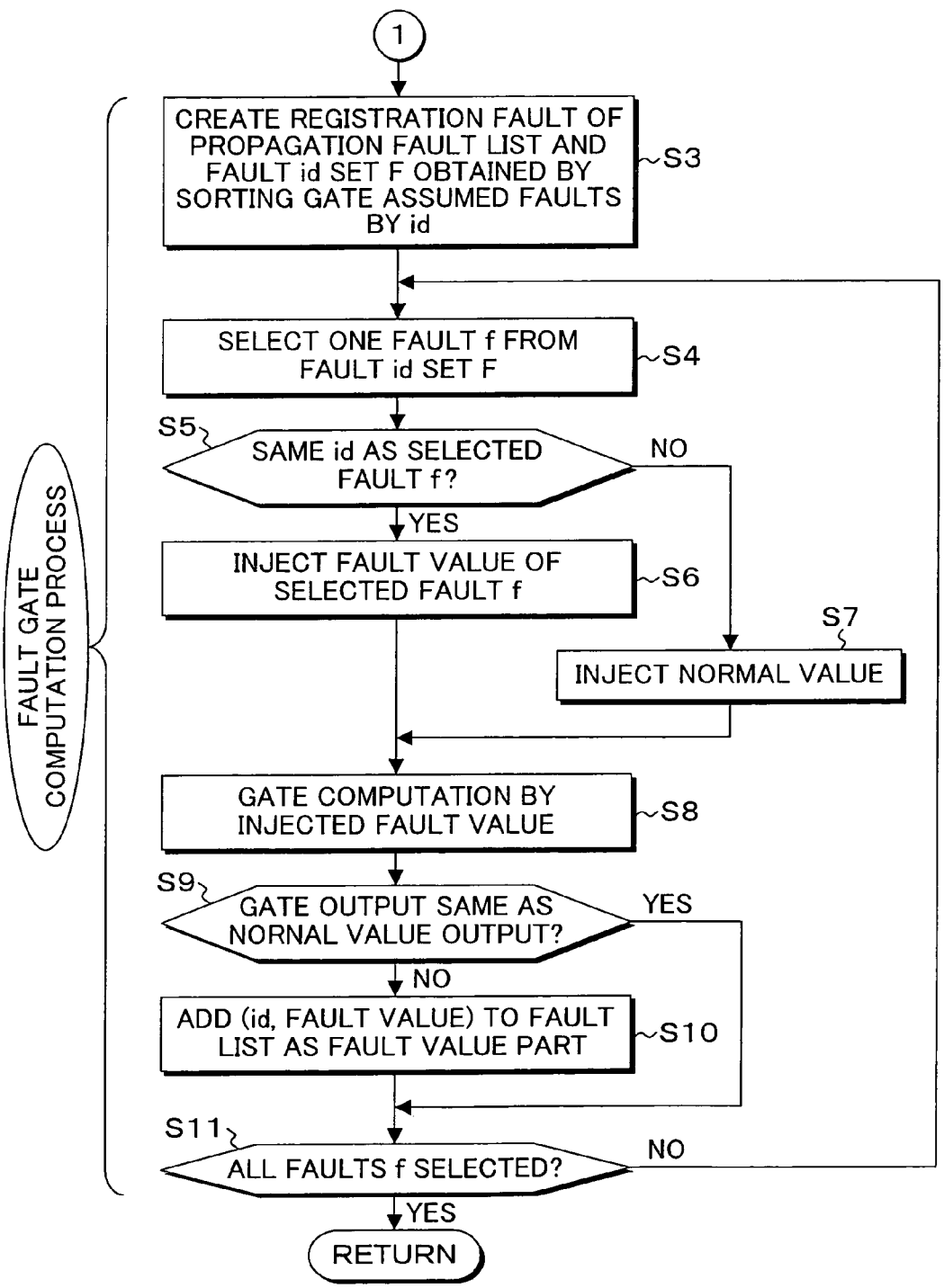

FIGS. 31A and 31B are flow charts depicting details of the event propagation destination gate process in step S5 of FIG. 26, wherein stuck-at faults are serving as targets. Steps S1 to S2 are computation processes of a normal gate, and steps S3 to S11 are computation processes of a fault gate. First, in the normal gate computation process, a gate computation is executed by a normal value of a net list in step S1, and [schedule net (net output)]

is generated as a fault list in step S2. In the fault gate computation process, first, in step S3, a fault id set F, wherein the registered faults and the gate assumed faults of the propagation fault lists are sorted by id, is created. Subsequently, one fault f is selected from the fault id set F in step S4. When the selected fault is a fault having the same id as the fault f in step S5, the process proceeds to step S6, wherein the fault value same as the selected fault f is injected. When it is the fault id different from the selected fault f in step S5, a normal value is injected in step S7. Subsequently, the process proceeds to step S8, wherein a gate computation is executed according to the injected fault value. Subsequently, whether the gate output is same as the normal value or not is checked in step S9. If it is different from the normal value output, (id, fault value) is added to the fault list as a fault value part in step S10. Subsequently, the processes from step S4 are repeated until all faults f are selected in step S11.

Figure 32:
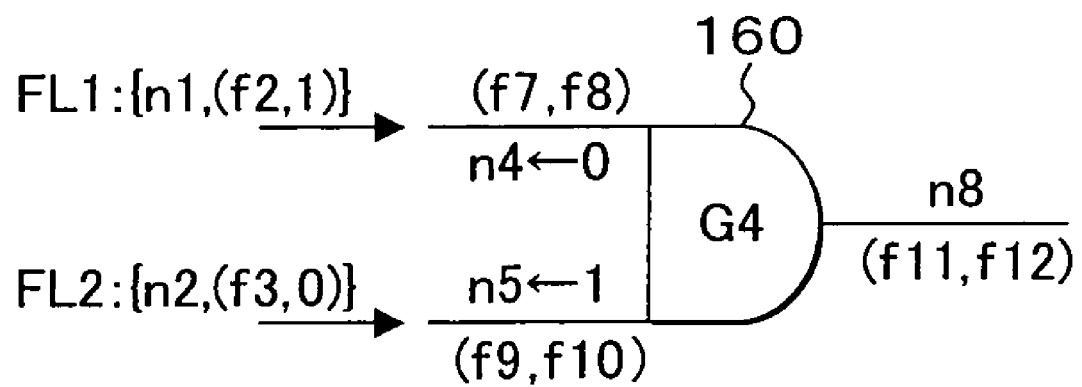
FIG. 32 is an explanatory diagram depicting a specific example of the event propagation destination gate process of FIGS. 31A and 31B.

FIG. 32 is an explanatory diagram depicting a specific example of the event propagation destination process in the case of the faults of FIGS. 31A and 31B. FIG. 32 depicts an operation of the case of a stuck-at fault, wherein the fault lists FL1 and FL2 are propagated to an AND gate 160 represented by G4. First, as the normal gate computation process, a gate computation and(0,1)=0 is executed by using normal values (n4: 0, n5: 1). Then, FL4: (n8) is created as a schedule net of the fault list. On the other hand, in the computation process of the fault gate, first, the fault id set F is created. Specifically, $$F=\{f2,f3,f7,f8,f9,f10,f11,f12\}$$

is created as the fault id set F from the assumed faults of FL1, FL2, and G4. Subsequently, below processes are repeated for all the elements of the fault id set F from the top thereof.

(1) The fault f2 is selected from the fault id set F,
(2) the assumed faults of the fault list FL1 and FL2 and G4 are compared with the fault f2,
(3) a fault value 1 is injected to n4 since the fault f2 is a fault included in the fault list FL1,
(4) gate computation and(1,1)=1 is executed,
(5) (f2, 1) is added to the fault list FL4 since it is different from the normal value 0, →FL4:{n8,(f2, 1)}, and
(6) the fault f3 and subsequent faults are subjected to similar operations, thereby creating a below fault list FL4→
FL4:{n8,(f2, 1),(f8, 1),(f12, 1)}
at the gate 160.

Figure 33A:
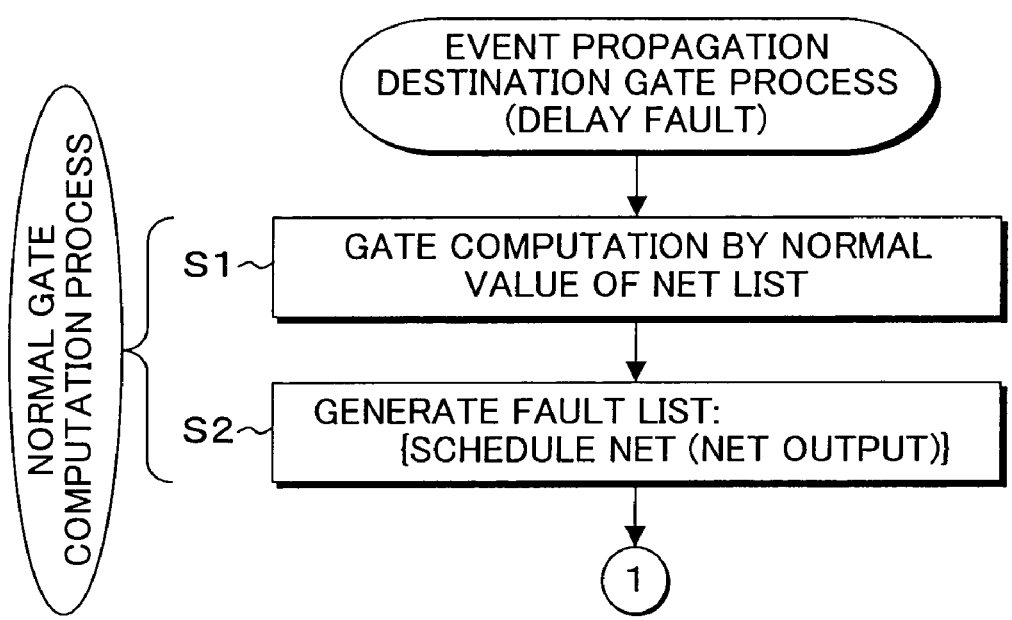
FIGS. 33A and 33B are flow charts depicting details of the event propagation destination gate process in step S5 of FIG. 26, wherein delay faults serve as targets.
Figure 33B:
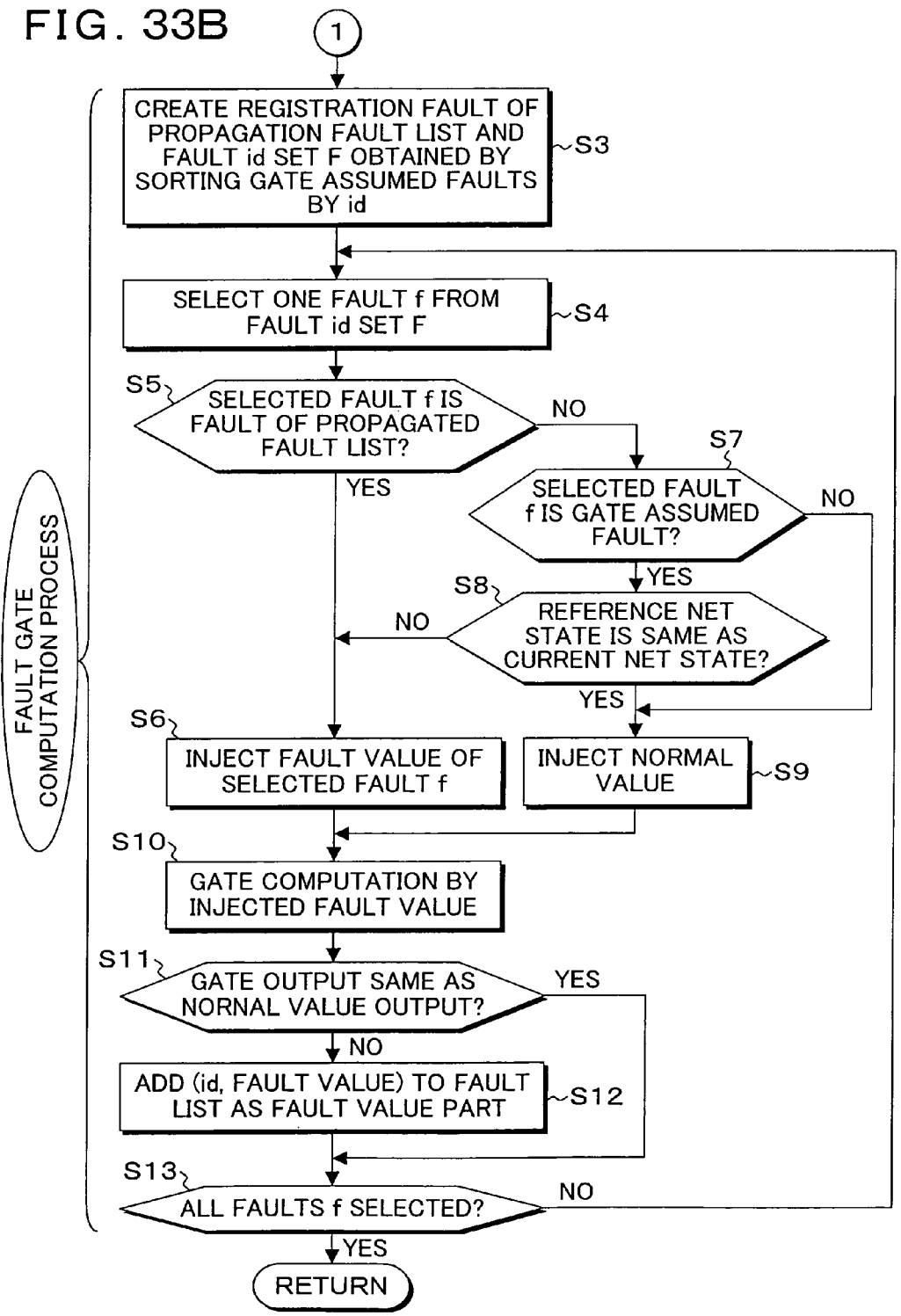

FIGS. 33A and 33B are flow charts depicting details of the event propagation process in step S5 of FIG. 26, wherein delay faults are serving as targets.

In FIGS. 33A and 33B, steps S1 to S2 are normal gate computation steps which are basically the same as well as FIGS. 31A and 31B. Steps S3 to S13 are fault gate computation processes. In the fault gate computation processes, steps S5 to S9 are the processes unique to delay faults, and steps S10 to S13 are same as steps S8 to S11 in the stuck-at faults of FIGS. 31A and 31B. The computation process of a fault gate in steps S4 to S13 will be explained below. After one fault f is selected from the fault id set F in step S4, whether the selected fault f is a fault of the propagated fault list or not is checked in step S5. If the selected fault f is the fault of the propagated list, as well as the case of the stuck-at fault of FIGS. 31A and 31B, the process proceeds to step S6, wherein the fault value of the select fault f is injected.

On the other hand, if the fault f selected in step S5 is not the fault of the propagated fault list, the process proceeds to step S7, wherein whether the selected fault f is a fault assumed for the gate or not is checked. If it is the fault assumed for the gate, the process proceeds to step S8, wherein, if the reference net state and the current net state are different from each other, the process proceeds to step S6, and the fault value of the selected fault f is injected. If they are the same, the process proceeds to step S9, wherein a normal value is injected. Subsequently, a gate computation is executed according to the injected fault value in step S10. Steps S11 to S13 thereafter are same as steps S9 to S11 of the stuck-at faults of FIGS. 31A and 31B.

Figure 34:
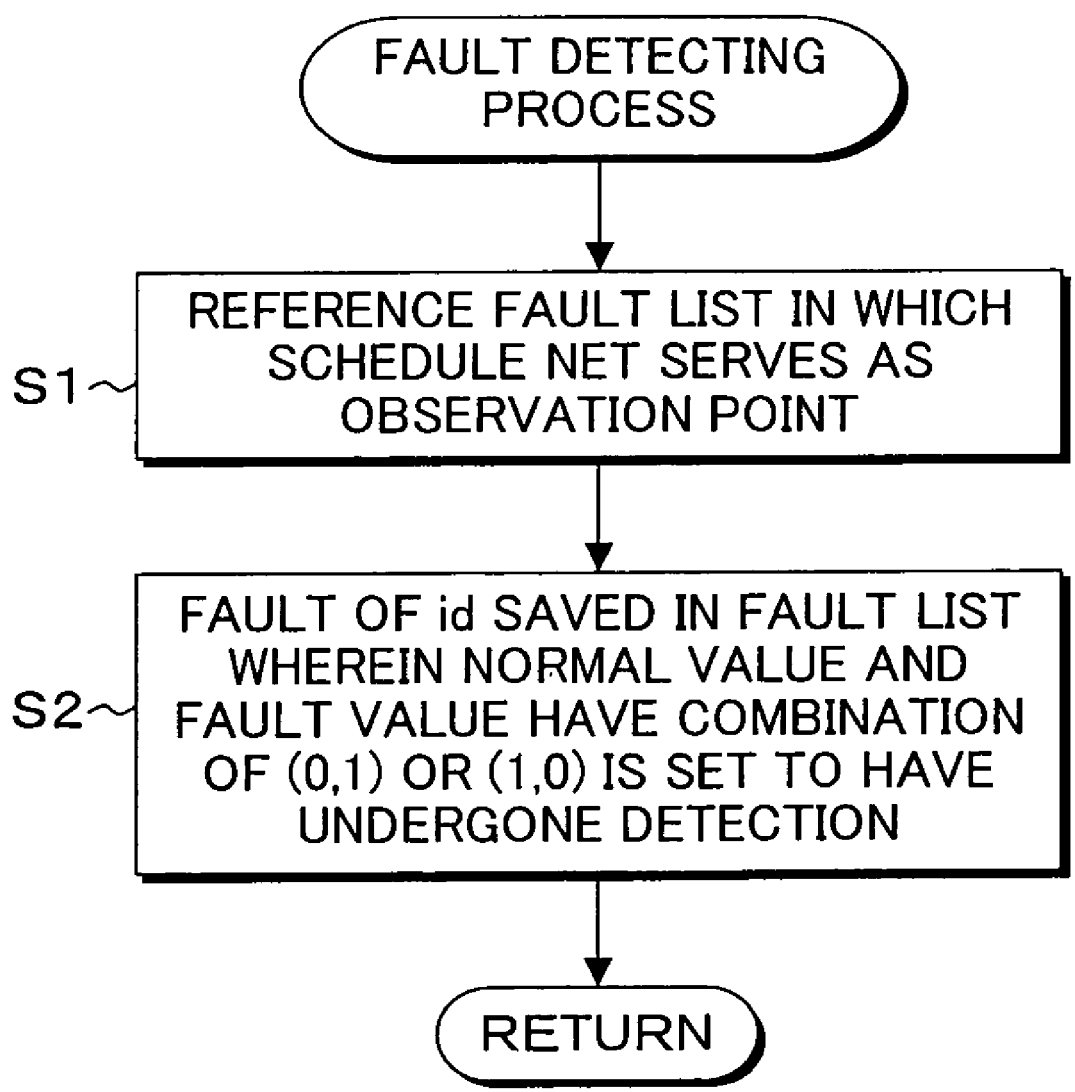
FIG. 34 is a flow chart depicting details of the fault detecting process in step S7 of FIG. 26.

FIG. 34 is a flow chart depicting details of the fault detecting process in step S7 of FIG. 26. In the fault detecting process of FIG. 34, a fault list in which the schedule net serves as an observation point is created in step S1, and the fault id which is saved in the fault list and has a combination of (0,1) or (1,0) as a normal value and a fault value is determined to have undergone detection in step S2.

(15. Reduction Effect of Processing Time)

The ATPG processing time in a conventional test pattern generating system involving dynamic compaction with respect to the multi-core processor 46 depicted in FIGS. 6A and 6B is decomposed into a sum of the processing time about the cores 50-1 to 50-4 and the processing time about the common part other than the cores and can be expressed as below.

> The conventional processing time=(the processing time about the faults of core part)×the number of cores+{the processing time about the faults of the common part}.

Furthermore, the processing time about the faults of the cores can be decomposed into the processing time of successful ATPG and the processing time of failure thereof. Therefore, below elements are finally obtained.

> The conventional processing time={ATPG processing time(success)+ATPG processing time(failure))×the number of cores+(the processing time about the faults of the common part}     (1)

On the other hand, in the ATPG processing time according to the present embodiment, the common part other than the cores is not changed from the conventional case. The faults serving as the processing targets of ATPG correspond to the amount of one core regarding the cores 50-1 to 50-4, and the processing time of the test pattern diverting process of successful ATPG and the test pattern interpolation process corresponding to (number of cores-1) is added thereto. Therefore, the processing time can be expressed as below.

> The processing time of the present invention={ATPG processing time(success)+ATPG processing time (failure)}×one core+{diversion/interpolation processing time of ATPG successful case}×(the number of cores-1)+{the processing time about the faults of the common part}     (2)

Next, when the number of the cores serves as a parameter in the expressions (1) and (2), conventionally, the "processing time about the faults of the core part"] is simply linearly increased along with increase in the number of cores; on the other hand, it is fixed to the amount corresponding to one core in the present embodiment.

Therefore, in the above described expression of (2), when "the processing time about the faults of the core part"] is dominant and "diversion/interpolation processing time of ATPG successful case" is sufficiently small so that it can be ignored, the processing time of ATPG according to the present embodiment is quantitatively, with respect to the conventional case, > Conventional processing time×(1/the number of cores)     (3), wherein the larger the number of the cores, the larger the reduction effect of processing time. In this manner, in the test pattern generation with respect to a multi-core processor having a plurality of cores serving as common circuits, according to the present embodiment, the ATPG processing time can be significantly reduced corresponding to the number of cores compared with the conventional case.

Furthermore, the amount of test vectors related to the core part can be also reduced to > Conventional test vector amount×(1/the number of cores)     (4)

by providing the scan chain circuit as depicted in FIG. 17 and FIGS. 18A and 18B.

Figure 35A:
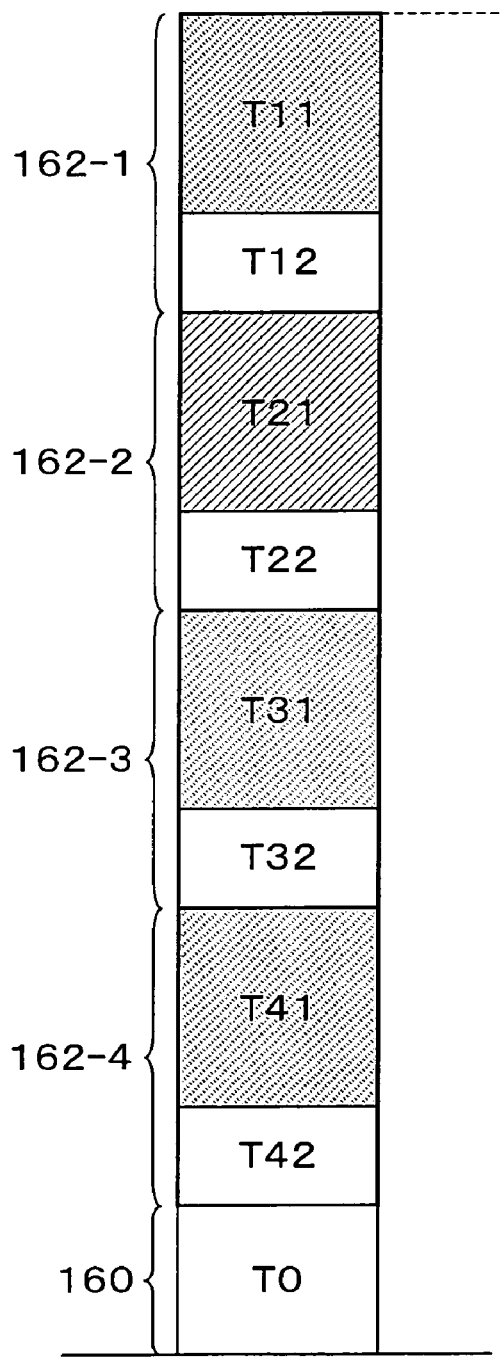
FIGS. 35A and 35B are explanatory diagrams depicting reduction of ATPG processing time according to the present embodiment.
Figure 35B:
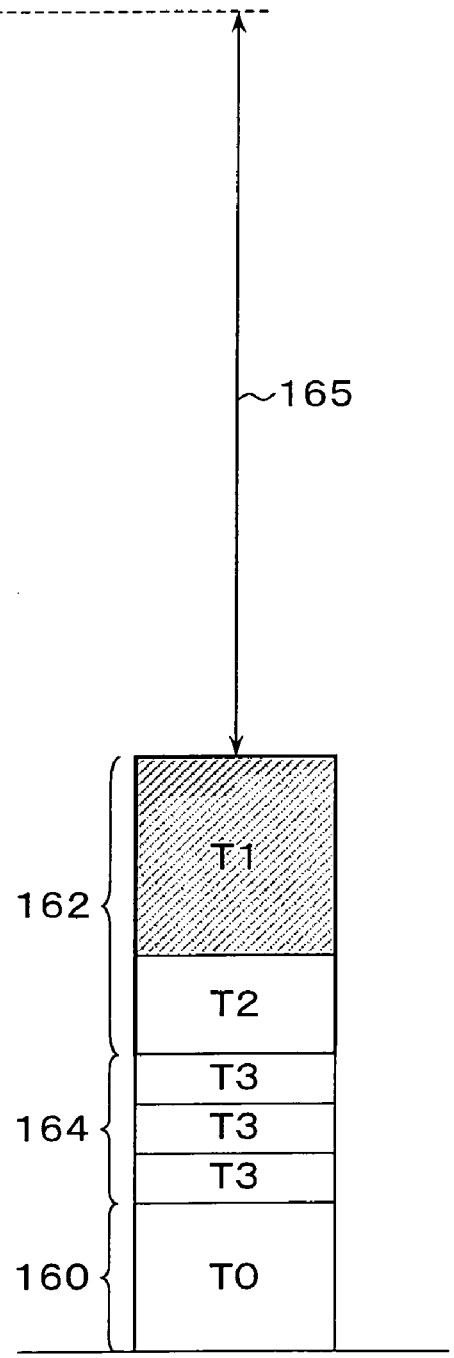

FIGS. 35A and 35B are explanatory diagrams depicting reduction of the ATPG processing time according to the present embodiment. FIGS. 35A and 35B depicts a bar graph of the sate of reduction in the processing time in a model case in which it is assumed that the number m of the cores of a multi-core processor is m=4 and that the time that is half of the original ATPG processing (successful case) is taken as the processing time of the test pattern diverting process and the test pattern interpolating process. In FIGS. 35A and 35B, in the conventional technique, the processing time is the time which is a sum of: core processing time 162-1 to 162-4; the time of a common part 160, the processing time 162-1, 162-2, 162-3, and 162-4 is divided into processing time T11, T21, T31, and T41 corresponding to failure ATPG and processing time T12, T22, T32, and T42 corresponding to successful ATPG, respectively. On the other hand, the processing time of the present invention is the time which is a sum of: the processing time 162-1 corresponding to one core; processing time 164 corresponding to three cores, i.e., the processing time of a sum of three units of half time T3 of the time of successful ATPG according to the test pattern diverting process and the test pattern interpolation process; and time T0 of the common part 160; and a reduction amount 165 is obtained. Furthermore, the effect of processing time reduction according to the present embodiment will be explained below by taking a specific multi-core processor as an example. First, as a measurement target, a circuit model of the multi-core processor 46 having the functional configuration depicted in FIG. 3:

Code name: Jupiter
Product name: SPARC64VI+Architecture (4 cores) (wherein, "SPARC" is a registered tradename)
The number of logic gates: 23,132,852
The number of assumed faults: 84,623,851 produced by FUJITSU LIMITED FIG. 36 is an explanatory diagram depicting the bit distribution of the scan FFs in the circuit model serving as the measurement target of the processing time reduction according to the present embodiment.

Figure 36:
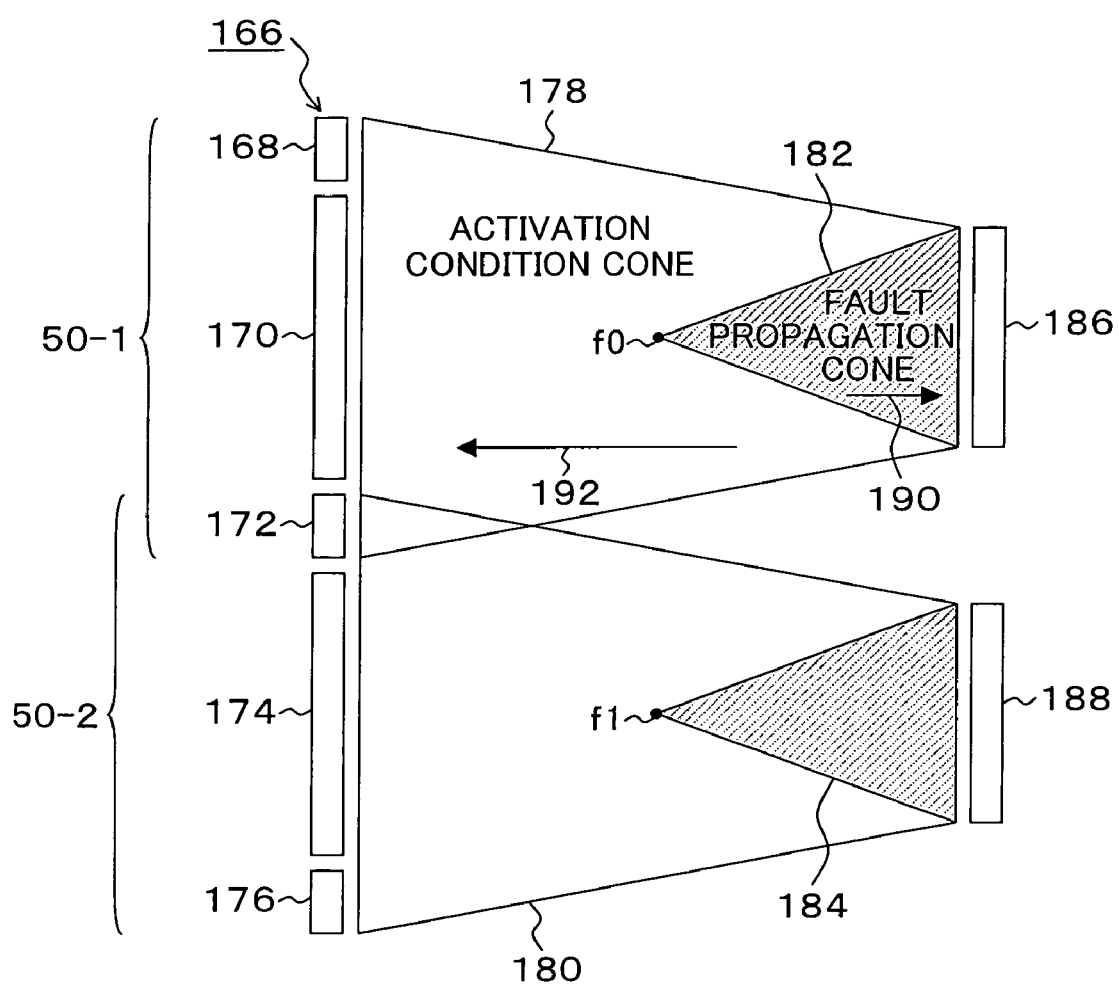
FIG. 36 is an explanatory diagram depicting the bit distribution of scan FFs in a multi-core processor serving as a measurement target of processing time reduction according to the present embodiment.

FIG. 36 depicts a narrowing process carried out as preprocessing of fault activation in ATPG. Specifically, it depicts a narrowing range ranged from a fault f0 corresponding to the core 50-1 and a fault f1 corresponding to the core 50-2 to a control-side scan FF set 166, which is the transmitting side, via scan FF set groups 186 and 188 of the receiving side. The ATPG with respect to the fault point f0 carries out backtrace 190 to the scan FF set 186 of the receiving side as depicted by a fault propagation cone 182. After turning at the scan FF set 186 of the receiving side, backtrace 192 to the control-side scan FF set 166-side is carried out by an activation condition cone 178. The control-side scan FF set 166 can be classified into the groups of core, common, and individual. Specifically, the control-side scan FF set 166 of fault detection is adjacent to the activation condition cones 178 and 180; and the distribution of the number of bits is composed of: the scan FF set 168 serving as the individual control unit of the core 50-1, a scan FF set 170 of the interior of the core 50-1, a scan FF set 172 of the common control unit which is common to the cores 50-1 and 50-2, a scan FF set 174 of the interior of the core 50-2, and a scan FF set 176 of the individual control unit of the core 50-2. Herein, the number of bits of the scan FF set 168 of the core 50 is B-ind, the number of bits of the interior scan FF set 170 of the core 50-1 is B-core, and the number of bits of the scan FF set 172 serving as the common control unit is B-com. When the rate of the number of control bits of the case in which the set is classified into the groups of core, common, and individual in such control-side scan FF set 166 is measured, the results of FIG. 37 and FIG. 38 were obtained. The measurement environment of execution time is as described below.

CPU: Opteron 254 2,793 MHz
memory: 16 gigabytes
OS: Debian (GNU/Linux)

However, since the measurement of execution time takes time, the measurement samples one percent of assumed faults of the core interior.

Figure 37:
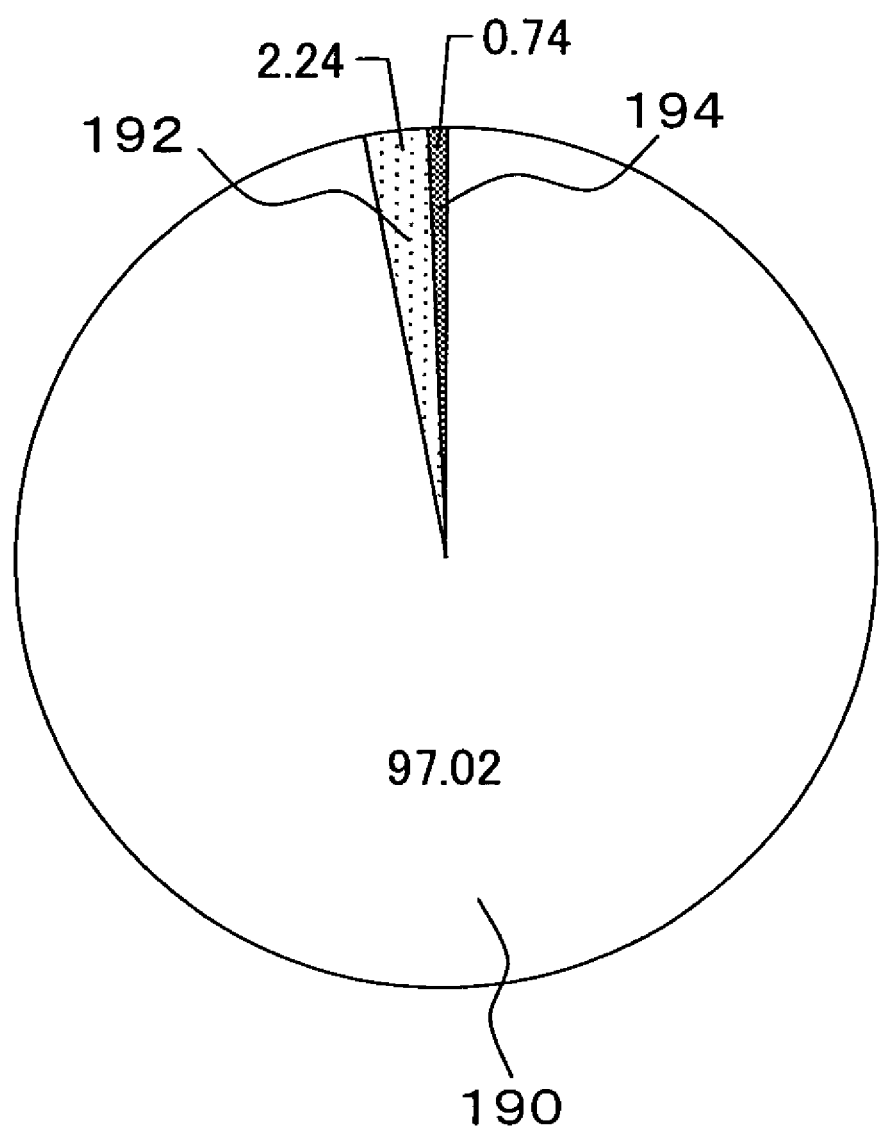
FIG. 37 is an explanatory diagram of a circle graph depicting the target bits of ATPG of the measurement target core of FIG. 36, wherein the target bits are classified into the groups of core, common, and individual.

FIG. 37 depicts average rates of the number of bits in the entirety of the measurement target in the case in which the ATPG target bits in the measurement target core of FIG. 36 are classified into the groups of core, common, and individual so as to carry out measurement. FIG. 37 depicts that the control bits which require search by the test pattern interpolation upon successful ATPG are 0.74 percent corresponding to an individual control part 194 and that 99.26 percent of the control bits, which is a sum of 97.02 percent corresponding to a core 190 and 2.24 percent corresponding to a common control part 192, is determined before the operation of the test pattern diverting process of successful ATPG according to the present embodiment.

Figure 38:
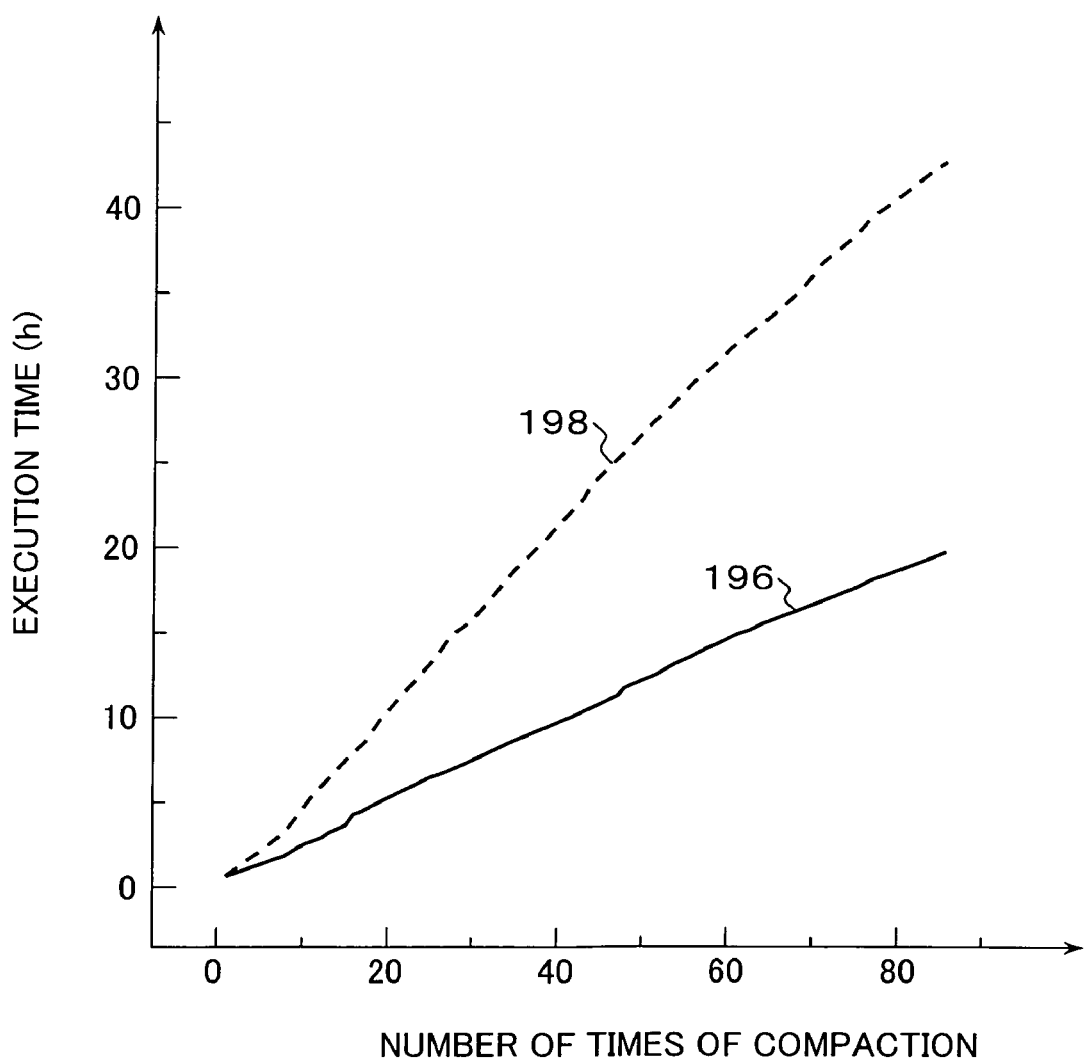
FIG. 38 is graph chart depicting execution time with respect to the number of times of compaction in the measurement target core of FIG. 36 about a normal operation and a diverting operation according to the present embodiment.
Figure 39:
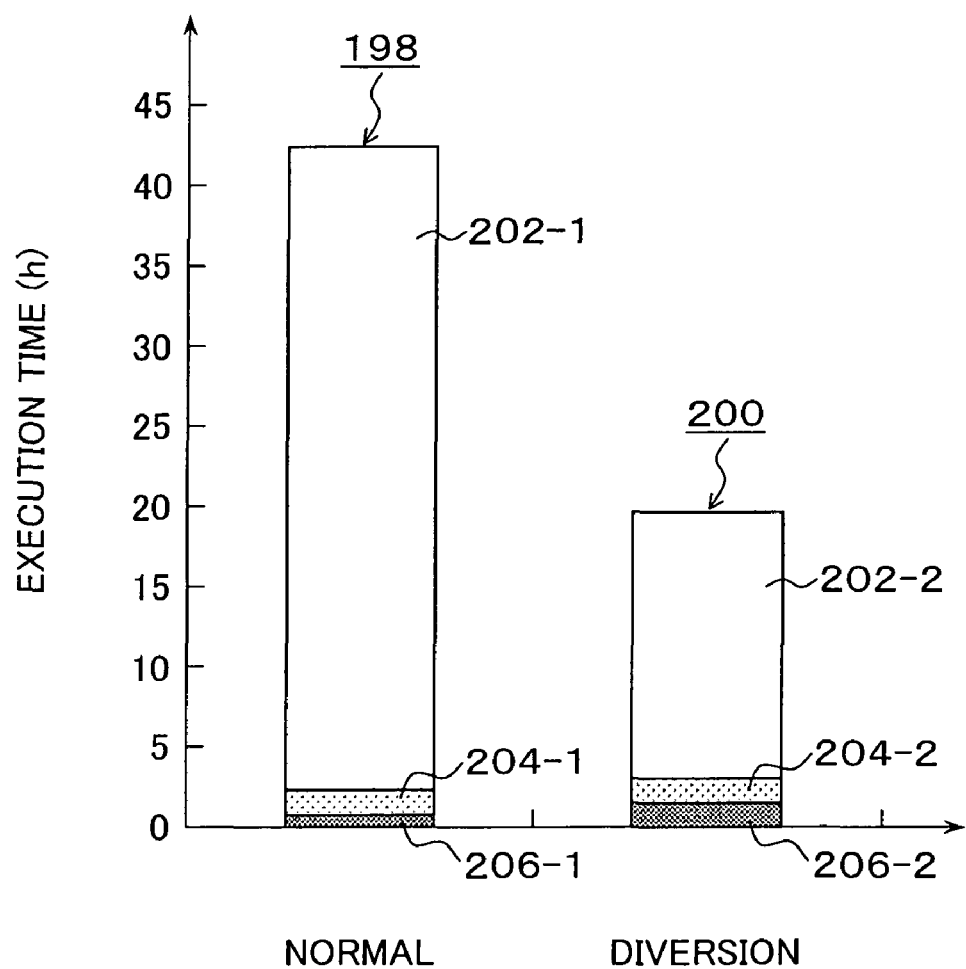
FIG. 39 is a bar graph chart depicting the rates of the execution time classified into the groups of ATPG, fault simulation, and others with respect to compaction in the measurement target core of FIG. 36 in a normal operation and a diverting operation of the present embodiment.

FIG. 38 and FIG. 39 depict the results of measurement of ATPG execution time, wherein the circuit model of the multi-core processor depicted in FIG. 36 having the distribution of the number of control bits classified into three groups of core, common, and individual serves as a target. In the measurement of the ATPG execution time, the execution time of the entire jobs with respect to the number of compactions is obtained for both a normal operation, which does not involves the test pattern diversion caused by successful ATPG according to the present embodiment, and a test pattern diverting operation. Regarding actual measurement time, 86 times of compaction is executed in the running of about two days.

FIG. 38 depicts the execution time of the present invention 196 and the conventional case 198, wherein the increasing rate of the execution time of the present invention with respect to the increase in the number of times of compaction is suppressed to approximately half compared with the conventional case 198.

Figure 40:
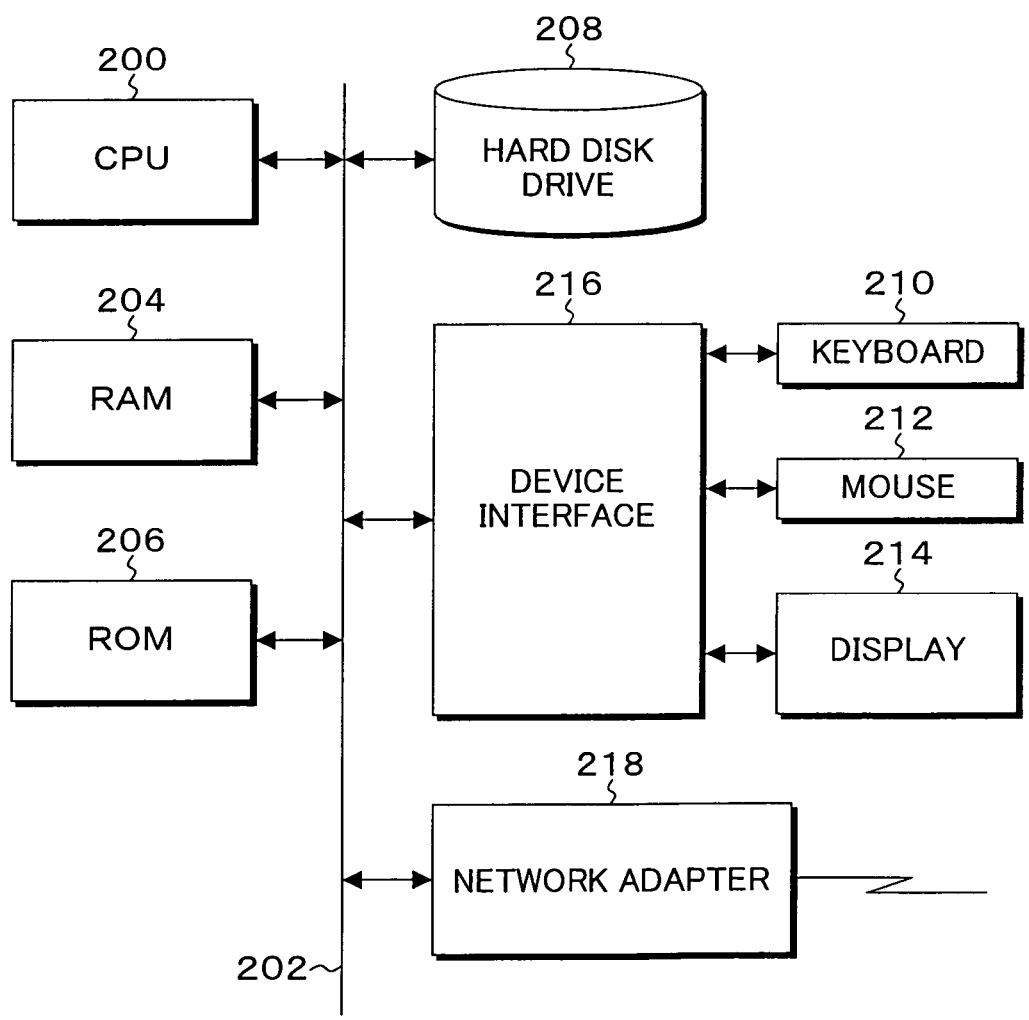
FIG. 40 is a block diagram depicting a hardware environment of a computer in which a test pattern generating program of the present embodiment is executed.

FIG. 39 depicts the elements classified into ATPG execution time, fault simulator execution time, and the other execution time making up the execution time that is taken until 86th time of the compaction in the measurement of the execution time. In the conventional technique 198 of FIG. 39, the ATPG execution time 202-1 occupies a large part, the fault simulator execution time 204-1 is next to that, and the other execution time 206-1 is the shortest. On the other hand, in the present invention 200, the entire execution time is reduced to about 20 minutes, which are less than half of about 43 minutes of the conventional technique 198; and the elements thereof are divided into the ATPG execution time 202-2, the fault simulator execution time 204-2, and the other execution time 206-2. The fault simulator execution time 204-2 is approximately the same as that of the conventional technique 198, and the other execution time 206-2 is slightly increased compared with the conventional technique. However, most of the part is the ATPG execution time 202-2. The ATPG execution time 202-2 was reduced to half or less execution time from the conventional ATPG execution time 202-1 by carrying out the test pattern diverting process and the test pattern interpolation process for the other cores when ATPG with respect to one target core succeeds. Also according to the actual measurement results of the execution time in the circuit model of the multi-core processor, it is proved that the reduction amount 165 of the processing time according to the present invention expected in FIGS. 35A and 35B can be achieved. Moreover, the present invention provides a program for test pattern generation, and the program has the contents depicted in the flow charts of FIG. 19, FIGS. 21A and 21B to FIG. 23, FIG. 25 to FIG. 27, FIG. 29, FIGS. 31A and 31B, FIGS. 33A and 33B, and FIG. 34. The test pattern generating program in the present embodiment is executed by a hardware environment of, for example, a computer as depicted in FIG. 40. In FIG. 40, a RAM 204; a ROM 206; a hard disk drive 208; a device interface 216 connecting a keyboard 210, a mouse 212, and a display 214; and a network adapter 218 are provided with respect to a bus 202 of a CPU 200. In the hard disk drive 208, the test pattern generating program according to the present embodiment is stored as an application program. When the computer is activated, an OS is read from the hard disk drive by a boot process of BIOS, disposed in the RAM 204, and executed by the CPU 200. When the CPU 200 executes the OS, the test pattern generating program of the present embodiment is read from the hard disk drive, disposed in the RAM, and executed by the CPU 200. In the above described embodiment, a multi-processor is taken as an example of the circuit which carries out the test pattern generating process. However, the present invention is not limited thereto, and the present invention can be applied without modification to a semiconductor circuit having a plurality of common circuits having equality or similarity. Moreover, the present invention includes arbitrary modifications that do not impair the objects and advantages thereof, and the present invention is not limited by the numerical values depicted in the above described embodiment.

What is claimed is:

1. A test pattern generating method of generating a test pattern with respect to a semiconductor circuit having first and second common circuits and a non-common circuit other than the first and second common circuits, each of the first and second common circuits having a scan chain for checking an operation of the circuit by applying a test pattern from the outside of the circuit, the test pattern generating method characterized by comprising steps of:

reading, by a circuit information reading unit, circuit information of the semiconductor circuit;

creating, by a scan chain set creating unit, a set of scan chains and a set of assumed faults for each of the first and second common circuits, wherein the assumed fault is a fault fixed to a terminal of a logic element constituting the common circuit;

determining, by a test target circuit determining unit, any of the first and second common circuits as the common circuit of a first test target based on the reading;

generating, by a test pattern generating unit, a test pattern for the determined common circuit of the first test target by using the created set of the scan chains and the set of the assumed faults;

compressing, by a test pattern compressing unit, the generated test pattern;

detecting, by a circuit fault detecting unit, a circuit fault that the common circuit of the first test target has by using the compressed test pattern; and determining, by a common circuit determining unit, the common circuit, which is different from the common circuit of the first test target among the first and second common circuits based on the detecting, as the common circuit of a second test target.

2. The test pattern generating method according to claim 1, characterized by further comprising subjecting the common circuit of the second test target to detection of a circuit fault that the common circuit has by using the compressed test pattern.

3. The test pattern generating method according to claim 1, wherein, the creating the set of the scan chains are performed for each of the first and second common circuits, and the method further comprises, initial states of memory circuits that the first and the second common circuits have are set to be the same.

4. The test pattern generating method according to claim 1, wherein the circuit fault is a fixed fault in which a circuit that the common circuit has fixedly outputs 0 or 1.

5. A test pattern generating device of generating a test pattern with respect to a semiconductor circuit having first and second common circuits and a non-common circuit other than the first and second common circuits, each of the first and second common circuits having a scan chain for checking an operation of the circuit by applying a test pattern from the outside of the circuit, the test pattern generating device comprising:
   a circuit information reading unit reading circuit information of the semiconductor circuit;
   a scan chain set creating unit creating a set of scan chains and a set of assumed faults for each of the first and second common circuits, wherein the assumed fault is a fault fixed to a terminal of a logic element constituting the common circuit;
   a test target circuit determining unit determining any of the first and second common circuits as the common circuit of a first test target and, after subjecting the determined common circuit of the first test target to detection of a circuit fault, determining the common circuit, which is different from the common circuit of the first test target, as the common circuit of a second test target;
   a test pattern generating unit generating a test pattern for the determined common circuit of the first test target by using the created set of the scan chains and the set of the assumed faults;
   a test pattern compressing unit compressing the generated test pattern; and
   a circuit fault detecting unit detecting a circuit fault that the common circuit of the first test target has by using the compressed test pattern.

6. The test pattern generating device according to claim 5, wherein the circuit fault detecting unit further subjects the common circuit of the second test target to detection of a circuit fault that the common circuit has by using the compressed test pattern.

7. The test pattern generating device according to claim 6, wherein the scan chain set creating unit further causes initial states of memory circuits that the first and the second common circuits have to be set to be the same.

8. The test pattern generating device according to claim 5, whereins the circuit fault is a fixed fault in which a circuit that the common circuit has fixedly outputs 0 or 1.

9. A test pattern generating program of generating a test pattern with respect to a semiconductor circuit having first and second common circuits and a non-common circuit other than the first and second common circuits, each of the first and second common circuits having a scan chain for checking an operation of the circuit by applying a test pattern from the outside of the circuit, the test pattern generating program characterized by causing a computer to execute steps of:
   reading, by a circuit information reading unit, circuit information of the semiconductor circuit;
   creating, by a scan chain set creating unit, a set of scan chains and a set of assumed faults for each of the first and second common circuits, wherein the assumed fault is a fault fixed to a terminal of a logic element constituting the common circuit;
   determining, by a test target circuit determining unit, any of the first and second common circuits as the common circuit of a first test target based on the reading;
   generating, by a test pattern generating unit, a test pattern for the determined common circuit of the first test target by using the created set of the scan chains and the set of the assumed faults;
   compressing, by a test pattern compressing unit, the generated test pattern;
   detecting, by a circuit fault detecting unit, a circuit fault that the common circuit of the first test target has by using the compressed test pattern; and
   determining, by a common circuit determining unit, the common circuit, which is different from the common circuit of the first test target among the first and second common circuits based on the detecting, as the common circuit of a second test target.

10. The test pattern generating program according to claim 9, further comprising subjecting the common circuit of the second test target to detection of a circuit fault that the common circuit has by using the compressed test pattern.

11. The test pattern generating program according to claim 9, wherein, the creating the set of the scan chains for each of the first and second common circuits, and test pattern generating program comprises initial states of memory circuits that the first and the second common circuits have are set to be the same.

12. The test pattern generating program according to claim 9, wherein the circuit fault is a fixed fault in which a circuit that the common circuit has fixedly outputs 0 or 1.

* * * * *

UNITED STATES PATENT AND TRADEMARK OFFICE
CERTIFICATE OF CORRECTION

PATENT NO. : 8,332,715 B2  
APPLICATION NO. : 12/805067  
DATED : December 11, 2012  
INVENTOR(S) : Daisuke Maruyama Page 1 of 1

It is certified that error appears in the above-identified patent and that said Letters Patent is hereby corrected as shown below:

Title Page Col. 2 (Abstract); Line 3, Delete "wherein" and insert -- where --, therefor.
Title Page Col. 2 (Abstract); Lines 14-15, Delete "circuit part." and insert -- circuit. --, therefor.
Column 28, Line 4, In Claim 7, delete "claim 6," and insert -- claim 5, --, therefor.
Column 28, Line 9, In Claim 8, delete "whereins" and insert -- wherein --, therefor.

Signed and Sealed this
Twenty-sixth Day of March, 2013

Teresa Stanek Rea
*Acting Director of the United States Patent and Trademark Office*